US012040325B2

(12) United States Patent
Pao et al.

(10) Patent No.: US 12,040,325 B2
(45) Date of Patent: Jul. 16, 2024

(54) INTEGRATED CIRCUIT STRUCTURE WITH A REDUCED AMOUNT OF DEFECTS AND METHODS FOR FABRICATING THE SAME

(71) Applicant: Taiwan Semiconductor Manufacturing Company, Ltd., Hsinchu (TW)

(72) Inventors: Chia-Hao Pao, Hsinchu (TW); Chih-Hsuan Chen, Hsinchu (TW); Chih-Chuan Yang, Hsinchu (TW); Shih-Hao Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 401 days.

(21) Appl. No.: 17/462,709

(22) Filed: Aug. 31, 2021

(65) Prior Publication Data

US 2023/0061384 A1 Mar. 2, 2023

(51) Int. Cl.
*H01L 29/76* (2006.01)
*H01L 21/8234* (2006.01)
(Continued)

(52) U.S. Cl.
CPC .... *H01L 27/088* (2013.01); *H01L 21/823412* (2013.01); *H01L 29/0665* (2013.01);
(Continued)

(58) Field of Classification Search
CPC ........... H01L 27/088; H01L 21/823412; H01L 29/0665; H01L 29/401; H01L 29/42392; H01L 29/66742; H01L 29/78696; H01L 29/66545; H01L 29/785; H01L 29/165; H01L 21/823821; H01L 21/823807; H01L 29/0649; H01L 21/823475; H01L 21/823814; H01L 21/76897;
(Continued)

(56) References Cited

U.S. PATENT DOCUMENTS

2020/0381545 A1 * 12/2020 Chiang ............... H01L 29/0673
2021/0098605 A1 * 4/2021 Wang ................. H01L 29/0673
(Continued)

OTHER PUBLICATIONS

Huang, Mao-Lin, et al., "Gate Patterning Process for Multi-Gate Devices", U.S. Appl. No. 16/858,440, filed Apr. 24, 2020. 32 pages specification, 38 pages drawings.
(Continued)

*Primary Examiner* — Niki H Nguyen
(74) *Attorney, Agent, or Firm* — Haynes and Boone, LLP

(57) ABSTRACT

A device includes a first and a second stacks of channel layers each extending from a first height to a second height. A first dielectric feature on a first side of the first stack and between the first and the second stacks extends from a third height to a fourth height. A second dielectric feature on a second side of the first stack opposite to the first side extends from the third height to a fifth height. A gate electrode extends continuously across a top surface of the first and the second stacks and extends to a sixth height. The fifth height is above the sixth height, the sixth height is above the second height, the second height is above the fourth height, the fourth height is above the first height, and the first height is above the third height.

20 Claims, 59 Drawing Sheets

(51) Int. Cl.
  *H01L 27/088* (2006.01)
  *H01L 29/06* (2006.01)
  *H01L 29/40* (2006.01)
  *H01L 29/423* (2006.01)
  *H01L 29/66* (2006.01)
  *H01L 29/786* (2006.01)

(52) U.S. Cl.
  CPC ...... *H01L 29/401* (2013.01); *H01L 29/42392* (2013.01); *H01L 29/66742* (2013.01); *H01L 29/78696* (2013.01)

(58) Field of Classification Search
  CPC ......... H01L 21/823871; H01L 29/1079; H01L 29/6681; H01L 21/823468; H01L 29/6653; H01L 29/1033; H01L 27/0688; H01L 21/76895; H01L 23/5283; H01L 27/0922; H01L 27/1203; H01L 23/485; H01L 29/1054; H01L 21/3065; H01L 29/42356; H01L 29/66469; H01L 29/78684; H01L 29/42364; H01L 27/0207; H01L 29/7855; H01L 29/517; H01L 29/7853; H01L 29/267; H01L 23/53295; H01L 21/02236; H01L 29/78681; H01L 23/528; H01L 21/76804; H01L 27/0629; H01L 21/28568; H01L 29/66833; H01L 29/0638; H01L 23/481; H01L 29/66803; H01L 29/458; H01L 29/78651; H01L 29/1037
  See application file for complete search history.

(56) References Cited

U.S. PATENT DOCUMENTS

2021/0343713 A1* 11/2021 Ju ..................... H01L 29/42392
2022/0285545 A1*  9/2022 Liu ................... H01L 29/41766

OTHER PUBLICATIONS

Chu, Lung-Kun, et al., "Dipole Patterning for CMOS Devices", U.S. Appl. No. 16/879,613, filed May 19, 2020, Assignee: Taiwan Semiconductor Manufacturing Co., Ltd., 27 pages specification, 26 pages drawings.

Chiang, Kuo-Cheng, et al. "Semiconductor Devices with Backside Power Rail and Backside Self-Aligned Via", U.S. Appl. No. 17/080,521, filed Oct. 25, 2020, Assignee: Taiwan Semiconductor Manufacturing Co., Ltd., 37 pages specification, 24 pages drawings.

Hsu, Chung-Wei, et al., "Gate-All-Around Devices Having Self-Aligned Capping Between Channel and Backside Power Rail", U.S. Appl. No. 17/218,503, filed Mar. 31, 2021, Assignee: Taiwan Semiconductor Manufacturing Co., Ltd., 38 pages specification, 30 pages drawings.

Hsu, Chung-Wei, et al.,"Semiconductor Structures and Methods Thereof", U.S. Appl. No. 17/167,742, filed Feb. 4, 2021, Assignee: Taiwan Semiconductor Manufacturing Company, Ltd., 32 pages specification, 16 pages drawings.

* cited by examiner

INTEGRATED CIRCUIT STRUCTURE WITH A REDUCED AMOUNT OF DEFECTS AND METHODS FOR FABRICATING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

For example, nano-sheet-based devices have been introduced in an effort to improve gate control by increasing gate-channel coupling, reduce OFF-state current, and reduce short-channel effects (SCEs). Nano-sheet-based devices include a plurality of suspended channel layers stacked together to form the transistor channels which are engaged by a gate structure. The nano-sheet-based devices are compatible with conventional complementary metal-oxide-semiconductor (CMOS) processes, allowing them to be aggressively scaled down while maintaining gate control and mitigating SCEs. However, as spacing between adjacent channel layers to continuously shrink, the material access to those spaces for the purpose of removing and/or forming features therein have become more and more restricted. Such restrictions have resulted in threshold voltage issues which adversely affected device performances. Therefore, although conventional nano-sheet-based devices have been generally adequate for their intended purposes, they are not satisfactory in every respect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
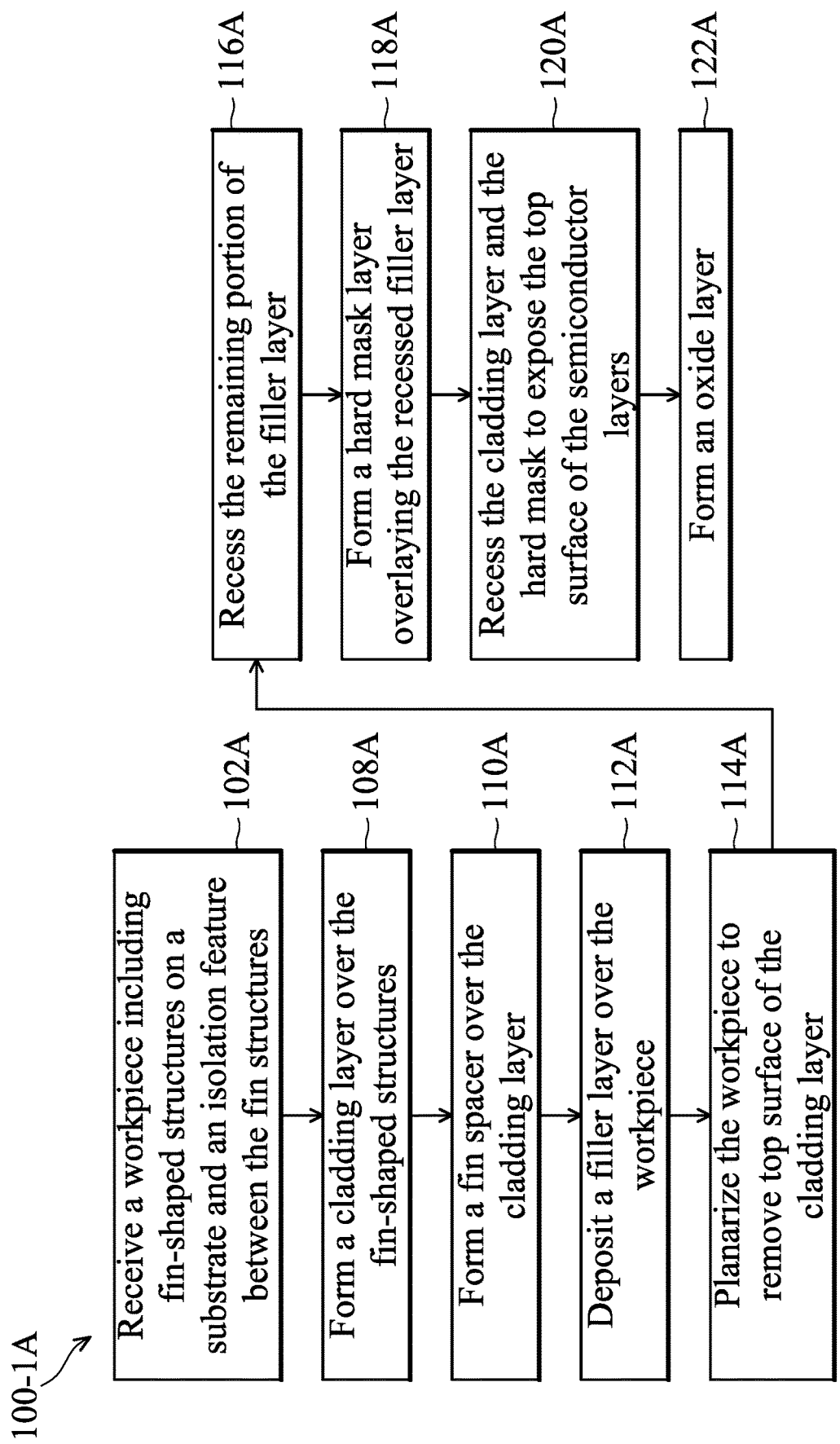
FIGS. 1A, 1B, 1C illustrate flowcharts of example methods for fabricating embodiments of semiconductor devices of the present disclosure, according various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to ICs and semiconductor devices and methods of forming the same. More particularly, the present disclosure is related to vertically-stacked horizontally-oriented multi-channel transistors, such as nanowire transistors and nanosheet transistors. These types of transistors are sometimes referred to as gate-all-around (GAA) transistors, multi-bridge-channel (MBC) transistors, or some other names. In the present disclosure, they are broadly referred to as nano-sheet-based transistors (or devices). A nano-sheet-based device includes a plurality of suspended channel layers stacked one on top of another and engaged by a gate structure. The channel layers of a nano-sheet-based device may include any suitable shapes and/or configurations. For example, the channel layers may be in one of many different shapes, such as wire (or nanowire), sheet (or nanosheet), bar (or nano-bar), and/or other suitable shapes. In other words, the term nano-sheet-based devices broadly encompasses devices having channel layers in nanowire, nano-bars, and any other suitable shapes.

Further, the channel layers of the nano-sheet-based devices may engage with a single, contiguous gate structure, or multiple gate structures. The channel layers connect a pair of source/drain features, such that the charge carriers may flow from the source region to the drain region through the channel layers during the operation (such as when the transistors are turned on). Additionally, inner spacers are formed between the source/drain features and the gate structures such that the source/drain features may be shielded from the operations targeting the gate structure.

Generally, the nano-sheet-based devices are implemented on a plurality of fin-shaped structures. For example, a plurality of fin-shaped structures are formed on a piece of semiconductor substrate, wherein each of the plurality of fin-shaped structures include the channel layers, the source/drain features, as well as the inner spacers formed thereon. Moreover, dielectric features (e.g. dielectric walls) are formed between adjacent fin-shaped structures. In some approaches, the dielectric walls are sufficiently tall such that the top surface of the channel layers extends along or below the top surface of the dielectric wall. Due to the close proximity of the dielectric wall to end portions of the channel layers, material flow designed to reach the channel layers (or sacrificial layers therebetween) may be physically restricted by the mere presence of the dielectric wall. For example, during a channel release process, etching chemicals are expected to flow around the top portions of the dielectric wall and reach the sacrificial layers between the channel layers; and byproduct from the etching process is expected to flow around the top portions of the dielectric wall and exit the system. Such restrictions may cause certain areas of the sacrificial layers to remain even after the completion of the channel release process. For another example, in a gate layer deposition process, gate layer precursor materials are expected to flow around the top portions of the dielectric wall in order to reach the spacing between the channel layers and form the gate layers therebetween. Such restrictions may similarly cause areas of spaces to not be completely filled and instead leaving voids. Ultimately, these defects may cause work function shifts and results in undesirable change to the designed threshold voltages. Such challenges are further aggravated in certain devices, such as push-rule Static Random-Access Memory cells. Accordingly, the present disclosure provides methods that form dielectric walls that have reduced height as compared to the adjacent channel layers. As a result, less restriction is asserted by the dielectric wall to material flows around it. And materials access to the areas surrounding the channel layers are improved. This provides easier and more reliable channel release process as well as gate layer formations. Feature qualities, and device performances, are therefore improved. The nano-sheet based devices presented herein may be a complementary metal-oxide-semiconductor (CMOS) device, a p-type metal-oxide-semiconductor (PMOS) device, or an n-type metal-oxide-semiconductor (NMOS) device. One of ordinary skill may recognize other examples of semiconductor devices that may benefit from aspects of the present disclosure. Moreover, although the disclosure uses nano-sheet-based devices as an example, one of ordinary skill may recognize other examples of semiconductor devices that may benefit from aspects of the present disclosure. For example, other types of metal-oxide semiconductor field effect transistors (MOSFETs), such as planar MOSFETs, FinFETs, other multi-gate FETs may benefit from the present disclosure.

Figure 1B:
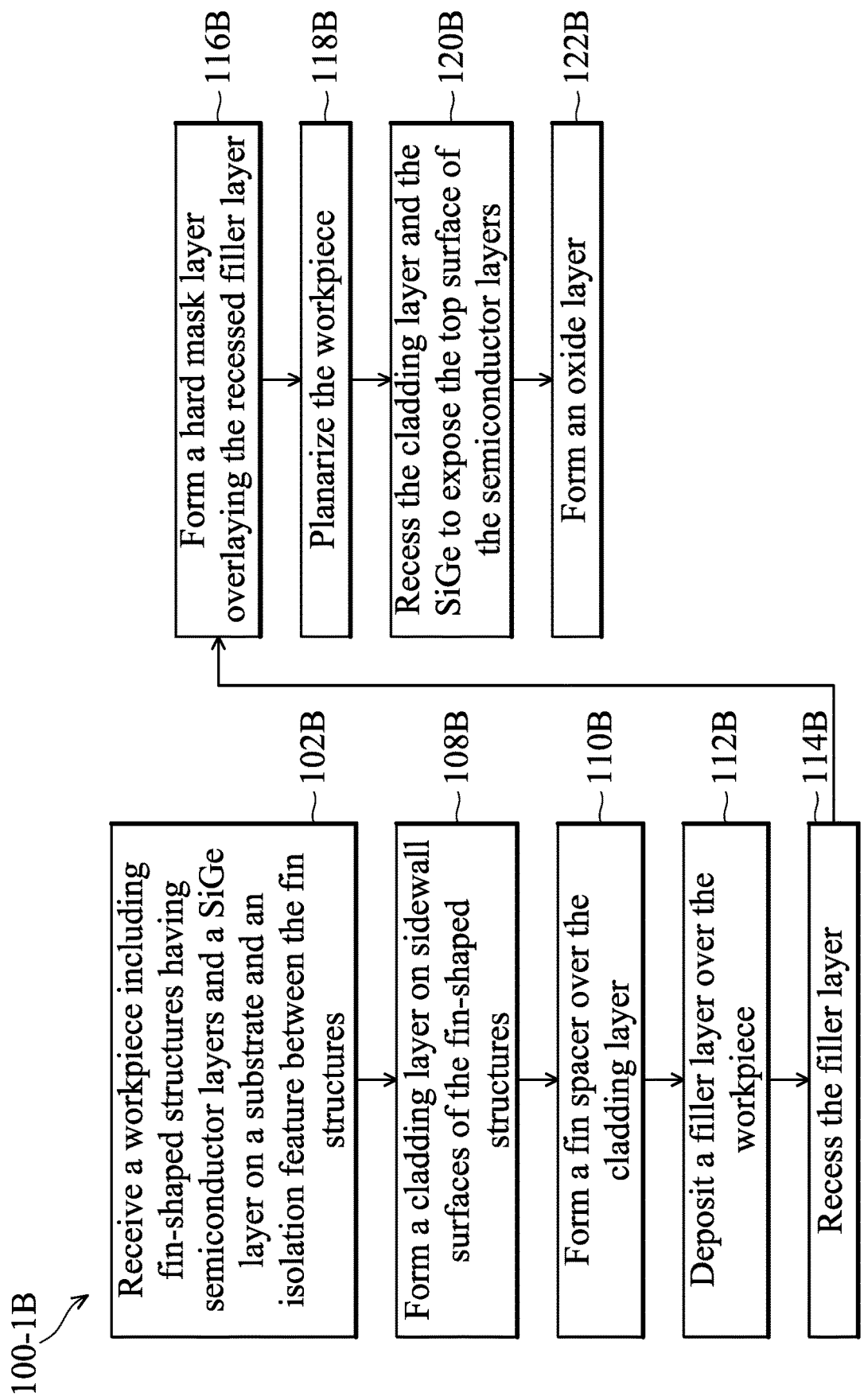
Figure 1C:
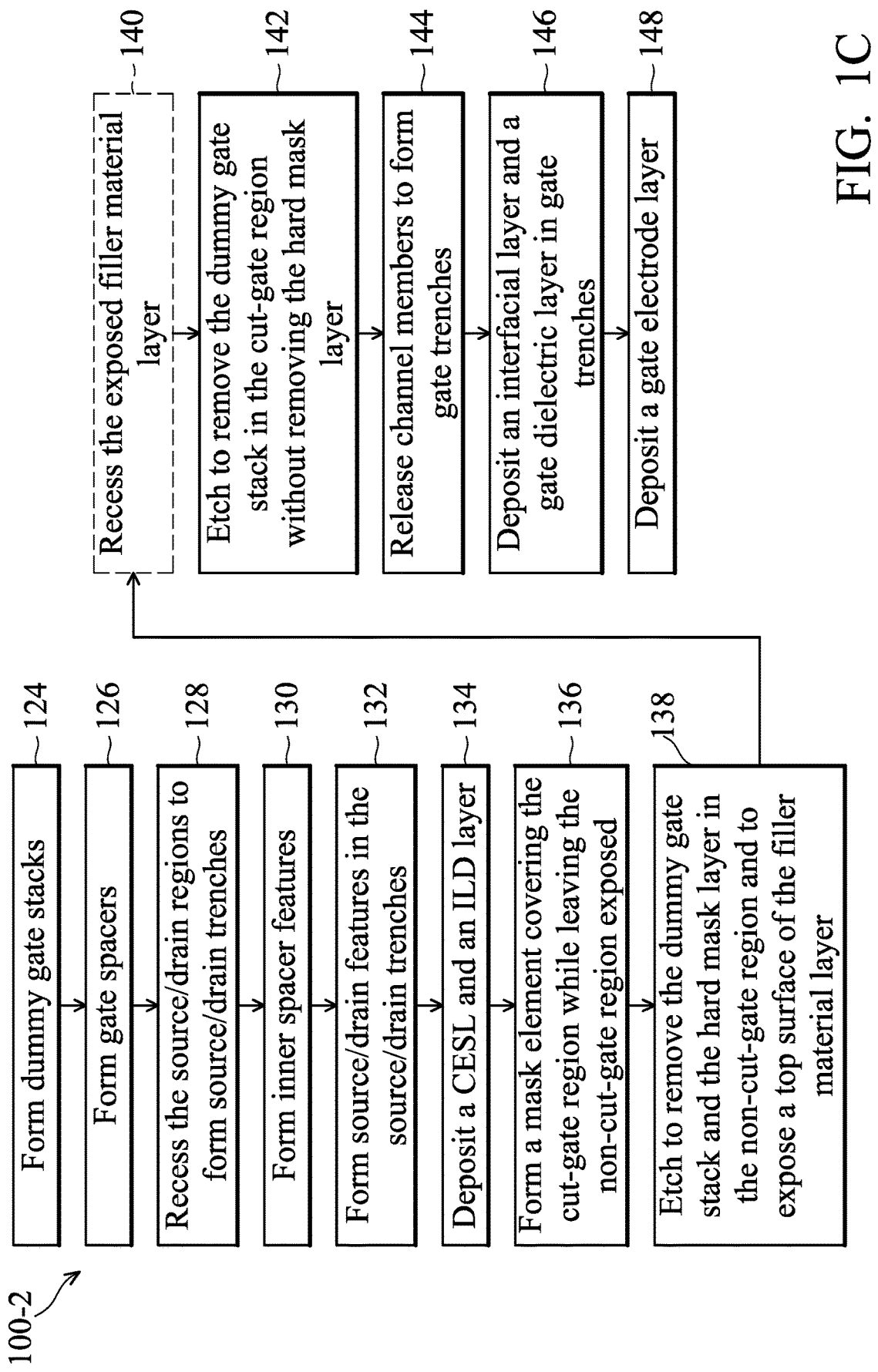

The various aspects of the present disclosure will now be described in more detail with reference to the figures. FIG. 1A illustrates a flowchart of a method portion 100-1A of forming a semiconductor device from a workpiece according to one or more aspects of the present disclosure. FIG. 1B illustrates a flowchart of a method portion 100-1B of forming a semiconductor device from a workpiece according to one or more aspects of the present disclosure. The method portions 100-1A and 1B are collectively referred to as the method portion 100-1. FIG. 1C illustrates a flowchart of a method portion 100-2 which may proceed from either the method portion 100-1A associated with FIG. 1A or the method portion 100B-2 associated with FIG. 1B to complete the fabrication of the device. The method portion 100-1A and method portion 100-2 collectively form the method 100A; and the method portion 100-1B and method portion 100-2 collectively form the method 100B. Methods 100A and 100B, and method portions 100-1 and 100-2, are merely examples and are not intended to limit the present disclosure to what is explicitly illustrated in methods 100A and 100B. Additional steps may be provided before, during and after methods 100A and 100B, and some steps described can be replaced, eliminated, or moved around for additional embodiments of the methods. Not all steps are described herein in detail for reasons of simplicity. Method 100A is described below in conjunction with FIGS. 2A-12A, 2B-12B, and 2C-12C. For example, FIGS. 2A-12A illustrate three-dimensional views of a workpiece 200 at different stages of fabrication according to embodiments of method 100A; FIGS. 2B-12B illustrate cross sectional views (such as of an Y-Z cross-section) of the workpiece 200 along the B-B' line of the corresponding FIGS. 2A-12A; and FIGS. 2C-12C illustrate cross sectional views (such as of a X-Z cross-section) of the workpiece 200 along the C-C' line of the corresponding FIGS. 2A-12A.

Figure 2A:
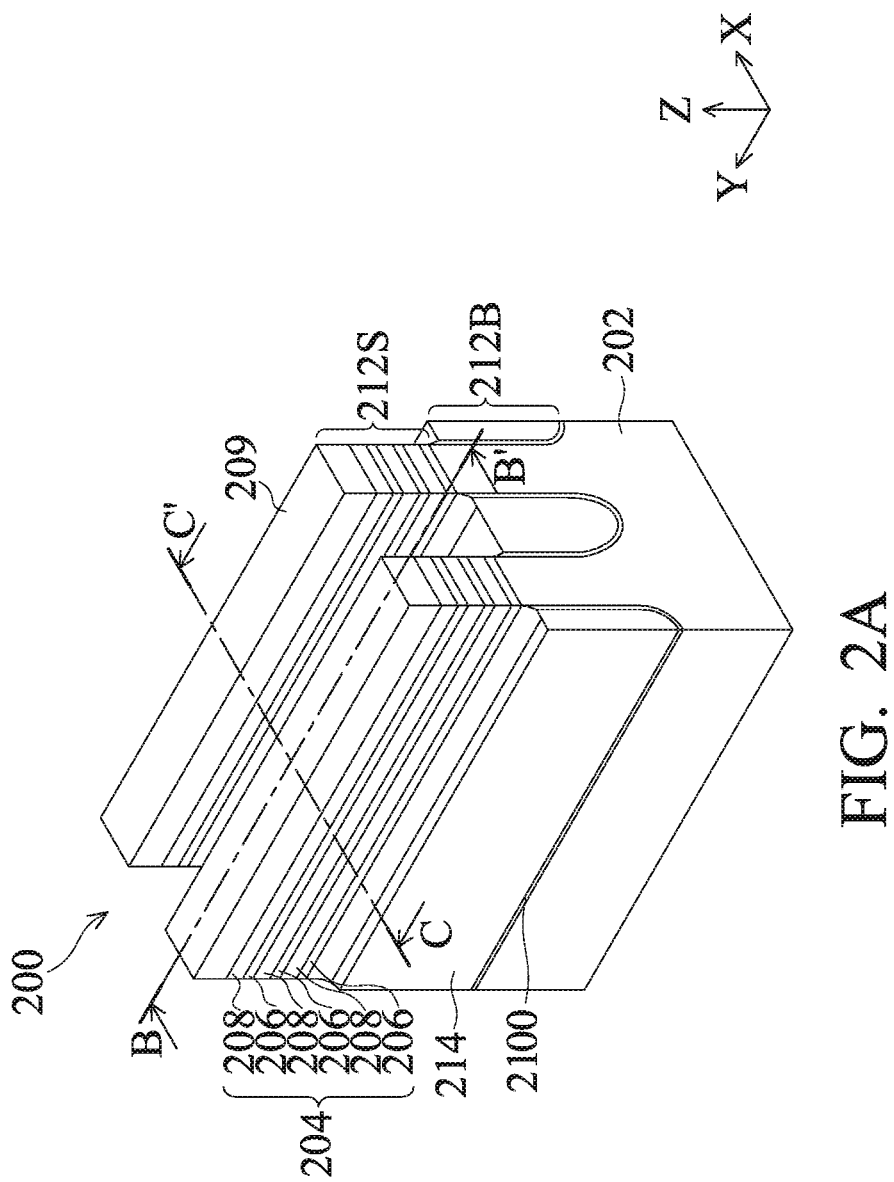
FIGS. 2A, 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, and 29A illustrate three dimensional views of an example workpiece of the present disclosure at various fabrication stages according various aspects of the present disclosure.
Figures 2B, 2C:
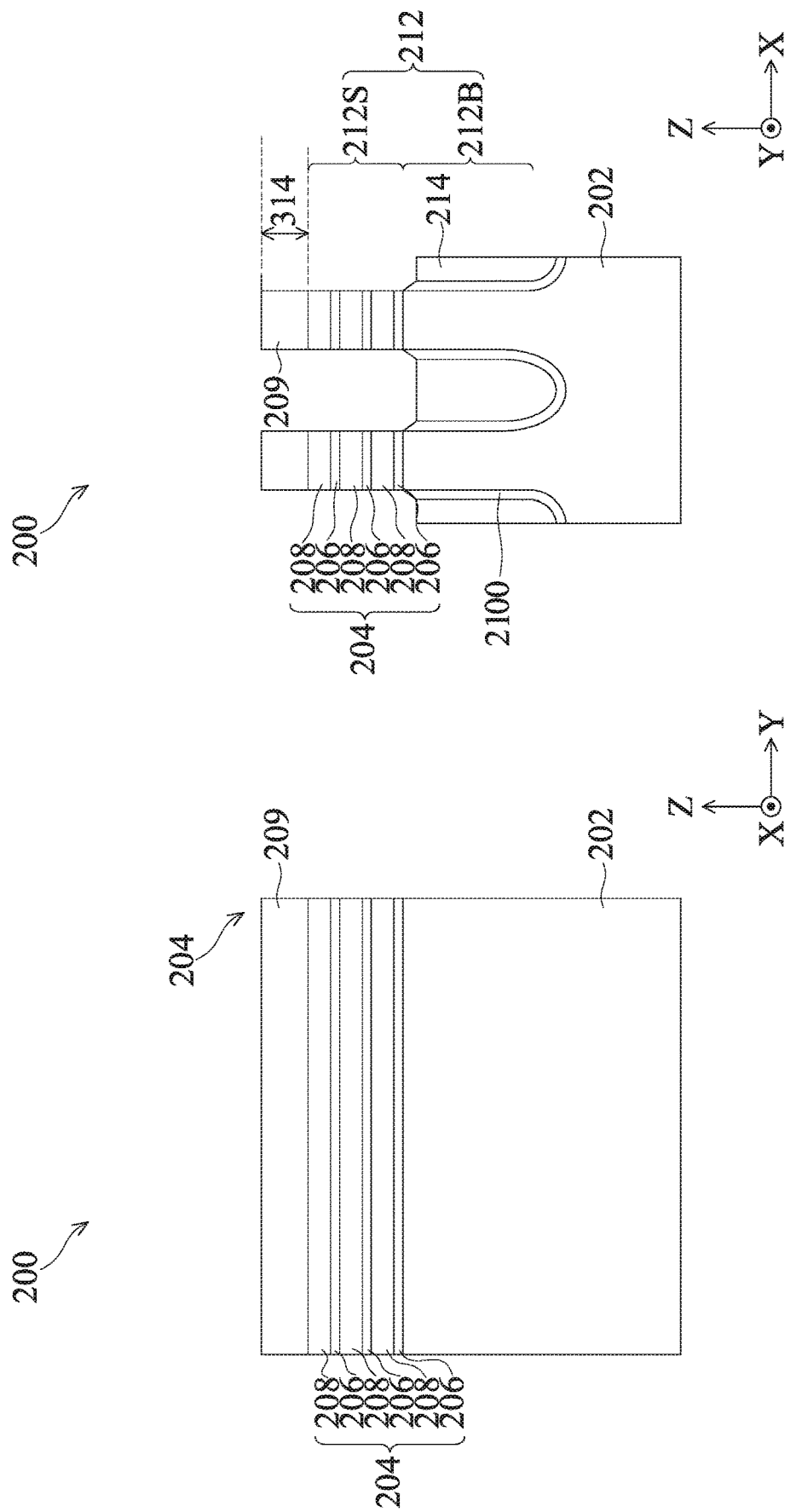
FIGS. 2B, 3B, 4B, 5B, 6B, 7B, 8B, 9B, 10B, 11B, 12B, 13B, 14B, 15B, 16B, 17B, 18B, 19B, 20B, 21B, 22B, 23B, 24B, 25B, 26B, 27B, 28B, and 29B illustrate fragmentary cross-sectional views of an example workpiece of the present disclosure along the line B-B' in FIGS. 2A, 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, and 29A, respectively, according various aspects of the present disclosure.
FIGS. 2C, 3C, 4C, 5C, 6C, 7C, 8C, 9C, 10C, 11C, 12C, 13C, 14C, 15C, 16C, 17C, 18C, 19C, 20C, 21C, 22C, 23C, 24C, 25C, 26C, 27C, 28C, and 29C illustrate fragmentary cross-sectional views of an example workpiece of the present disclosure along the line C-C' in FIGS. 2A, 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, respectively, according various aspects of the present disclosure.

Referring to FIGS. 1A and 2A-2C, method 100A includes a block 102A where a workpiece 200 is received. As shown in FIGS. 2A, 2B and 2C, the workpiece 200 includes a substrate 202 and a stack 204 disposed on the substrate 202. In some embodiments, the substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure or a germanium-on-insulator (GOI) structure. In some embodiments, the substrate 202 may include one or more well regions, such as n-type well regions doped with an n-type dopant (i.e., phosphorus (P) or arsenic (As)) or p-type well regions doped with a p-type dopant (i.e., boron (B)), for forming different types of devices. The doping the n-type wells and the p-type wells may be formed using ion implantation or thermal diffusion.

Referring still to FIGS. 2A, 2B and 2C, the stack 204 may include a plurality of channel layers 208 interleaved by a plurality of sacrificial layers 206. The channel layers 208 and the sacrificial layers 206 may have different semiconductor compositions. In some implementations, the channel layers 208 are formed of silicon (Si) and sacrificial layers 206 are formed of silicon germanium (SiGe). In these implementations, the additional germanium content in the sacrificial layers 206 allow selective removal or recess of the sacrificial layers 206 without substantial damages to the channel layers 208. In some embodiments, the sacrificial layers 206 and channel layers 208 may be deposited using an epitaxial process. The stack 204 may be epitaxially deposited using Chemical Vapor Deposition (CVD) techniques (e.g., vapor-phase epitaxy (VPE) and/or ultra-high vacuum CVD (UHV-CVD)), molecular beam epitaxy (MBE), and/or other suitable processes. The sacrificial layers 206 and the channel layers 208 are deposited alternatingly, one-after-another, to form the stack 204. It is noted that three (3) layers of the sacrificial layers 206 and three (3) layers of the channel layers 208 are alternately and vertically arranged as illustrated in FIGS. 2A, 2B and 2C, which are for illustrative purposes only and not intended to be limiting. The number of layers depends on the desired number of channels members for the semiconductor device. In some embodiments, the number of the channel layers 208 is between 2 and 10. The distance between a top surface of a topmost channel layer 208 and a bottom surface of a bottom sacrificial layer 206 may also be referred to as a stack height. The stack height is determined by the number of channel layers 208, the thickness(es) of the channel layers, the number of sacrificial layers 206, and the thickness(es) of the sacrificial layers. In some embodiments, the stack height may be about 45 nm to about 55 nm. If the stack height is too small, such as less than 45 nm, there may be insufficient number or thickness of channel layers 208 to be formed in the transistor, such that the conductive path for the operation current may be unnecessarily restricted. If the stack height is too large, such as greater than 50 nm, the additional layers and/or the greater thickness may not sufficiently justify their fabrication cost and/or the physical space they occupy. For patterning purposes, the workpiece 200 may also include a hard mask layer over the stack 204. The hard mask layer may be a single layer (e.g., first layer 209) or a multilayer. In one example, the hard mask layer is a multi-layer and includes the first layer 209 and a second layer (not shown) over the first layer 209. In some embodiments, the first layer 209 is formed of silicon nitride and the second layer is formed of silicon (Si). In some embodiments, additional pad oxide layer may be formed between the first layer 209 and the channel layers 208.

In some embodiments, the first layer 209 has a thickness 314. As described later, the thickness 314 determines the height of a subsequently formed high-k hard mask layer, which forms part of the cut-metal-gate dielectric feature. In some embodiments, the thickness 314 may be about 20 nm to about 40 nm. If the thickness 314 is too small, such as less than about 20 nm, the subsequently formed cut-metal-gate dielectric feature may not be sufficient height to cut through the height of the gate structure. Conversely, if the thickness 314 is too large, such as greater than about 40 nm, the additional height does not bring substantial benefit yet occupies valuable device space.

Still referring to FIGS. 2A, 2B, and 2C, the stack 204 and the substrate 202 immediately therebeneath have been patterned to form fin-shaped structure 212 using a patterning operation. Each of the fin-shaped structures 212 includes a base portion 212B formed from a portion of the substrate 202 and a stack portion 212S formed from the stack 204. The stack portion 212S is disposed over the base portion 212B. The fin-shaped structures 212 extend lengthwise along the Y-direction and extend vertically along the Z-direction upwards from the substrate 202. The fin-shaped structures 212 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structures 212 by etching the stack 204 and the substrate 202. The etching process can include dry etching, wet etching, reactive ion etching (RIE), and/or other suitable processes. In some embodiments, additional hard mask layers (such as oxide hard mask layer) may have been formed on top of the hard mask layer 210 prior to the patterning of the fin-shaped structures (such as prior to forming the mandrels). Those additional hard mask layers are removed following the completion of the patterning process.

The workpiece further includes an isolation feature 214 formed between the adjacent fin-shaped structures 212. The isolation feature 214 may be formed by first depositing a precursor layer over the workpiece and filling spaces (or trenches) between the fin-shaped structures 212 and subsequently recessed to expose at least the top portions of the fin-shaped structures 212. The dielectric material may include silicon oxide, silicon nitride, silicon oxynitride, fluorine-doped silicate glass (FSG), a low-k dielectric, combinations thereof, and/or other suitable materials. In various examples, the dielectric material may be deposited by a CVD process, a subatmospheric CVD (SACVD) process, a flowable CVD (FCVD) process, an ALD process, spin-on coating, and/or other suitable process. In some embodiments, a liner 2100 may be formed to wrap around the fin-shaped structures 212 prior to the formation of the isolation feature 214. In some embodiments, the isolation feature 214 has a top surface that extends below the bottom surface of the lowest channel layer 208 and below the bottom surface of the lowest sacrificial layer 206. Accordingly, as shown in FIGS. 2A and 2C, the stack portions 212S of the fin-shaped structures 212 rise above the isolation feature 214 while the base portions 212B are surrounded by the isolation feature 214. In some embodiments, the stack portions 212S have a height of about 45 nm to about 60 nm. If the height is too small, such as less than about 45 nm, the current passage through the channel layers may be limited; while if the height is too large, such as greater than about 60 nm, the additional chip footprint may not justify any performance improvements.

Figure 3A:
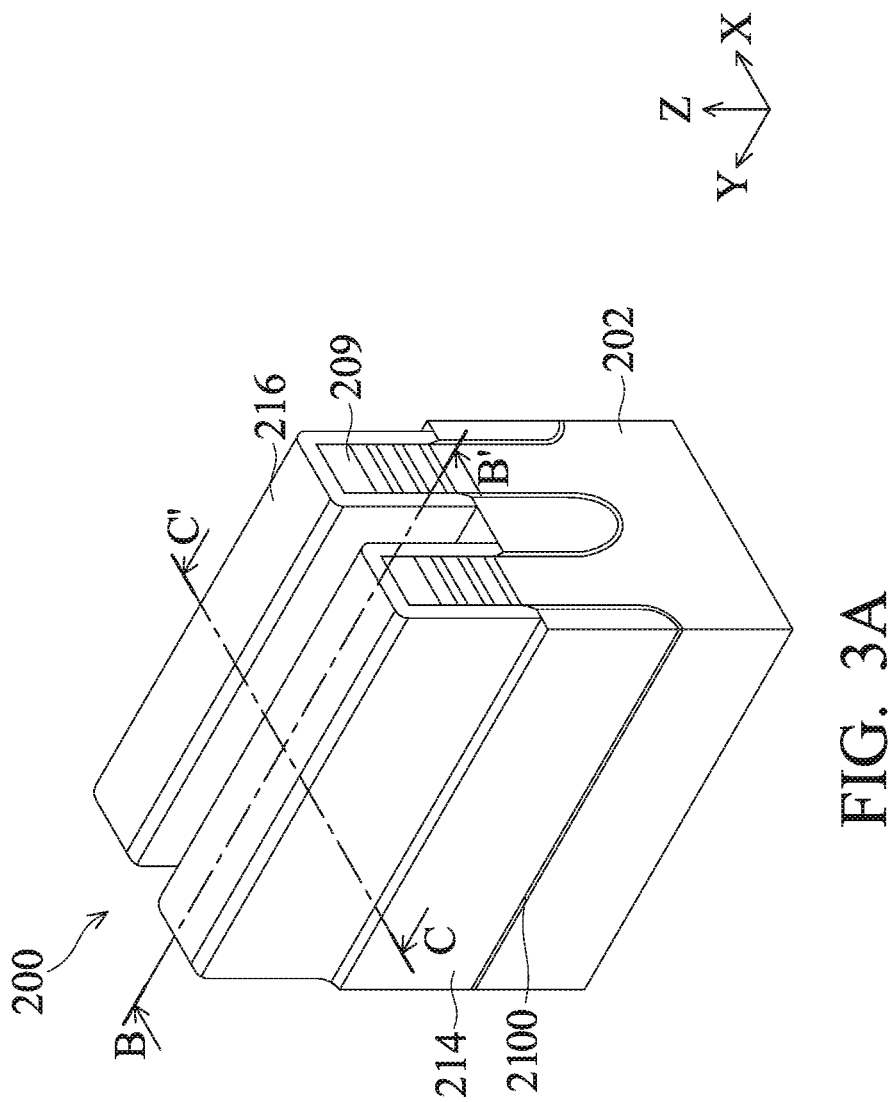
Figure 3C:
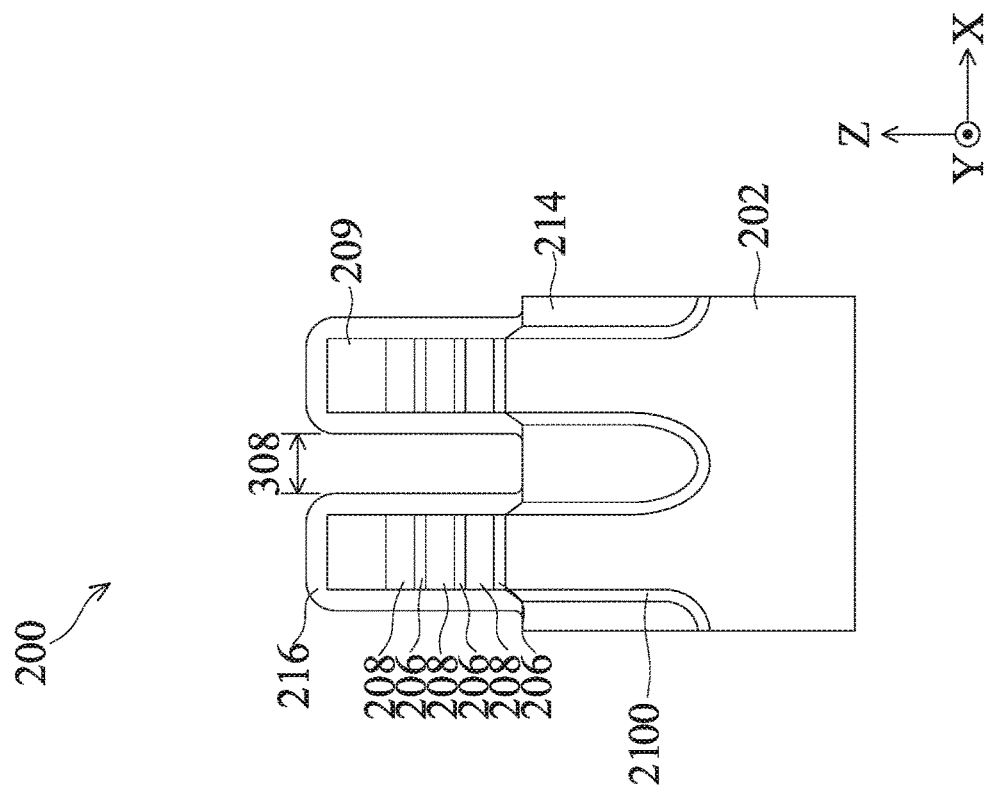
Figure 3B:
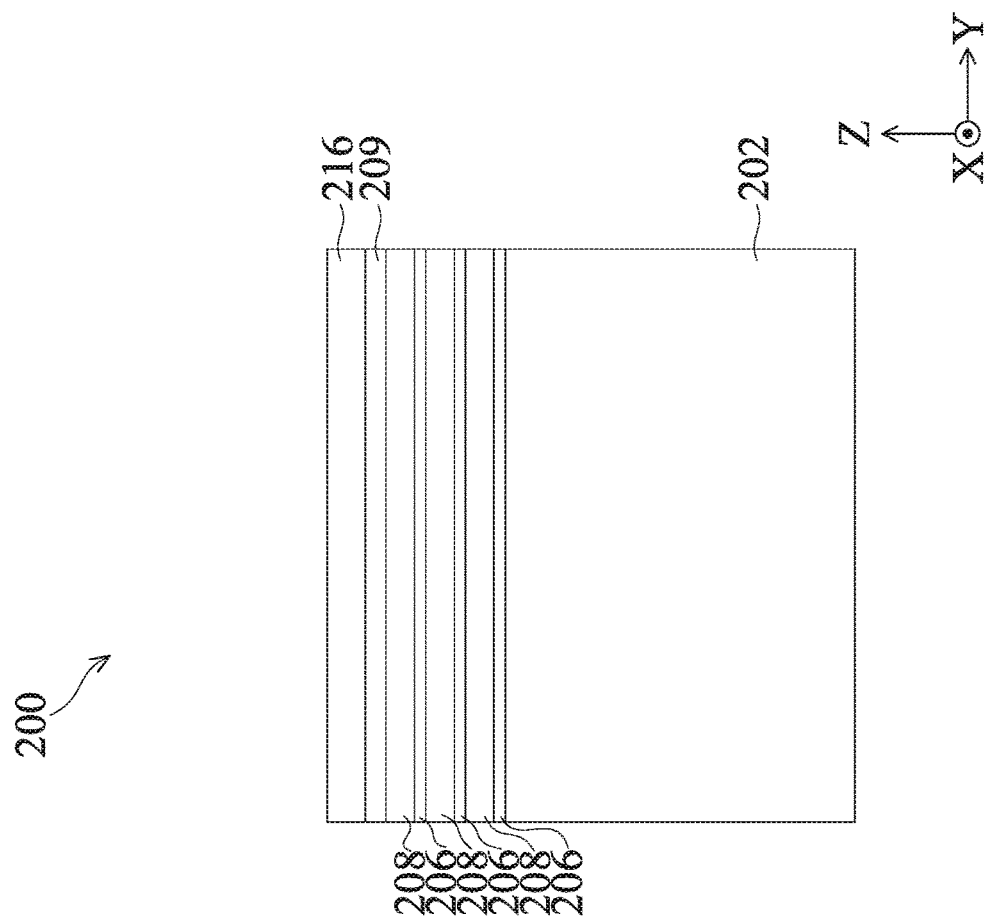

Referring to FIGS. 1A and 3A-3C, method 100A includes a block 108A where a cladding layer 216 is formed over the fin-shaped structures 212. In some embodiments, the cladding layer 216 may have a composition similar to that of the sacrificial layers 206. In one example, the cladding layer 216 may be formed of silicon germanium (SiGe), and the sacrificial layers 206 is also formed of SiGe. This common composition allows efficient selective removal of the sacrificial layers 206 and the cladding layer 216 without adversely affect the channel layers 208 (such as formed of Si) in a subsequent process. In some embodiments, the cladding layer 216 is formed of SiGe in an amorphous state, while the sacrificial layers 206 are formed of crystalline SiGe. In some embodiments, the cladding layer 216 may be conformally and epitaxially grown using VPE or MBE. In some alternative embodiments, the cladding layer 216 may be deposited using CVD, ALD, other suitable deposition method, or combinations thereof. As shown in FIGS. 3A, 3B and 3C, the cladding layer 216 is disposed on sidewalls of the fin-shaped structures 212, and the top surface of the first layer 209 (or the top surface of the second layer if present). In some embodiments where the deposition of the cladding layer 216 is not selective, operations at block 108A may include etch back processes to remove cladding layer 216 on the top surfaces of the isolation feature 214. An example etch back process may be a dry etch process that includes use of plasma of hydrogen bromide (HBr), oxygen ($O_2$), chlorine ($Cl_2$), or mixtures thereof. In some instances, the cladding layer 216 may have a thickness between about 5 nm and about 10 nm. In some embodiments where the deposition of the cladding layer 216 is selective and the first layer 209 is formed of silicon germanium, the aforementioned etch back operations may be omitted at block 108A.

Figure 4A:
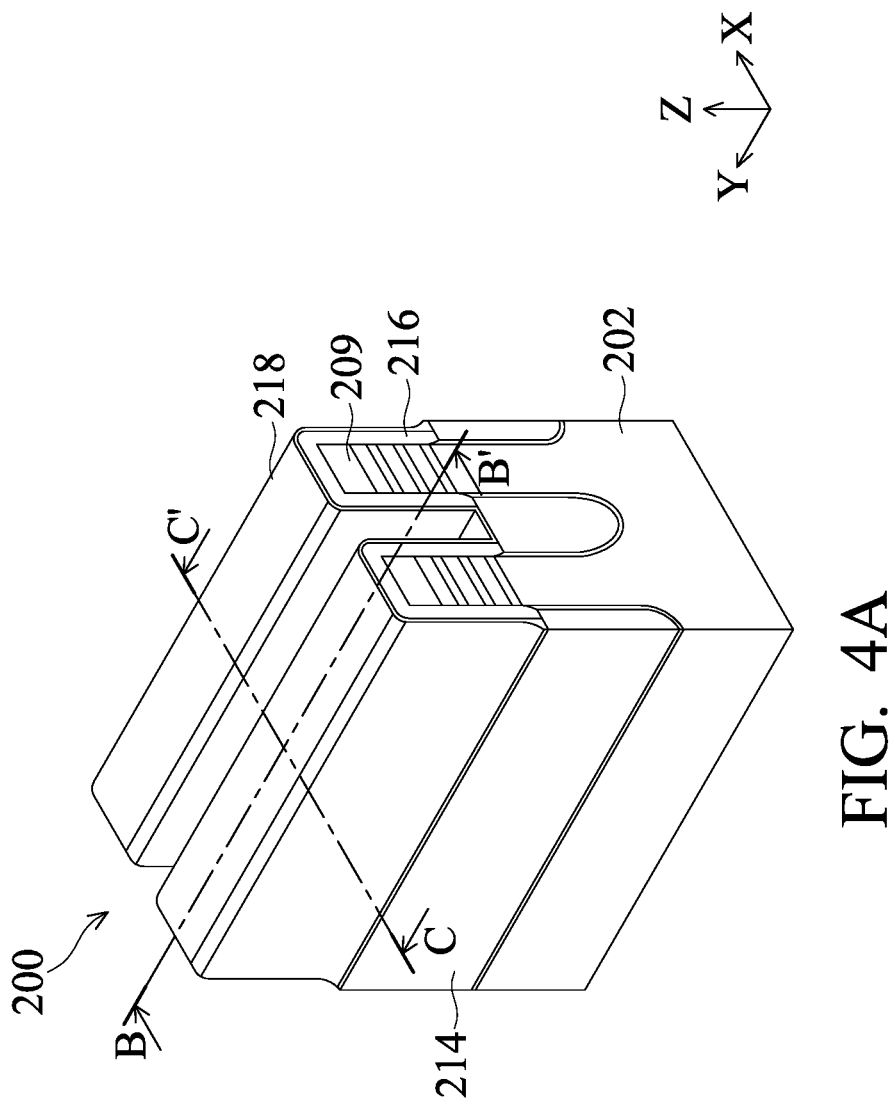
Figure 4C:
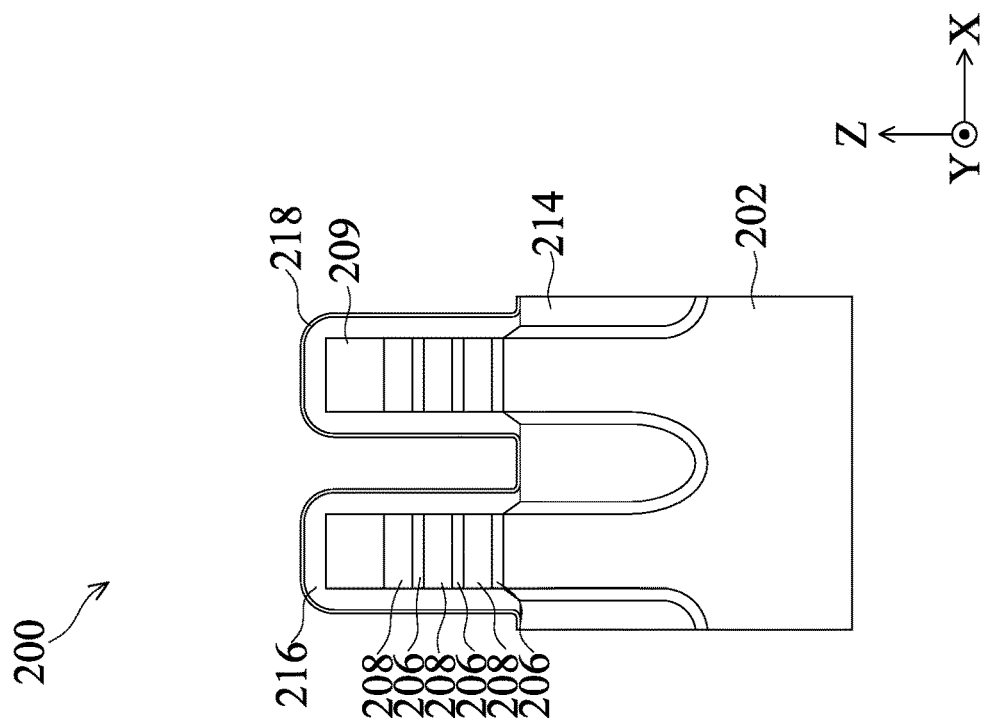
Figure 4B:
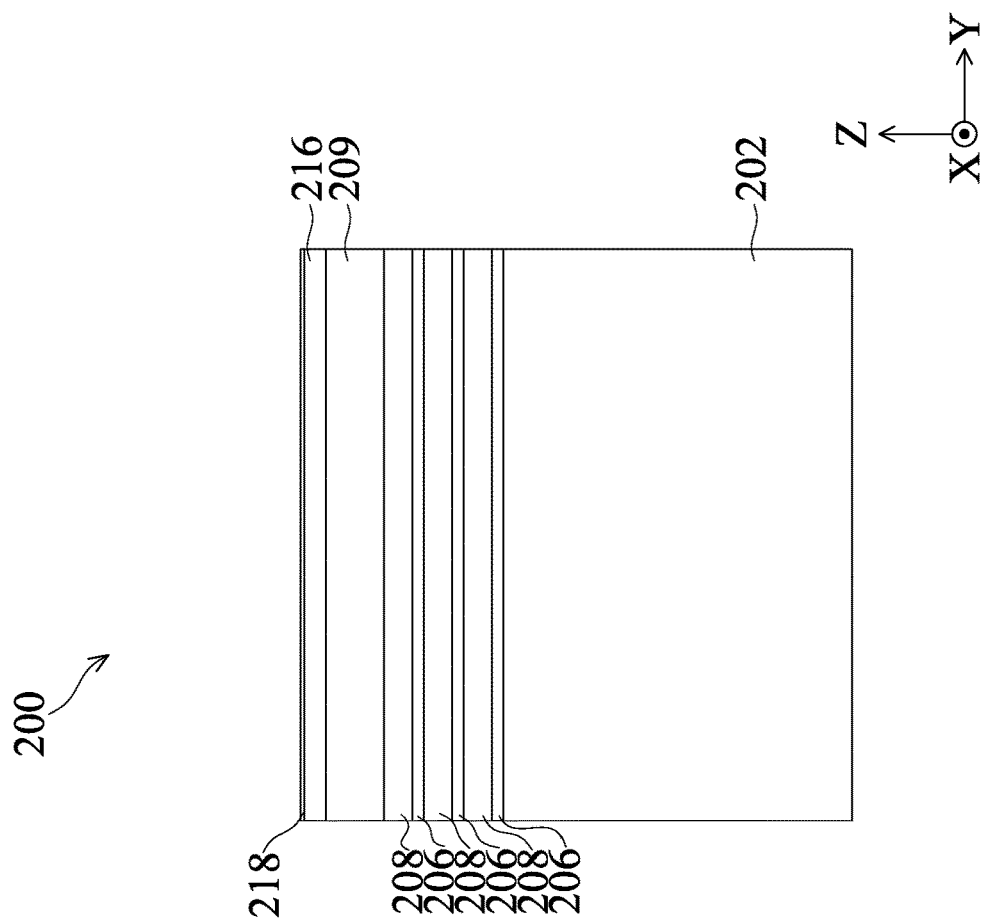
Figure 5A:
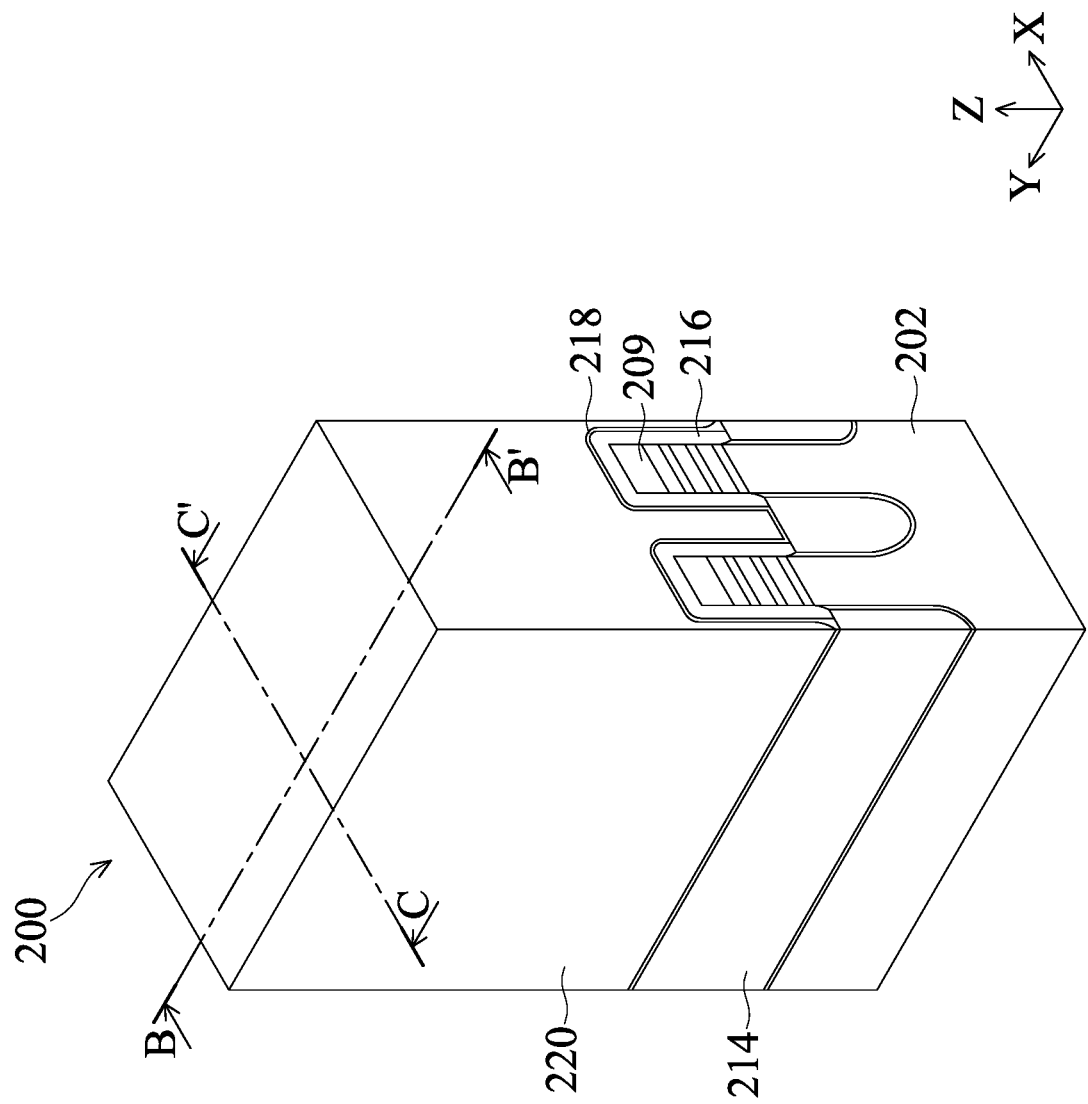
Figure 5C:
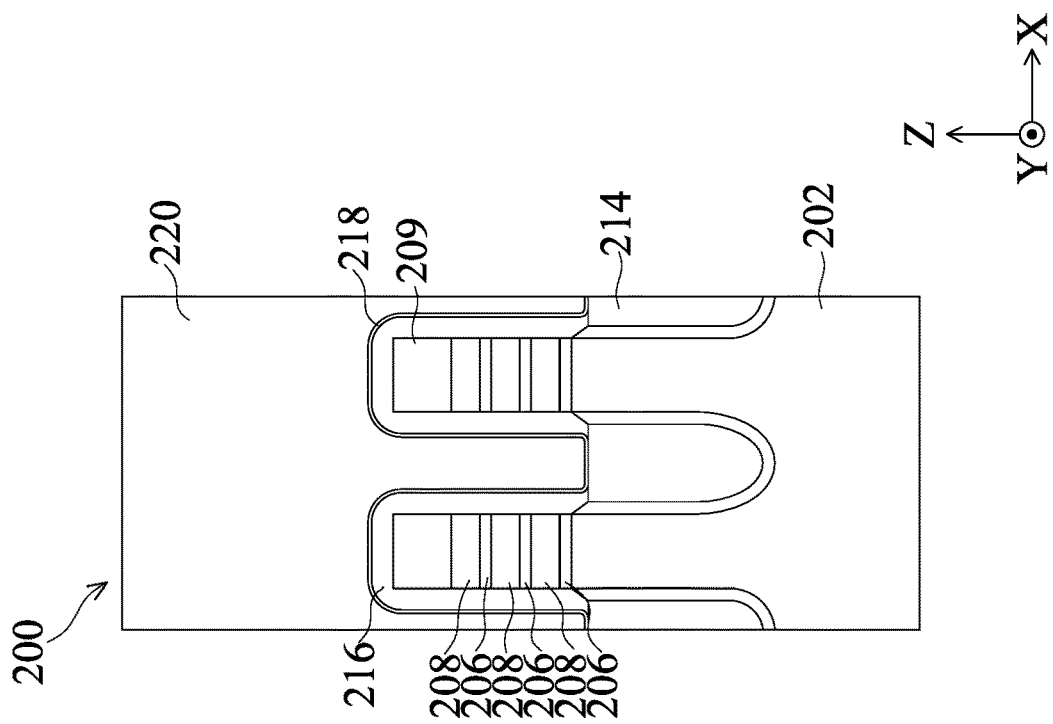
Figure 5B:
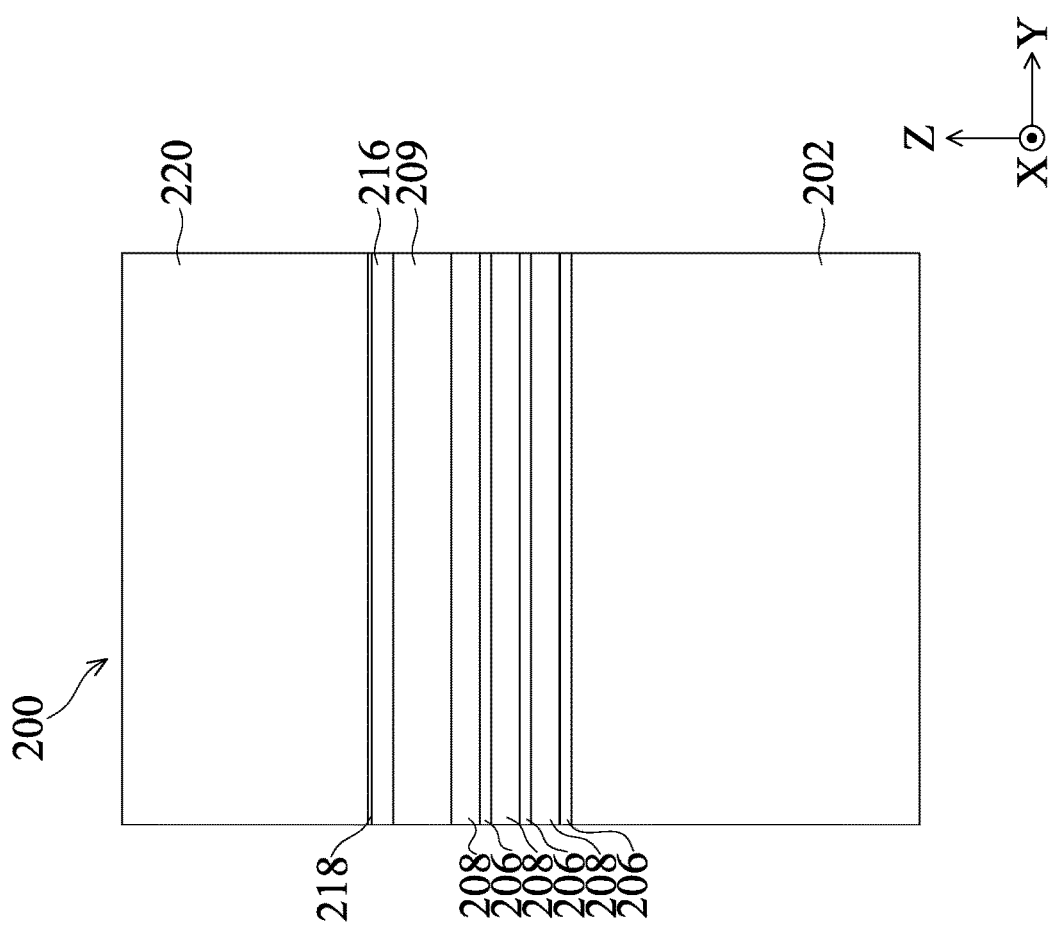
Figure 6A:
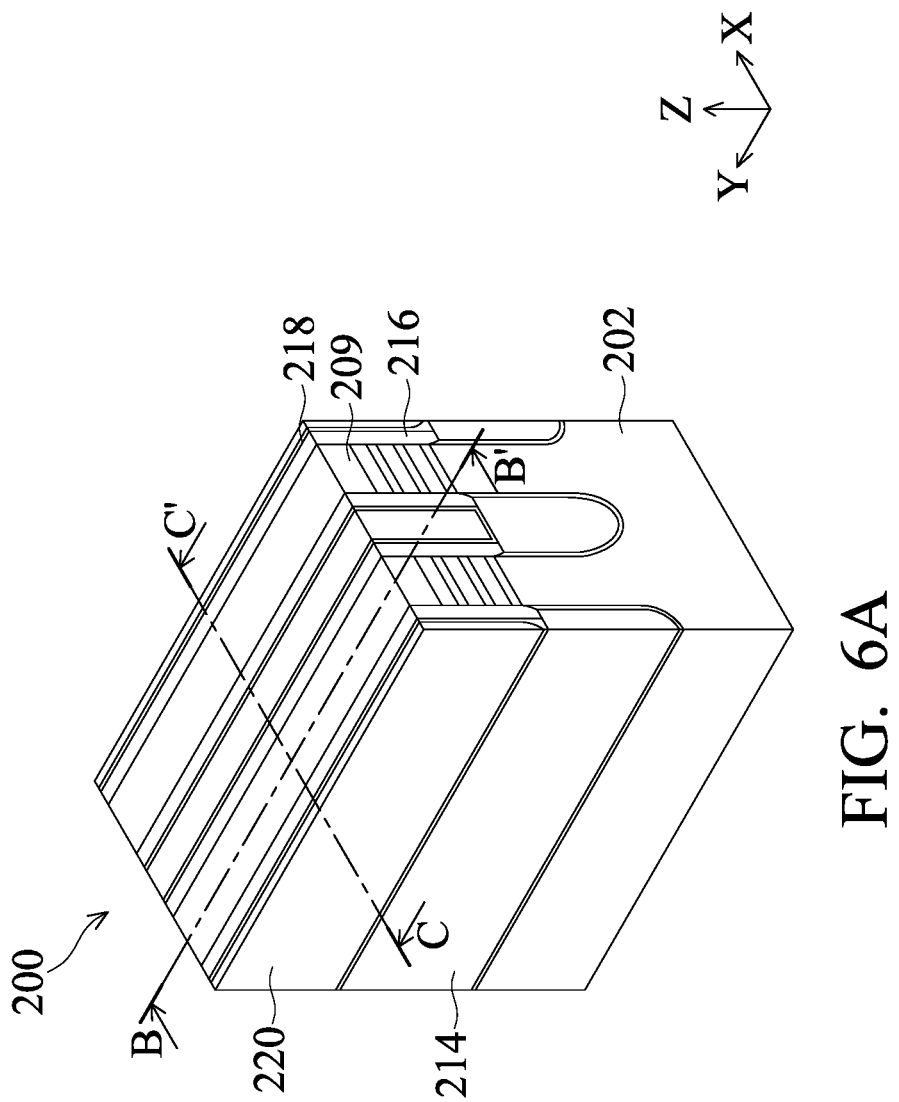
Figure 6C:
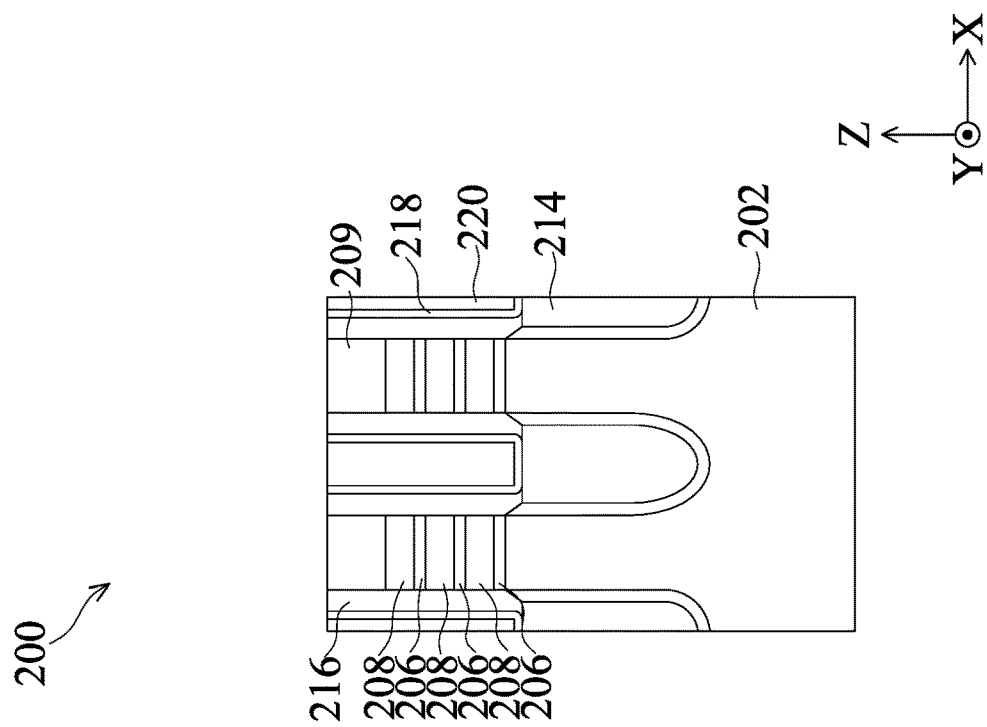
Figure 6B:
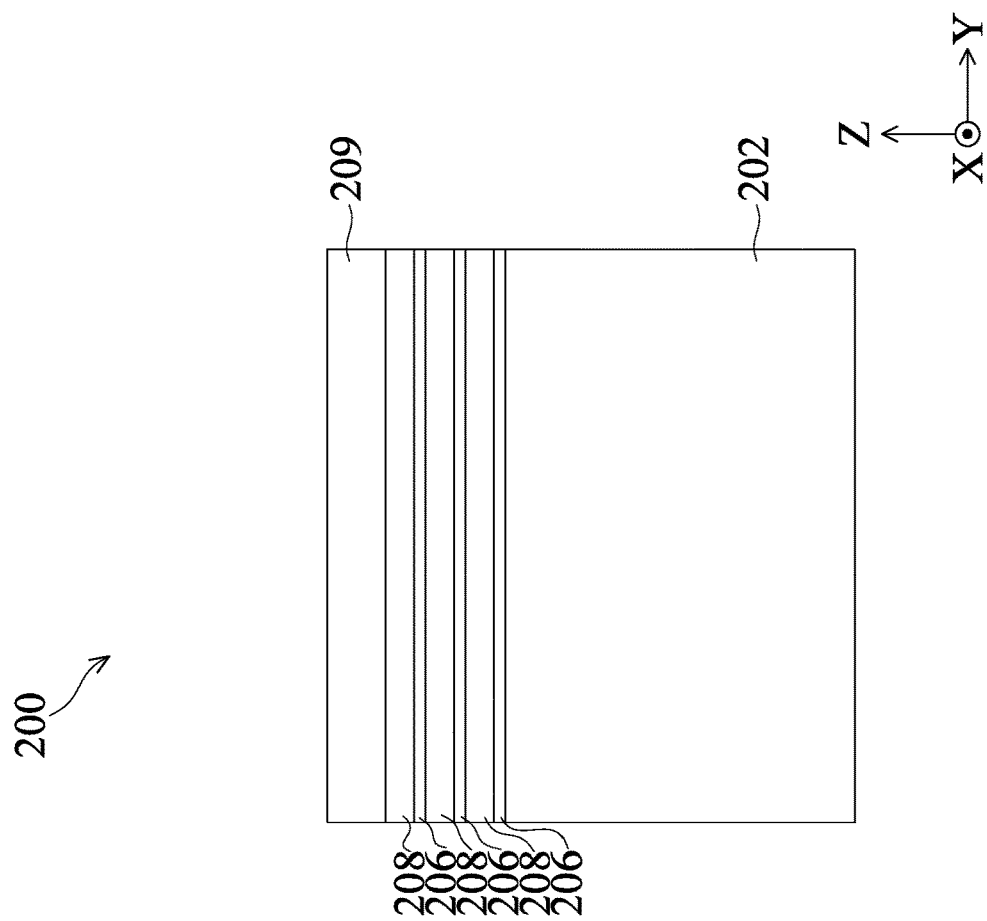

Referring to FIGS. 1A and 4A-4C, method 100A includes a block 110A where a fin spacer 218 is formed over the cladding layer 216. In some embodiments, the fin spacer 218 is formed of a dielectric material. Accordingly, an etching selectivity may be achieved with respect to the cladding layer 216. The fin spacer 218 may include silicon nitride, silicon oxynitride, silicon oxycarbonitride, or silicon carbonitride. In some implementations, the fin spacer 218 may be deposited using CVD, ALD, or other suitable deposition methods. As shown in FIGS. 4A-4C, the fin spacer 218 is disposed on the top surface of the isolation feature 214 as well as sidewalls and top surfaces of the cladding layer 216.

Referring to FIGS. 1A and 5A-5C, method 100A includes a block 112A where a filler layer 220 is deposited over the workpiece 200. In some embodiments, a composition of the filler layer 220 may be similar to a composition of the isolation feature 214. In some embodiments, the filler layer 220 may be deposited using a CVD process, an SACVD process, an FCVD process, an ALD process, a PVD process, spin-on coating, and/or other suitable process. In an example, the filler layer 220 may be deposited using an FCVD process to a thickness about 2,000 nm to about 4,500 nm, as measured from the top surface of the first layer 209 (or from the top surface of the second layer, if present). Referring to FIGS. 1A and 6A-6C, method 100A includes a block 114A where the workpiece 200 is planarized. In some embodiments, the workpiece 200 is planarized using a CMP process until top surfaces of the first layer 209 are exposed. In some alternative embodiments where the second layer is present at this processing stage, the CMP process may proceed until top surfaces of the second layer are exposed.

Referring to FIGS. 1A and 7A-7C, method 100A includes a block 116A where the remaining portion of the filler layer 220 is recessed. In some embodiments, this recess process produces a top surface on which a helmet-shaped dielectric layer is subsequently formed. Accordingly, this recess process is also referred to as a helmet recess process. In some embodiments, the top surface of the recessed filler layer 220 is below the top surface of the topmost channel layer 208 by a distance 310. In some embodiments, the distance 310 is about 4 nm to about 45 nm. In some embodiments, the distance 310 is about 10 nm to about 20 nm. For example, the height 312 of the recessed filler layer 220 may be about 10 nm to about 50 nm. The height 312 measures from the bottom surface of the recessed filler layer 220, which is also a top surface of the fin spacer 218. As described in detail later, the reduced height of the dielectric material between adjacent fin-shaped structures 212 allows better materials access to spaces between vertically adjacent channel layers (i.e. the spaced occupied by the sacrificial layer 206 at the processing stage associated with FIGS. 7A-7C). Such improved material accesses may improve the efficacy of such subsequent processes. For example, the improved access by etching chemicals (such as etching chemical that removes the sacrificial layers 206) improves the channel release process and avoids issues related to threshold voltage and/or work function caused by residual sacrificial materials. Moreover, the improved access by gate materials (such as gate dielectric material, gate electrode materials) improves the quality and integrity of the gate layers and ultimately improves device performance If the distance 310 is too small, such as smaller than 4 nm, or the height 312 is too high, such as greater than 50 nm, the improvement to the material access may be too small to justify the additional processing cost; while if the distance 310 is too large, such as greater than 45 nm, or the height 312 is too small, such as less than about 10 nm, the subsequently formed dielectric layer 222 may reach too deep into the trench between adjacent fin-shaped structures 212, such that a subsequent removal process of the dielectric layer 222 may leave residues which adversely affect the threshold voltage and/or work functions. The helmet recess process can utilize any suitable technologies, such as a wet etching and/or a dry etching.

Figure 7A:
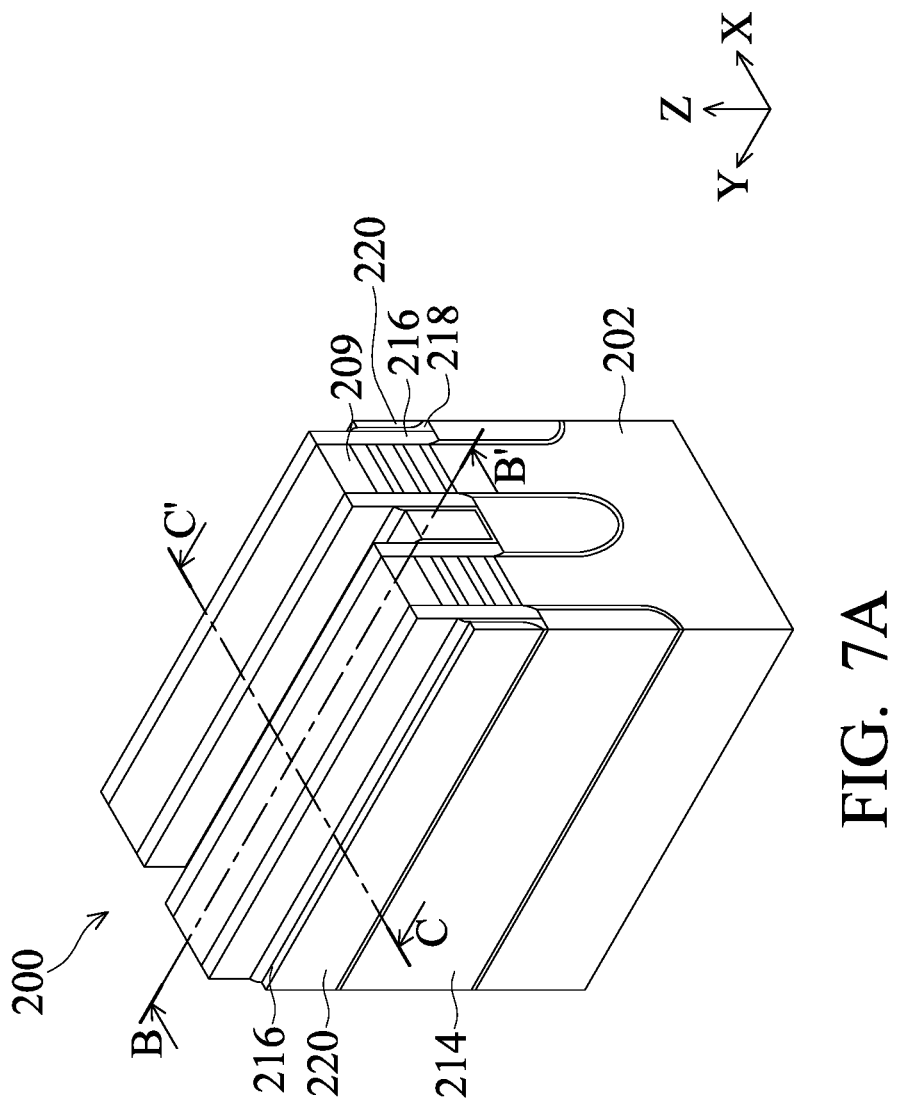
Figure 7C:
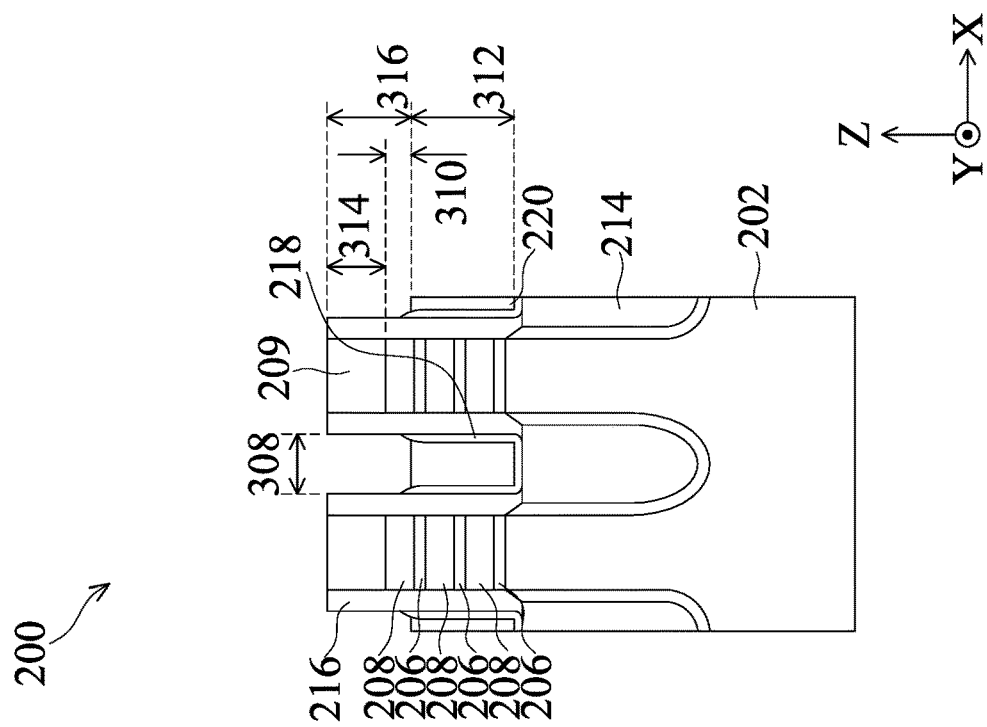
Figure 7B:
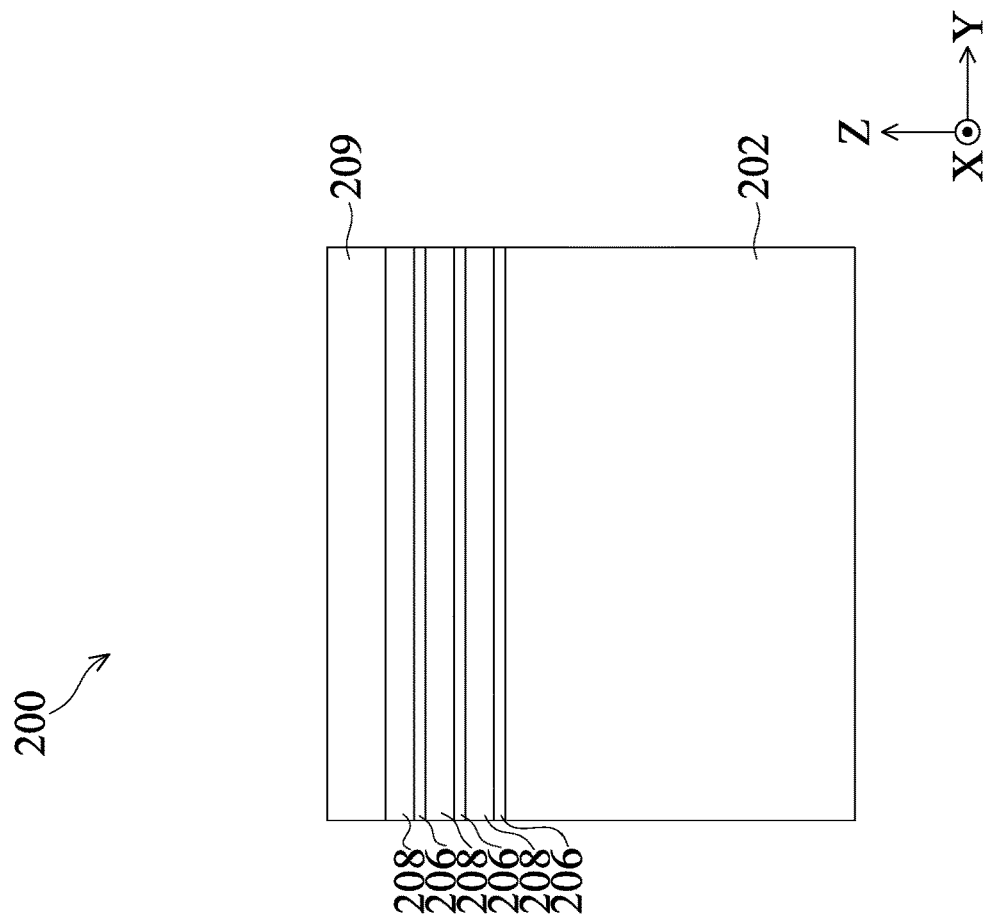

In some embodiments, the time duration of the recess process may be controlled to adjust the distance 310 to the desired range. In some embodiments, the top surface of the recessed filler layer 220 may extend below a bottom surface of the topmost sacrificial layer 206, such that access to the space occupied to the topmost sacrificial layer 206 is unrestricted. In some embodiments, the top surface of the recessed filler layer 220 may extend below a bottom surface of the second sacrificial layer 206 counting from the top. Accordingly, access to the spaces occupied by the two topmost sacrificial layers 206 are both unrestricted. In some embodiments, the fin spacer 218 is also recessed along with the filler layer 220. As illustrated in FIGS. 7A-7C, a height difference between the top surface of the first layer 209 and the top surface of the recessed filler layer 220 is the sum of the distance 314 described above and the distance 310 described above, denoted as the height 316. In some embodiments, the height 316 may be about 5 nm to about 50 nm. In some embodiments, a ratio of the height 312 to the height 316 may be about 20:1 to about 0.5:1. In some embodiments, a ratio of the height 312 to the height 316 may be about 10:1 to about 1:1. In some embodiments, a ratio of the height 312 to the height 316 may be about 5:1 to about 2:1. As described in detail later, if the ratio is too small, such as less than about 0.5:1, the dielectric layer 222 may reach too deep in the trench between the adjacent fin-shaped structures 212, such that subsequent removal of the dielectric layer 222 from the trench may be challenging. If the ratio is too high, such as greater than about 10:1, either the dielectric layer 222 may be too low to isolate adjacent gate structures, or the recessed filler layer 220 may be too high such that substantial restriction is imposed to the material access of the channel region. In some embodiments, a ratio of the height 312 to the height 316 may be about 8:1 to about 1:1.

Figure 8A:
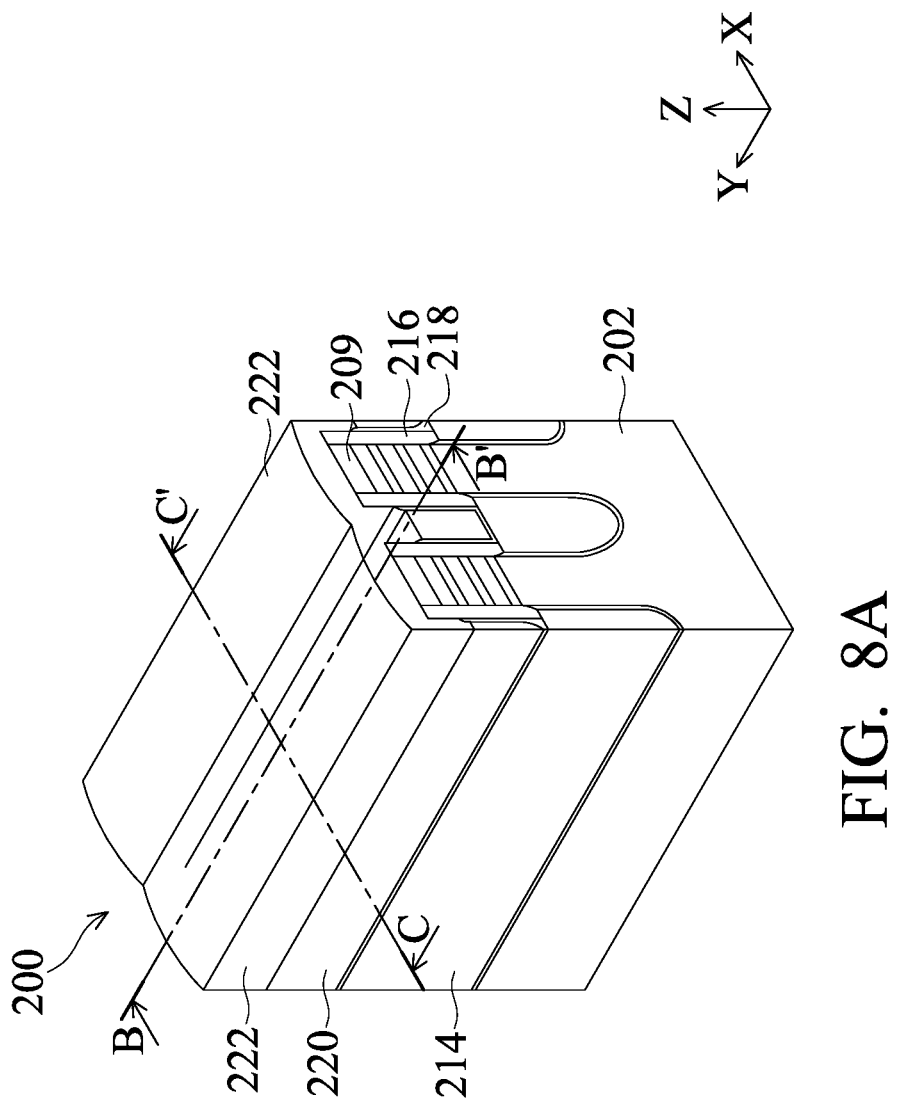
Figure 8C:
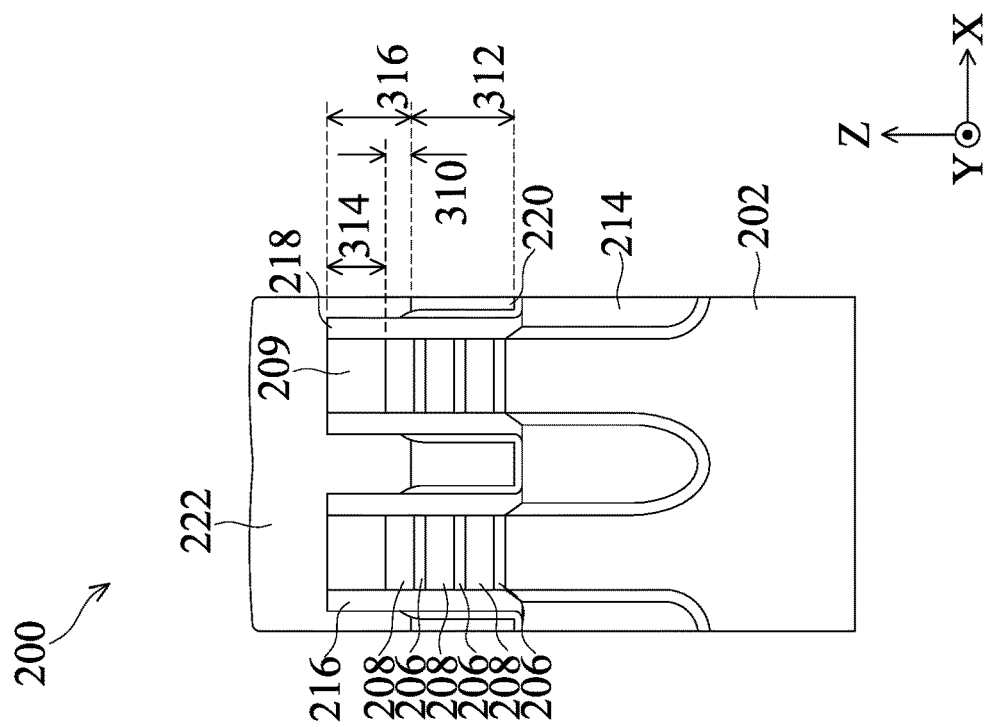
Figure 8B:
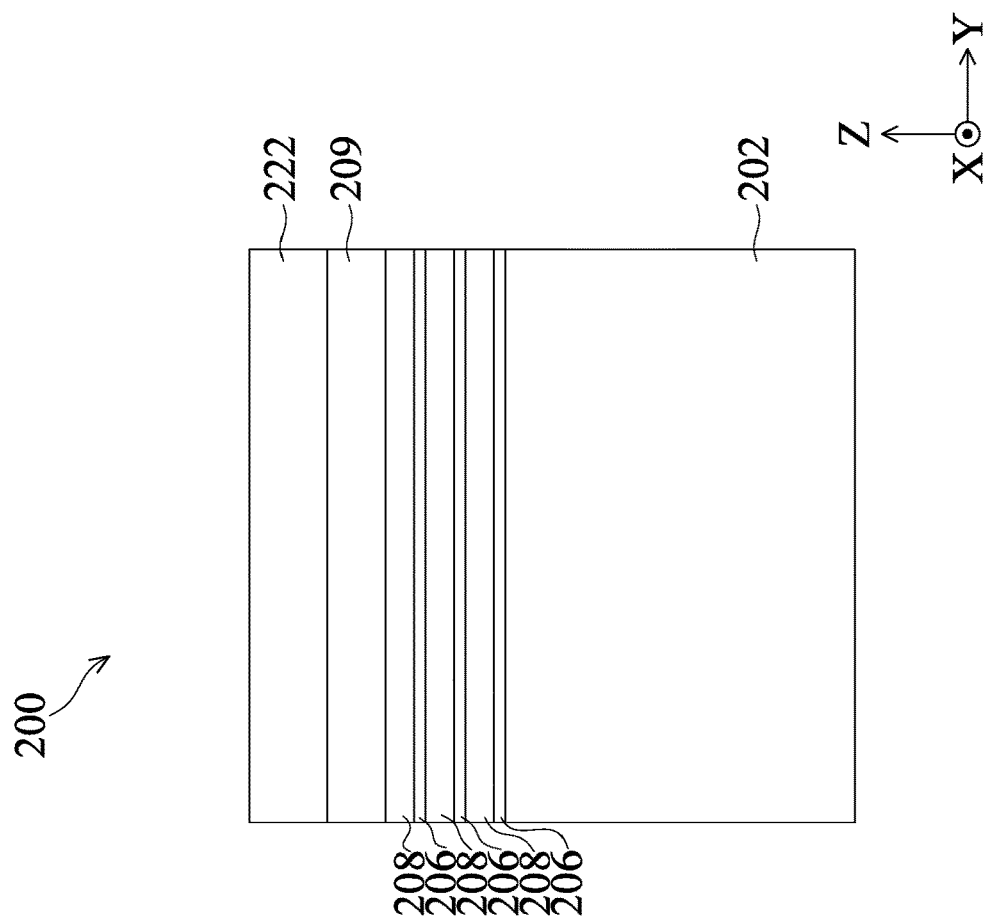
Figure 9A:
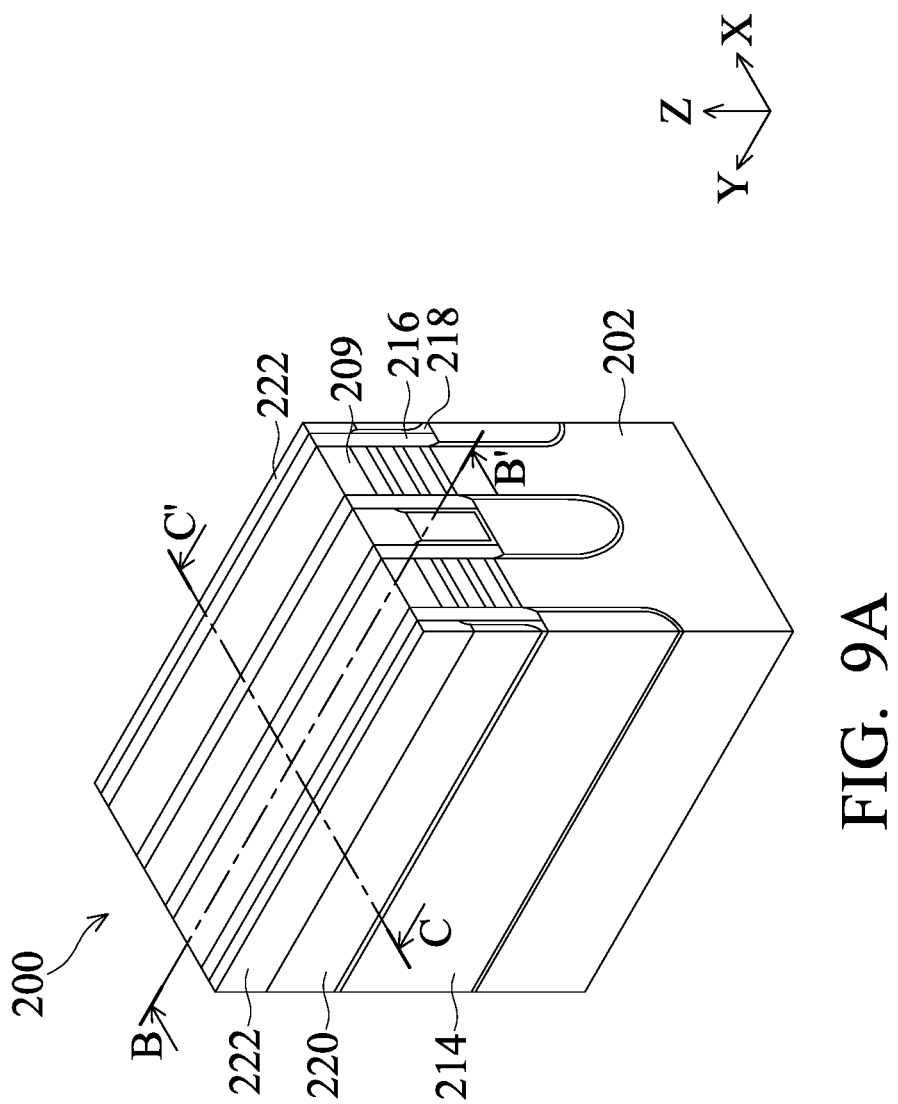
Figure 9C:
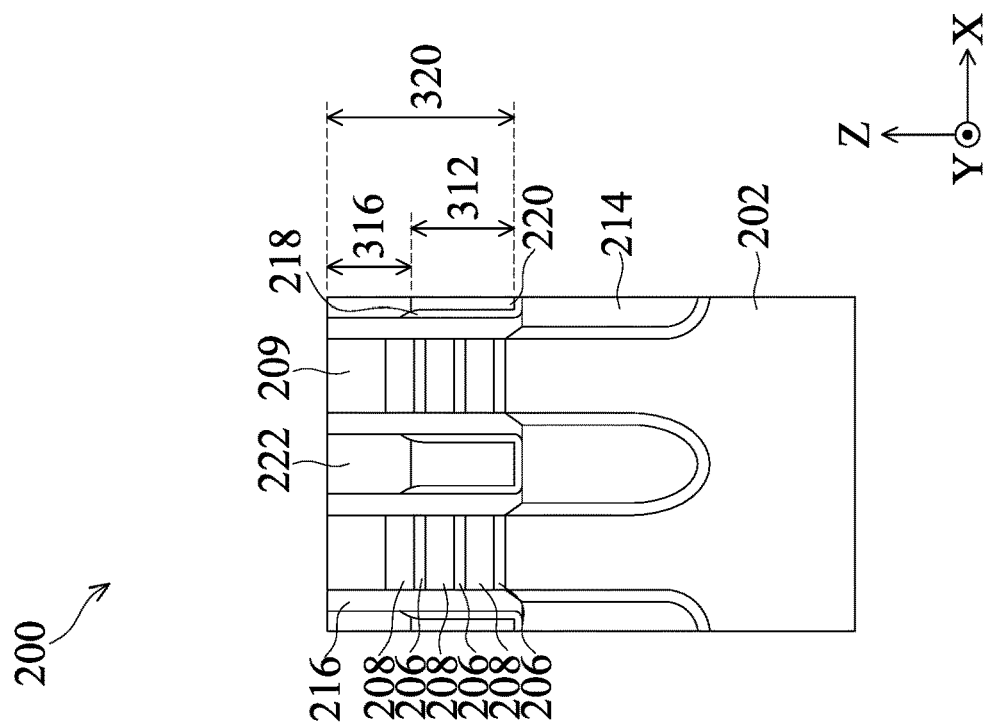
Figure 9B:
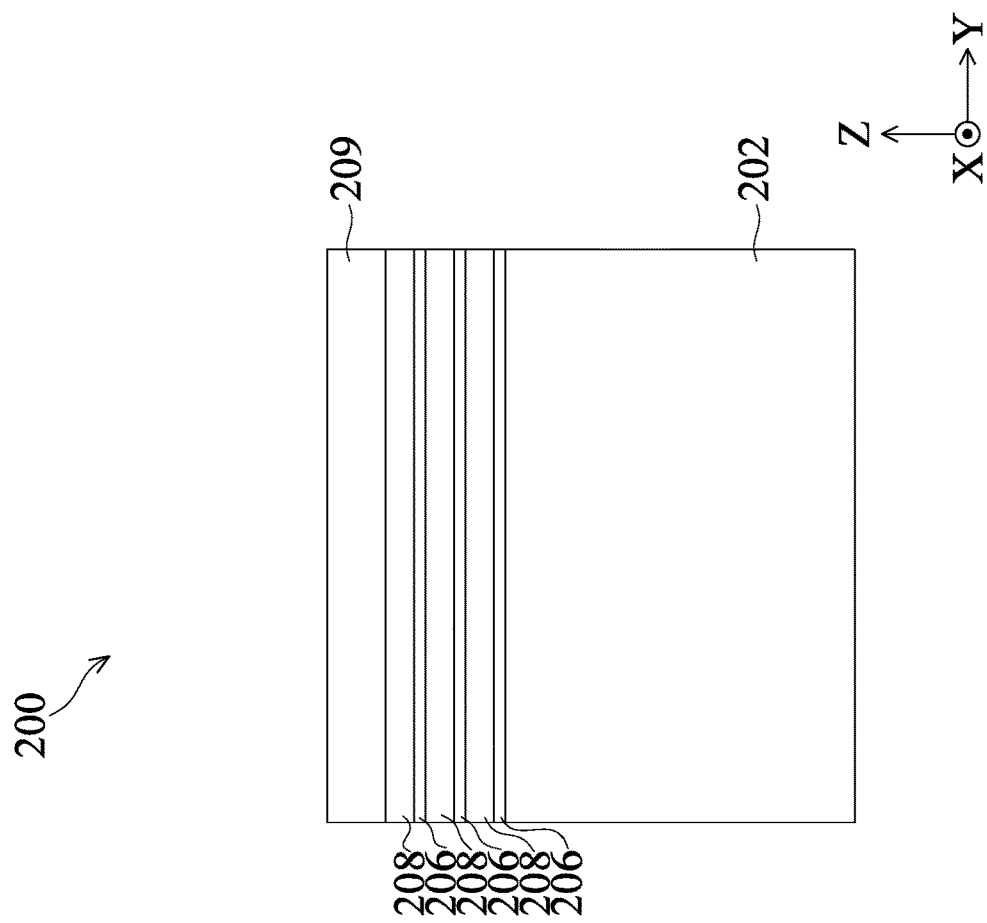

Referring to FIGS. 1A and 8A-8C, method 100A includes a block 118A where a dielectric layer 222 is formed overlaying the recessed filler layer 220. In some embodiments, the dielectric layer 222 is formed on the top surface of the first layer 209 (or on the second layer, if present), on the top surface of the cladding layer 216, on the sidewall of the cladding layer 216, on the fin spacer 218, and on the top surface of the recessed filler layer 220. As illustrated in FIG. 8C, the dielectric layer 222 includes portions that resemble the shape of a helmet. The dielectric layer 222 may be formed of high-k dielectric materials, and may be interchangeably referred to as the high-k dielectric layer 222 or high-k hard mask layer 222. As used herein, high-k dielectric materials include dielectric materials having a high dielectric constant, for example, greater than that of thermal silicon oxide (~3.9). The dielectric layer 222 may include hafnium oxide. Alternatively, the dielectric layer 222 may include other high-k dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material.

Referring to FIGS. 1A and 9A-9C, method 100A includes a block 120A where the workpiece 200 is planarized. In some embodiments, the workpiece 200 is planarized using a CMP process until top surfaces of the first layer 209 are exposed (or where the second layer is present, the CMP process may terminate when the second layer is exposed). In the depicted embodiments, the planarized dielectric layer 222 has a height corresponding to the height difference between the top surface of the first layer 209 and the top surface of the recessed filler layer 220. In other words, the planarized dielectric layer 222 has a height 316. As described in detail later, the dielectric layer 222 and the recessed filler layer 220 collectively define a dielectric wall (or a cut-metal-gate, or CMG) of a subsequently formed functional gate structure. The height of this dielectric wall, which equals the sum of the height 316 and the height 312, is referred to as the height 320. It is noted that the height 320 is measured from a top surface of the fin spacer 218 to the top surface of the dielectric wall. In some embodiments, a ratio of the height 320 to the height 312 may be about 3:1 to about 1.05:1. In some embodiments, a ratio of the height 320 to the height 312 may be about 2:1 to about 1.1:1. In some embodiments, a ratio of the height 320 to the height 312 may be about 1.5:1 to about 0.8:1.

Figure 10A:
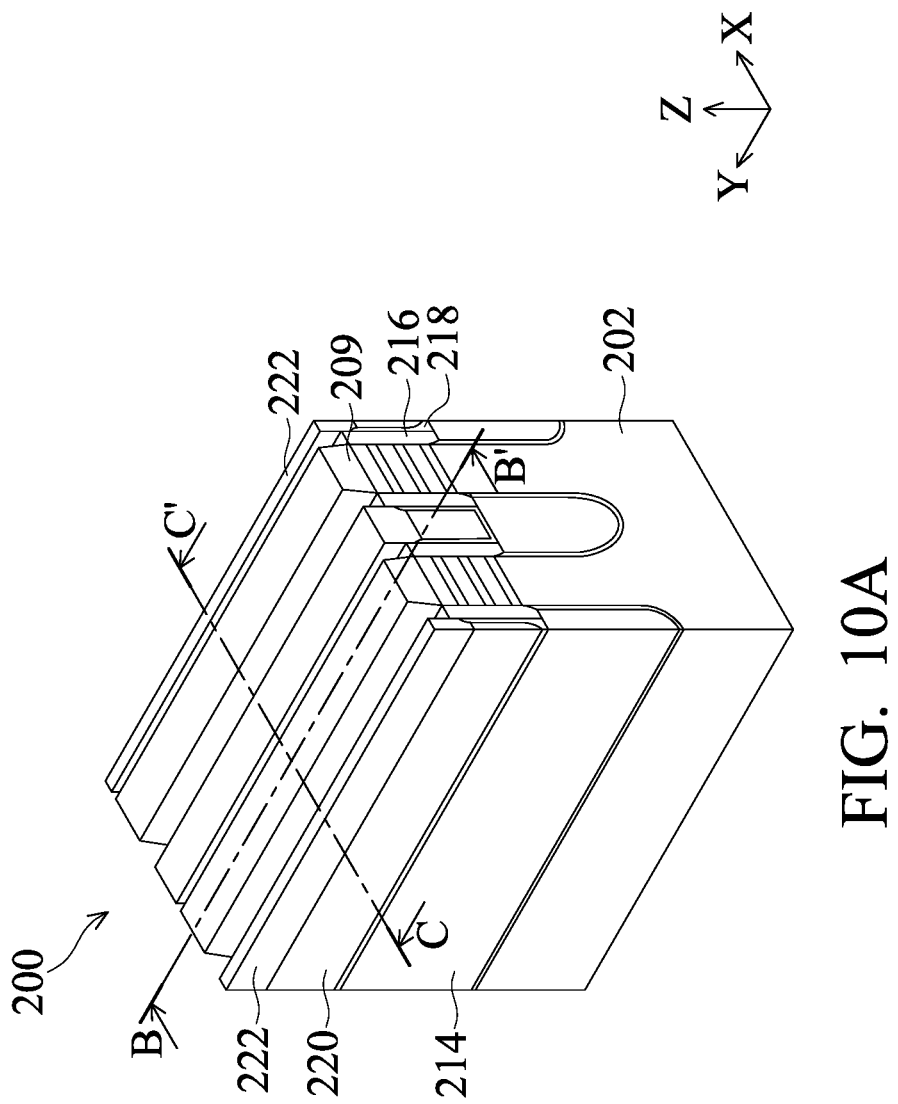
Figure 10B:
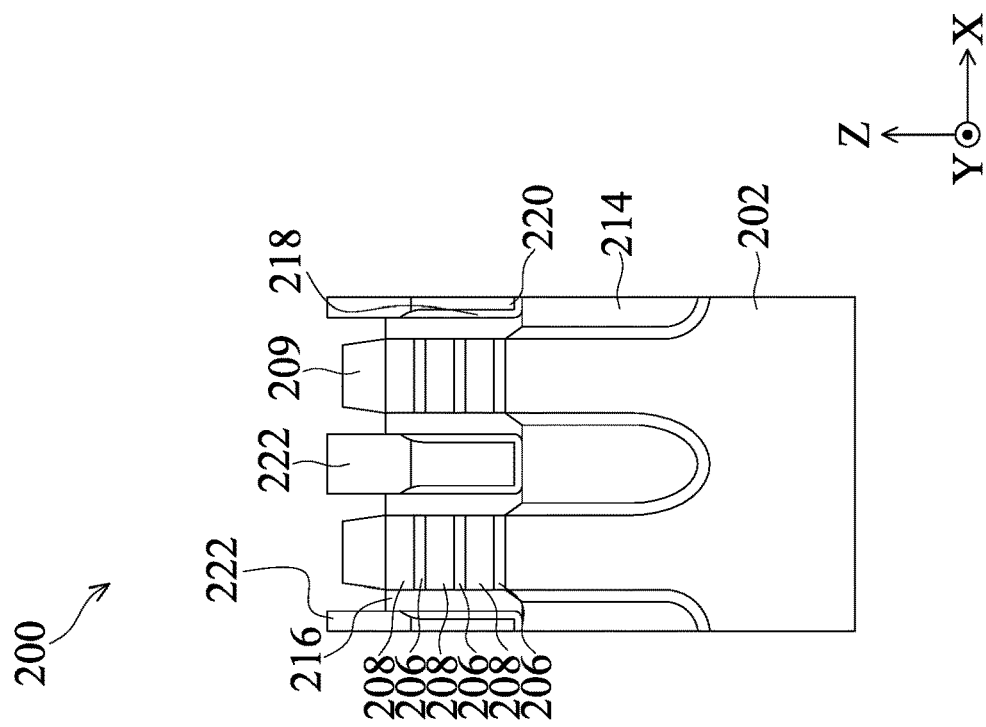
Figure 10C:
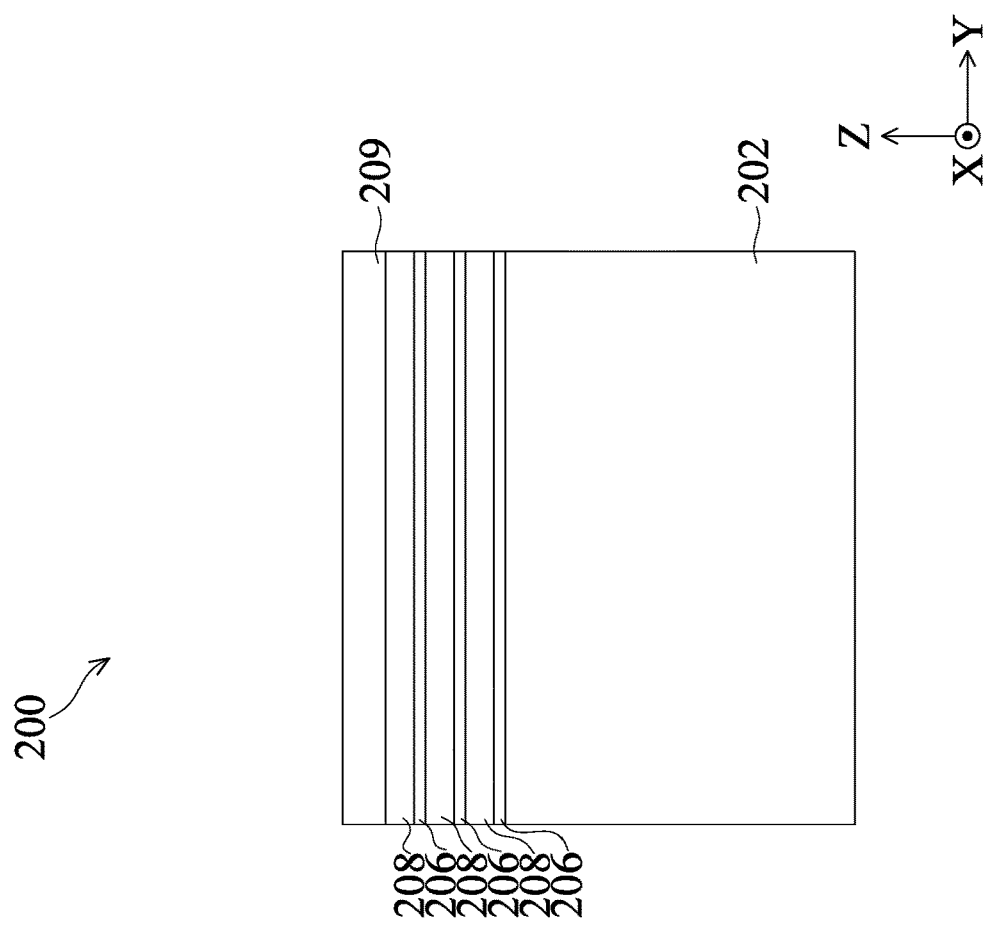
Figure 11A:
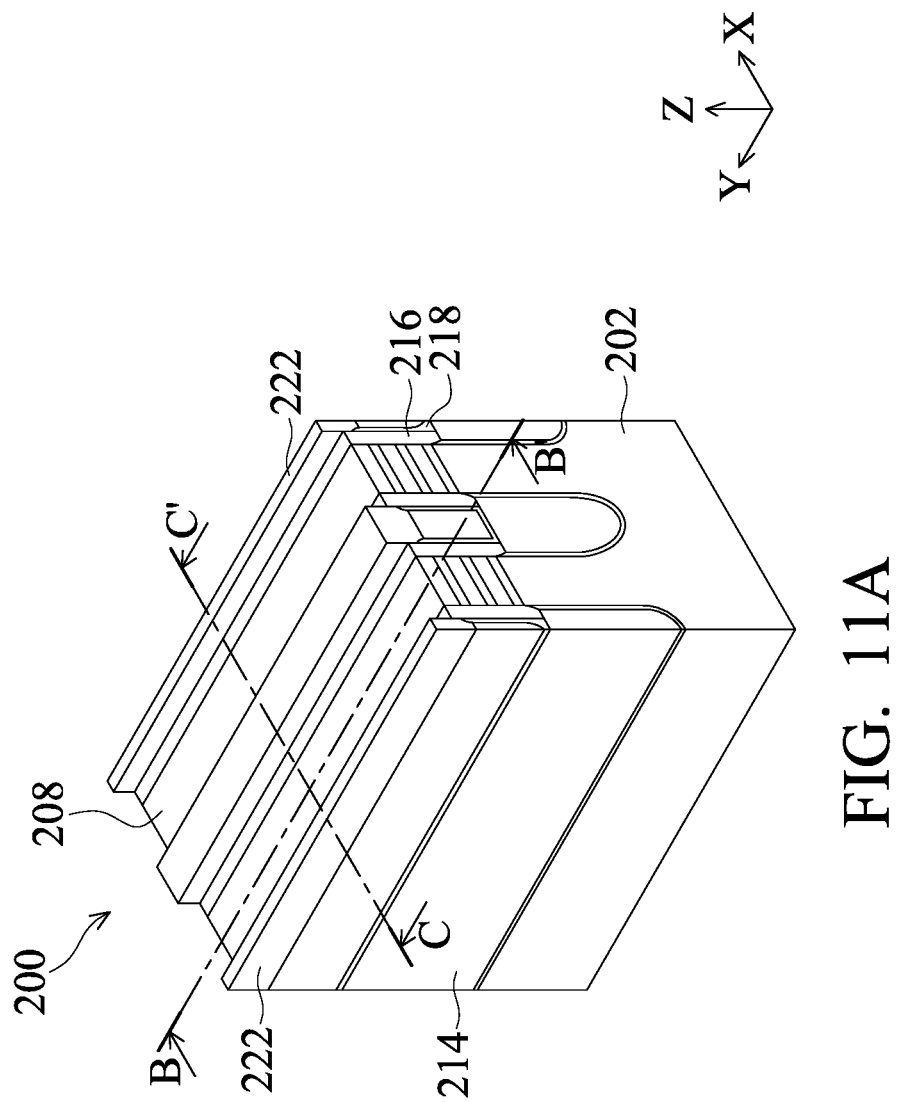
Figure 11C:
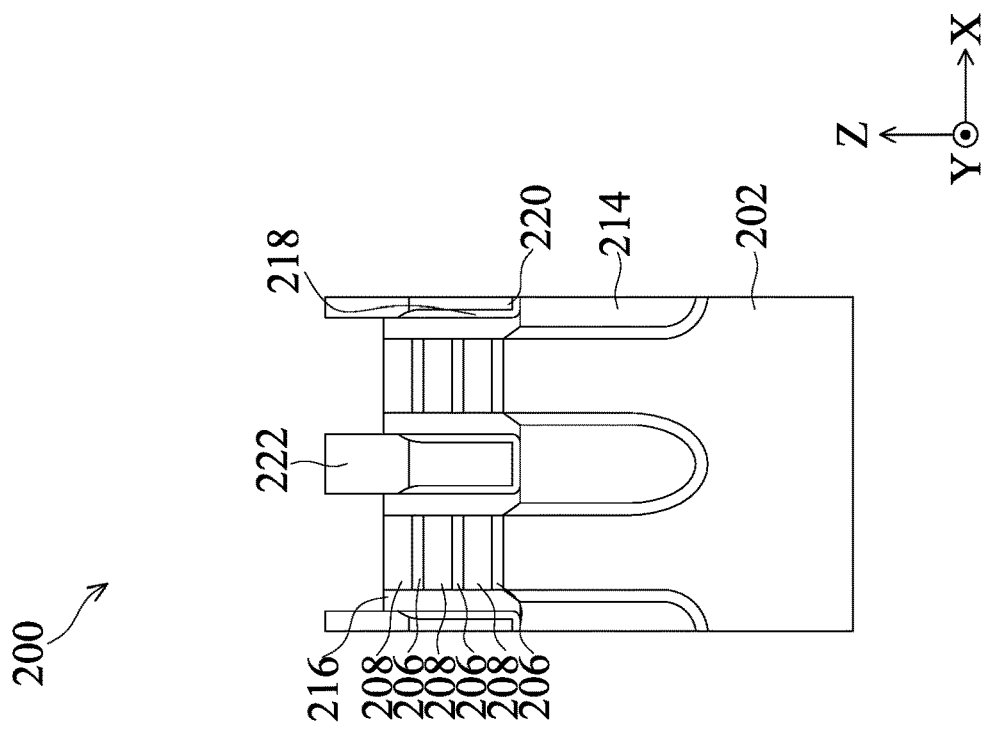
Figure 11B:
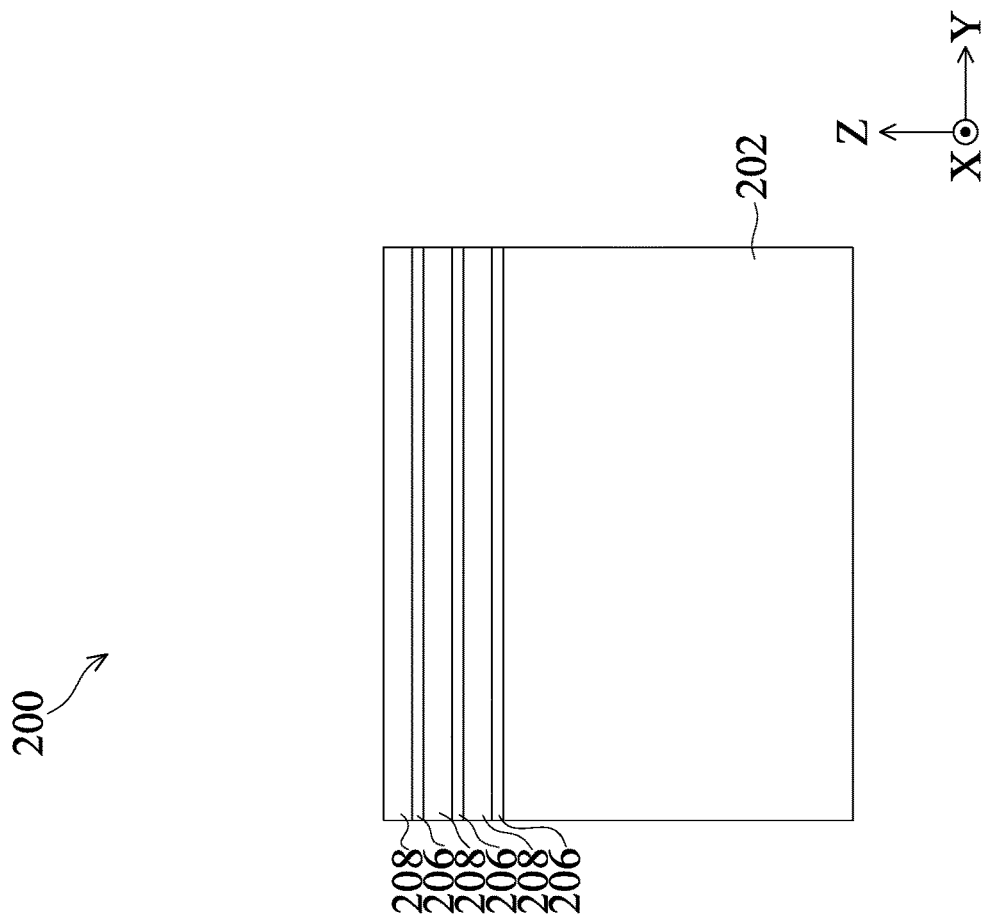

Referring then to FIGS. 10A-10C, the planarized cladding layer 216 between the adjacent dielectric layer 222 and first layer 209 is further recessed by a dry etching process, a wet etching process, and/or a combination thereof to form a trench between the adjacent dielectric layer 222 and first layer 209. The recessing of the cladding layer 216 may be modulated by adjusting a time duration of the recessing process. For example, in the depicted embodiments, the portion of the cladding layer 216 above the top surface of the topmost channel layer 208 is removed in its entirety but without proceeding further beyond. In other words, the top surface of the recessed cladding layer 216 extends along the top surface of the topmost channel layer 208. Accordingly, the top surface of the recessed cladding layer 216 also extends above the bottom surface of the dielectric layer 222. However, in other embodiments, more or less of the cladding layer 216 may be recessed depending on the design requirements. As shown in FIGS. 10A-10C, the top portion of the first layer 209 may also be recessed in the meantime. In some embodiments, the thickness of the first layer 209 is reduced, and the profile of the top surface of the first layer 209 is modified during the process. For example, prior to the recessing process, the first layer 209 has a rectangle shape on the X-Z cross section; while that after the recessing process has a shape of trapezoid. Referring to FIGS. 11A-11C, the first layer 209 is further removed by a suitable etching process until a top surface of a topmost channel layer 208 is exposed.

Figure 12A:
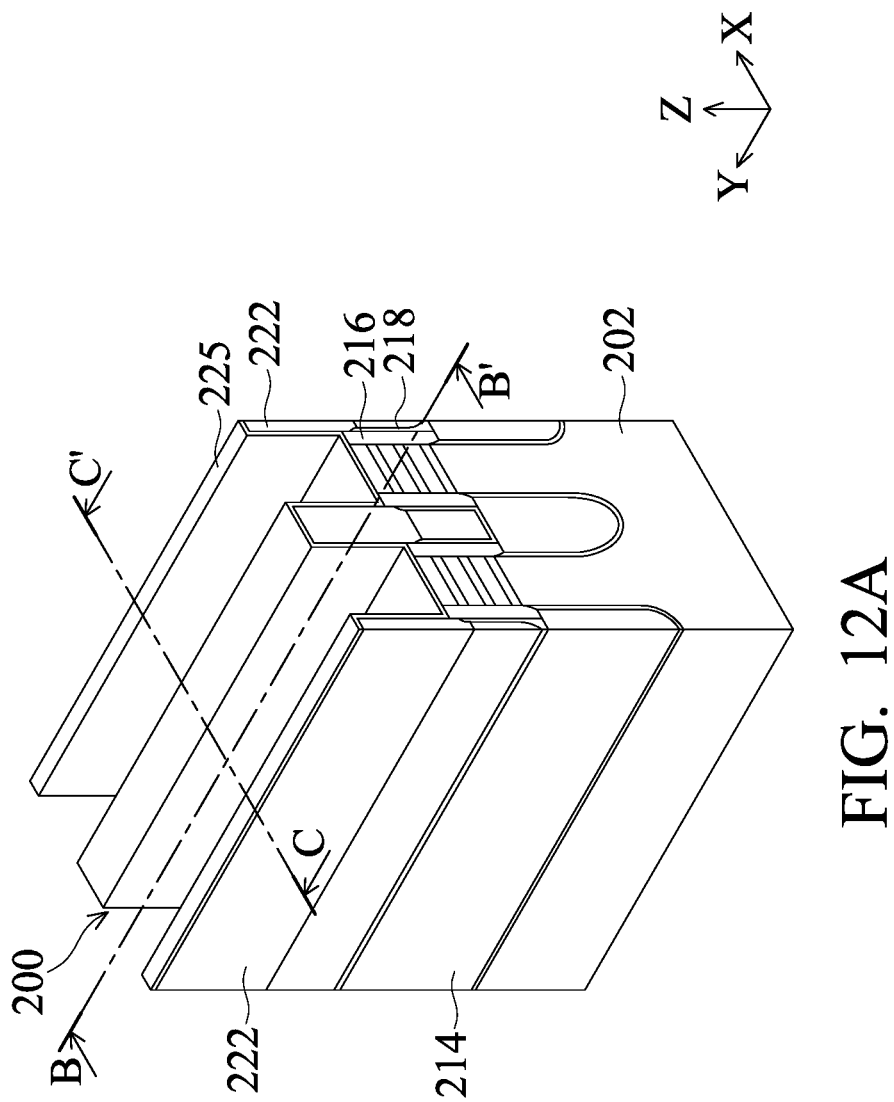
Figure 12C:
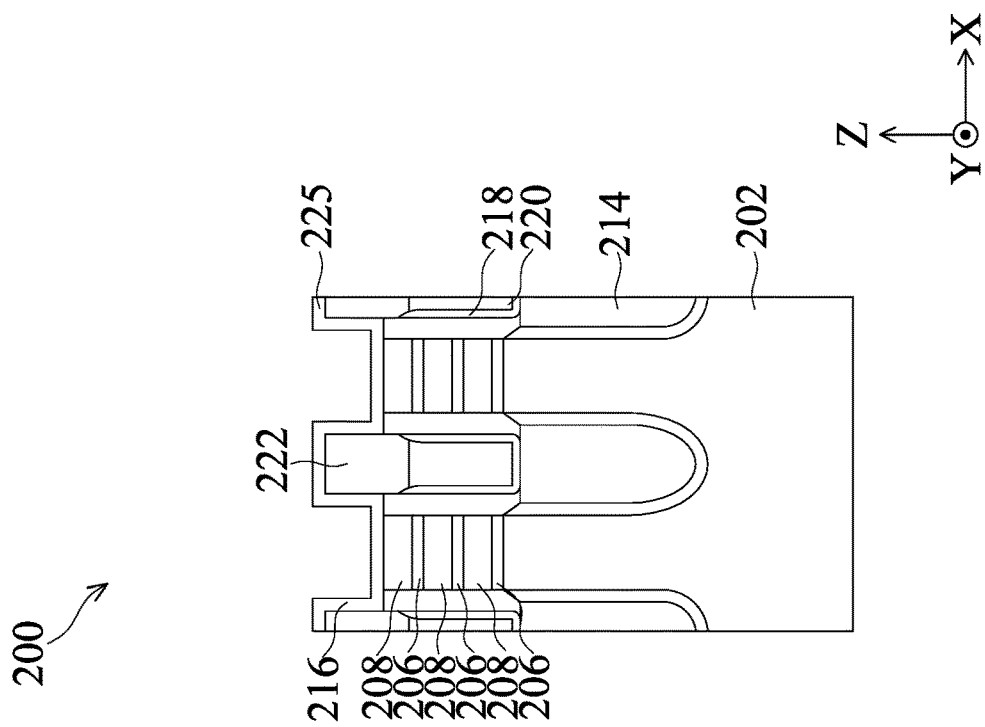
Figure 12B:
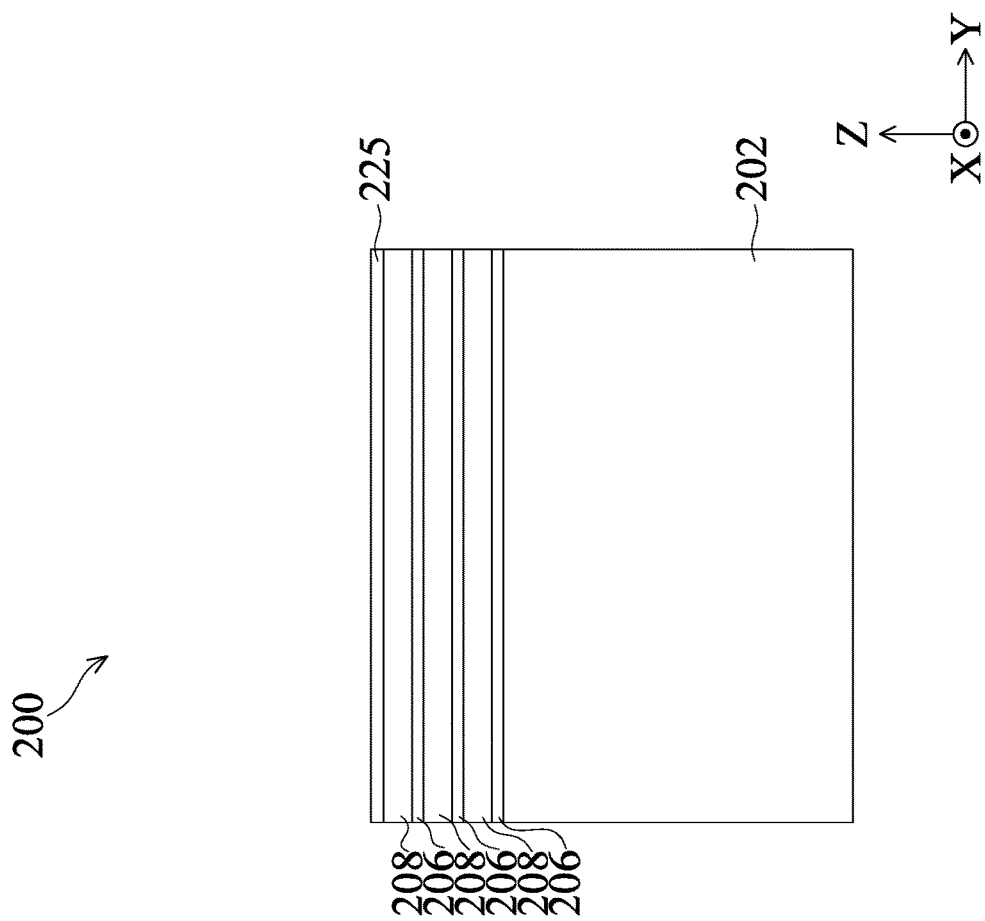
Figure 13A:
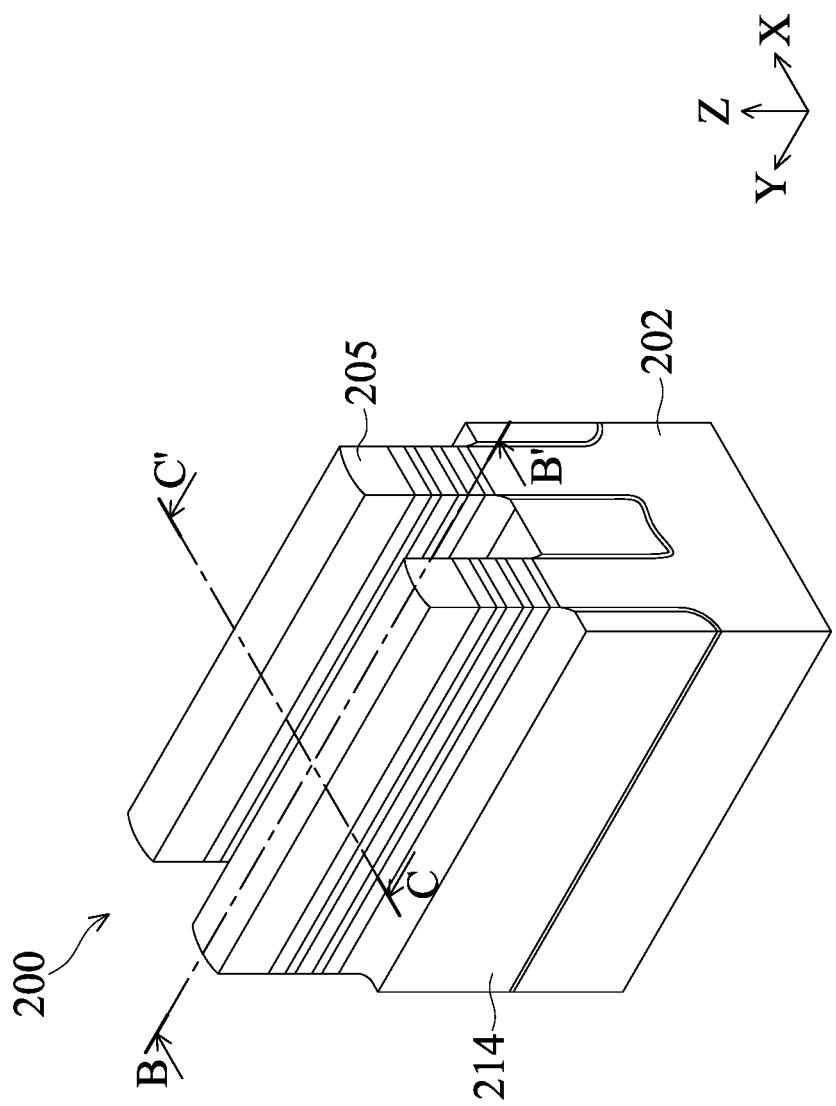
Figure 13C:
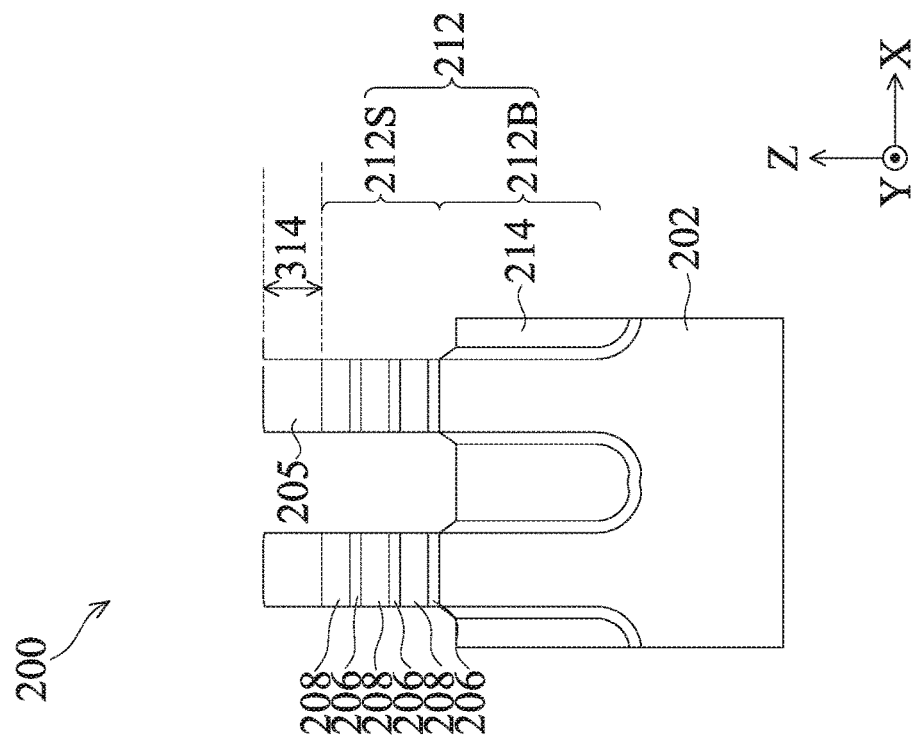
Figure 13B:
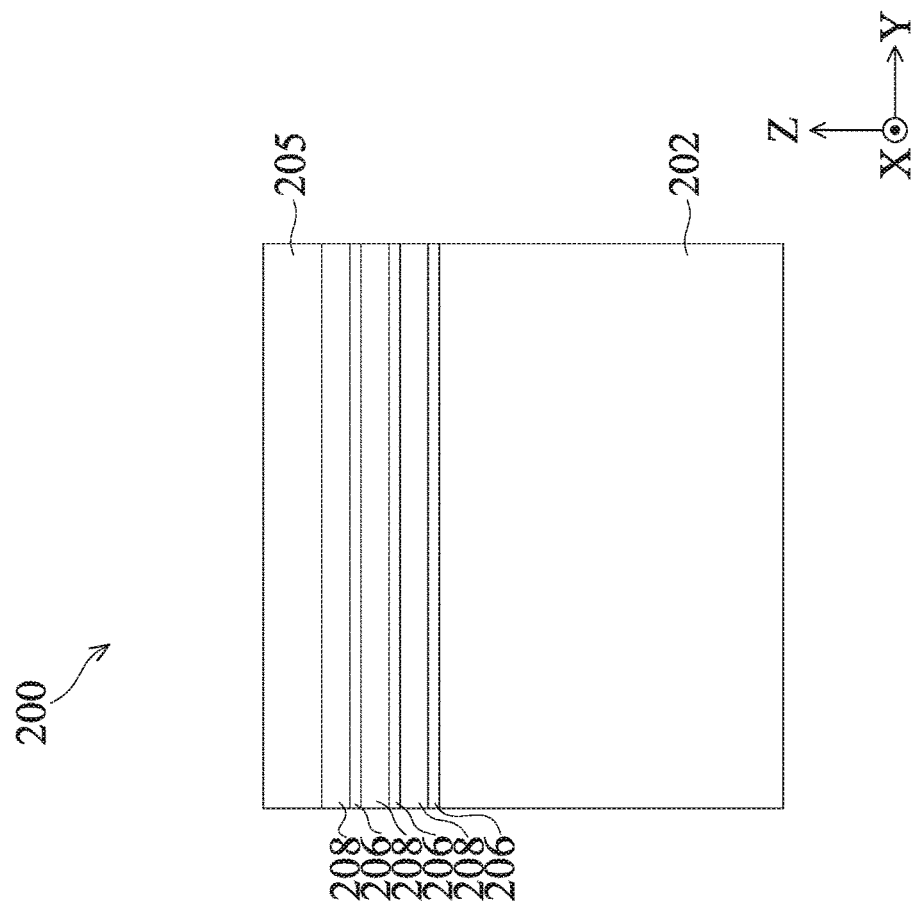

Referring to FIGS. 12A-12C, an oxide layer 225 is deposited over the workpiece 200. In some embodiments, the oxide layer 225 is formed on the top and side surfaces of dielectric layer 222, the top surface of the cladding layer 216, and the top surfaces of the topmost channel layer 208. In some embodiments, a composition of the oxide layer 225 may include silicon oxide, metal oxide, silicon oxynitride, silicon nitride. In some embodiments, the oxide layer 225 may be deposited using a CVD process, an SACVD process, an FCVD process, an ALD process, a PVD process, spin-on coating, and/or other suitable process. In some embodiments, the oxide layer 225 may be a conformal layer. Alternatively, the oxide layer 225 may instead have different thicknesses in different areas. For example, as illustrated in FIG. 12C, the oxide layer 225 may have a smaller thickness in areas over the cladding layer 216 than over the channel layers 208. After oxide layer 225 is formed, the method 100A (or method portion 100-1A) further proceeds to the method portion 100-2, which is illustrated in FIGS. 1C and 22A-29A, 22B-29B, and 22C-29C, and will be described in detail later.

The disclosure above describes method portion 100-1A of the method 100A that forms the structure of FIGS. 12A-12C. Alternatively, FIGS. 1B and 13A-21A, 13B-21B, and 13C-21C illustrate method portion 100-1B of the method 100B that provides a structure similar to that illustrated in FIGS. 12A-12C.

Referring to FIGS. 1B and 13A-13C, method 100B includes blocks 102B, where a workpiece 200 is received and patterned into fin-shaped structures 212. The workpiece 200 generally resembles the workpiece 200 described above with respect to FIGS. 2A-2C. For example, the fin-shaped structures 212 each includes a stack of channel layers 208 interleaved with sacrificial layers 206; and the fin-shaped structures 212 are separated from one another by a dielectric layer 214. The workpiece 200 of FIGS. 13A-13C differs from that described above with respect to FIGS. 2A-2C in that each fin-shaped structure 212 further includes a sacrificial layer 205 formed over the topmost channel layer 208 of the fin-shaped structure 212. In some embodiments, the additional sacrificial layer 205 includes silicon germanium (SiGe). Moreover, in some embodiments, the additional sacrificial layer 205 has the thickness 314. In some embodiments, the thickness 314 may be about 20 nm to about 40 nm. As described later, the thickness 314 determines the thickness of a subsequently formed dielectric layer. If the thickness 314 is too small, such as smaller than 20 nm, the subsequently formed dielectric layer may be too short to fulfill its designed functions; if the thickness 314 too large, such as greater than 40 nm, the additional cost associated therewith may not justify its benefit. In some embodiments, a dielectric layer 209 is formed over the sacrificial layer 205, and a dielectric layer 207 is formed above the first layer 209. Moreover, in some embodiments, a silicon oxide liner is conformally deposited over the fin-shaped structures 212 using ALD or CVD. In some implementations, the silicon oxide liner 2100 is epitaxially grown from the surfaces of the fin-shaped structures 212. In some embodiments, the dielectric layers 209 and 207 may be removed in a CMP operation to planarize the top surface of the workpiece 200 until the top surface of the sacrificial layer 205 is exposed. Alternatively, a combination of CMP and a wet etching process (such as using phosphoric acid as the etchant) may instead be used. Subsequently, the dielectric layer 214 is recessed such that a top surface of the recessed dielectric layer 214 extends below the bottom surface of the lowest channel layer 208. As a result, the stack portions 212S of the fin-shaped structures 212 rise above the isolation feature 214 while the base portions 212B are surrounded by the isolation feature 214. The recessing may be by a dry etching process, a wet etching process, and/or a combination thereof.

Figure 14A:
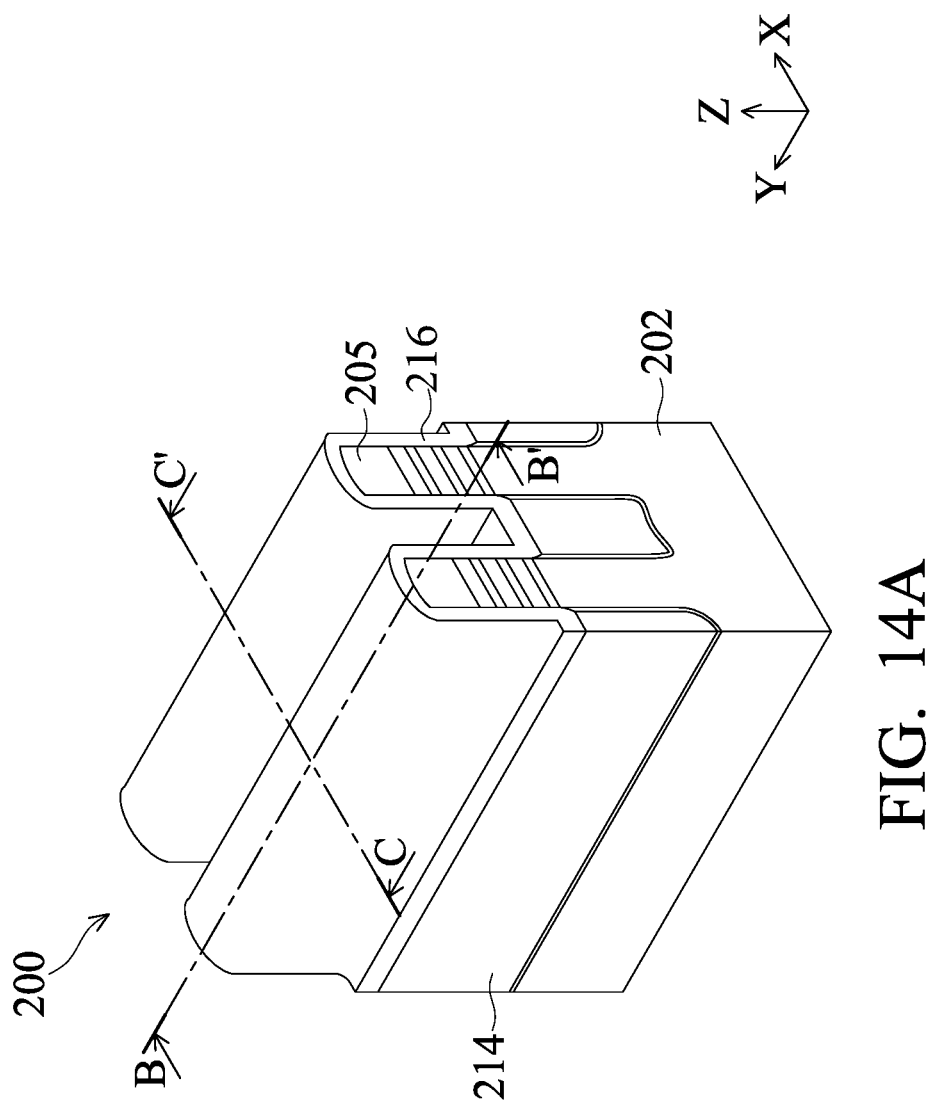
Figure 14C:
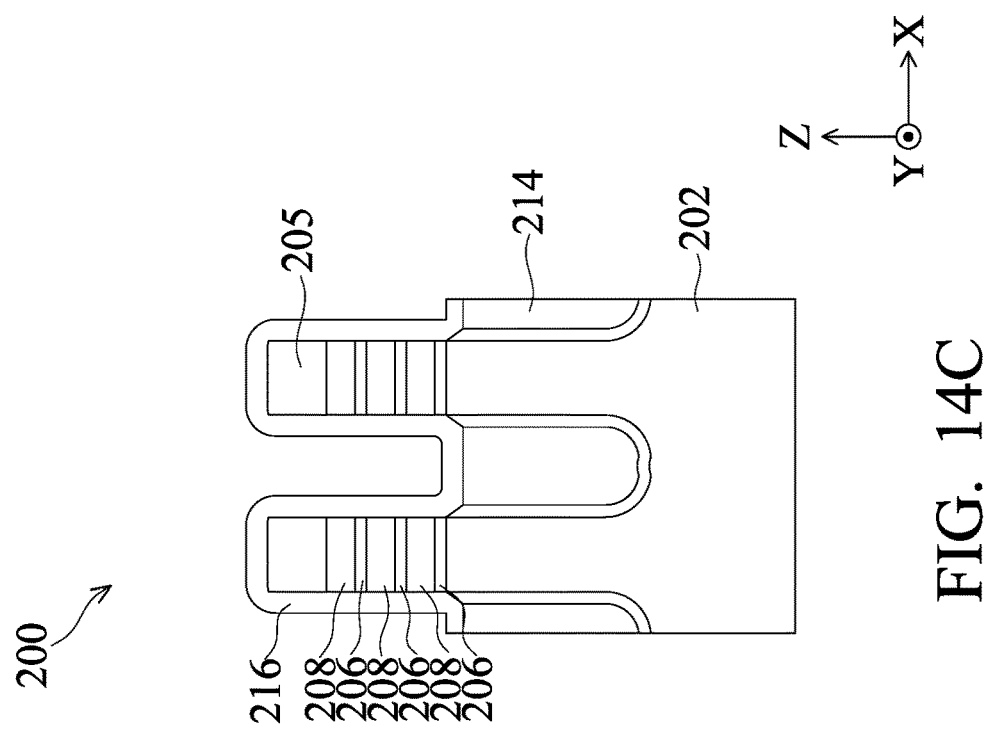
Figure 14B:
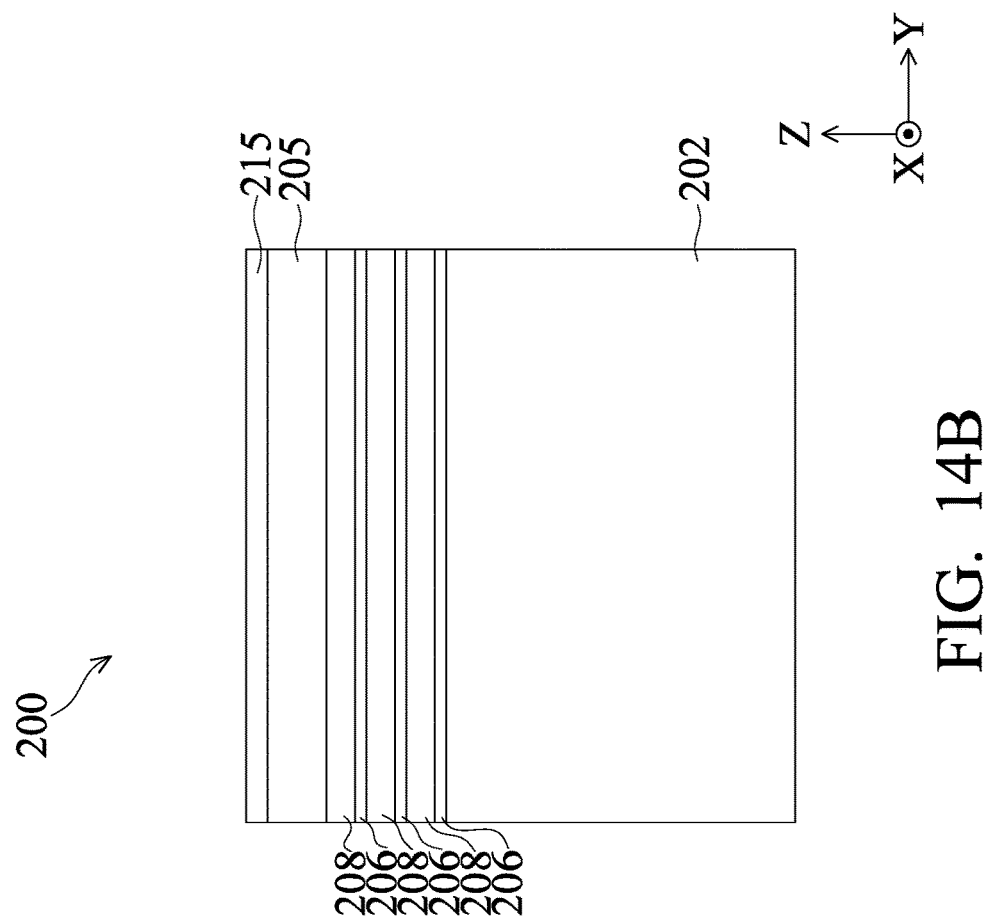
Figure 15A:
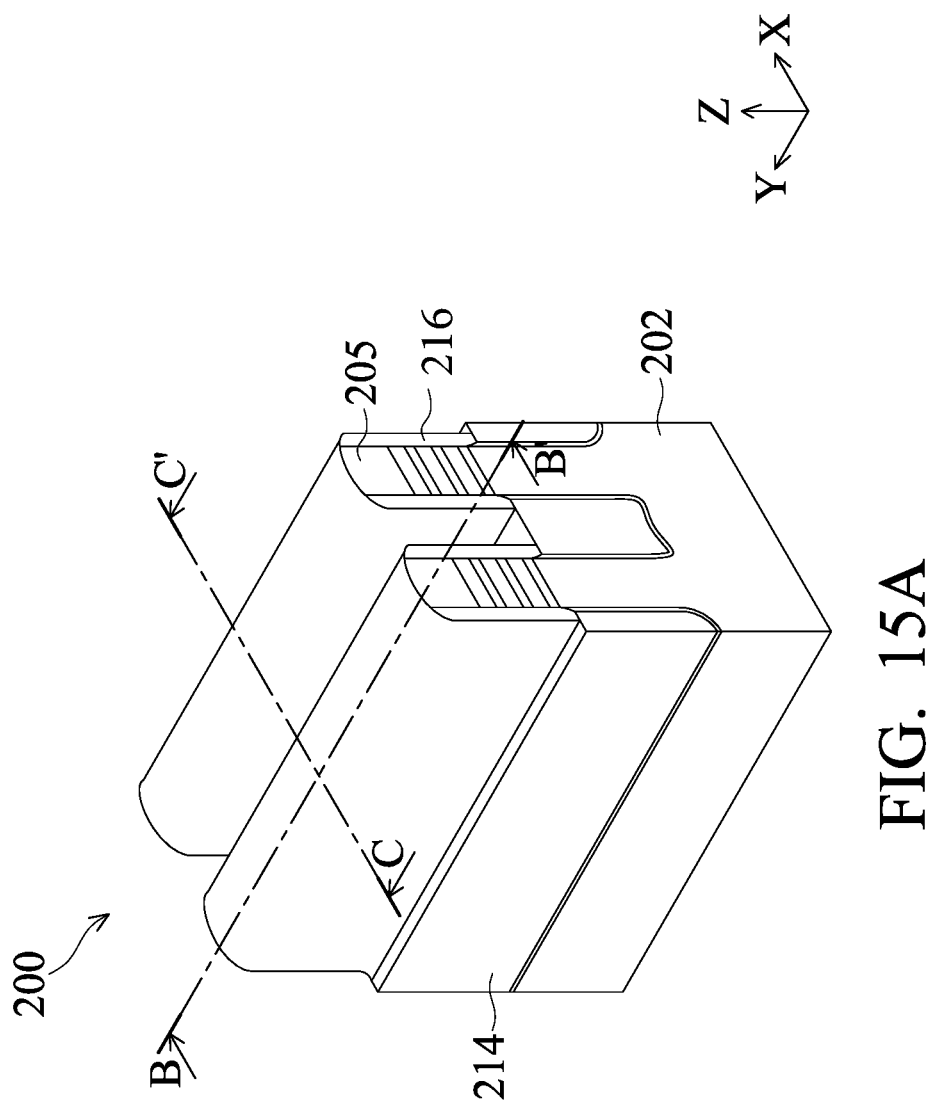
Figure 15C:
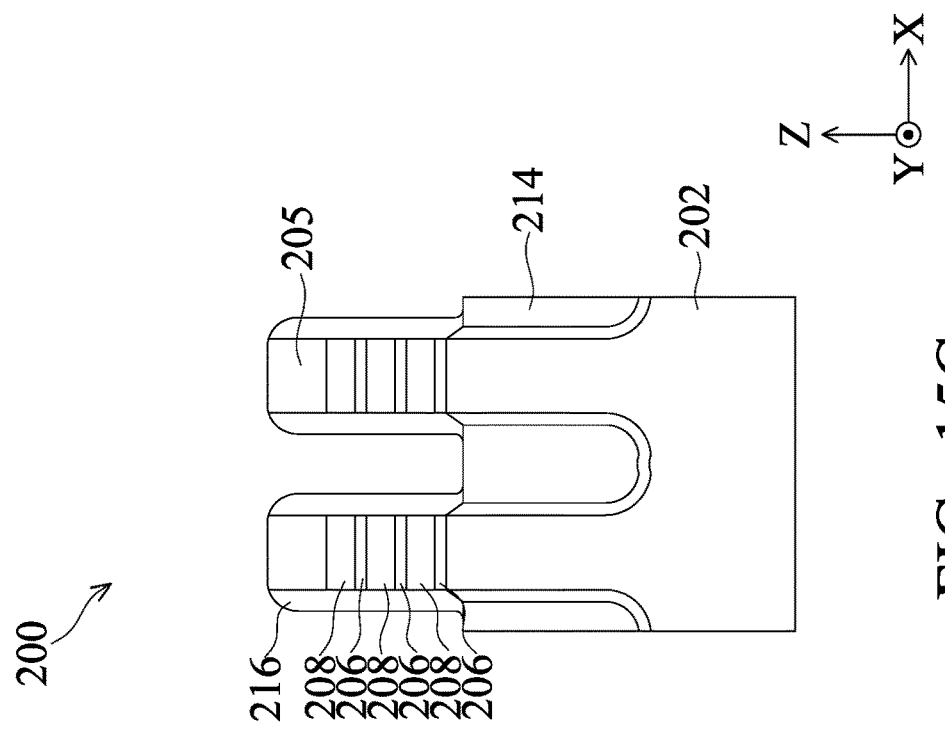
Figure 15B:
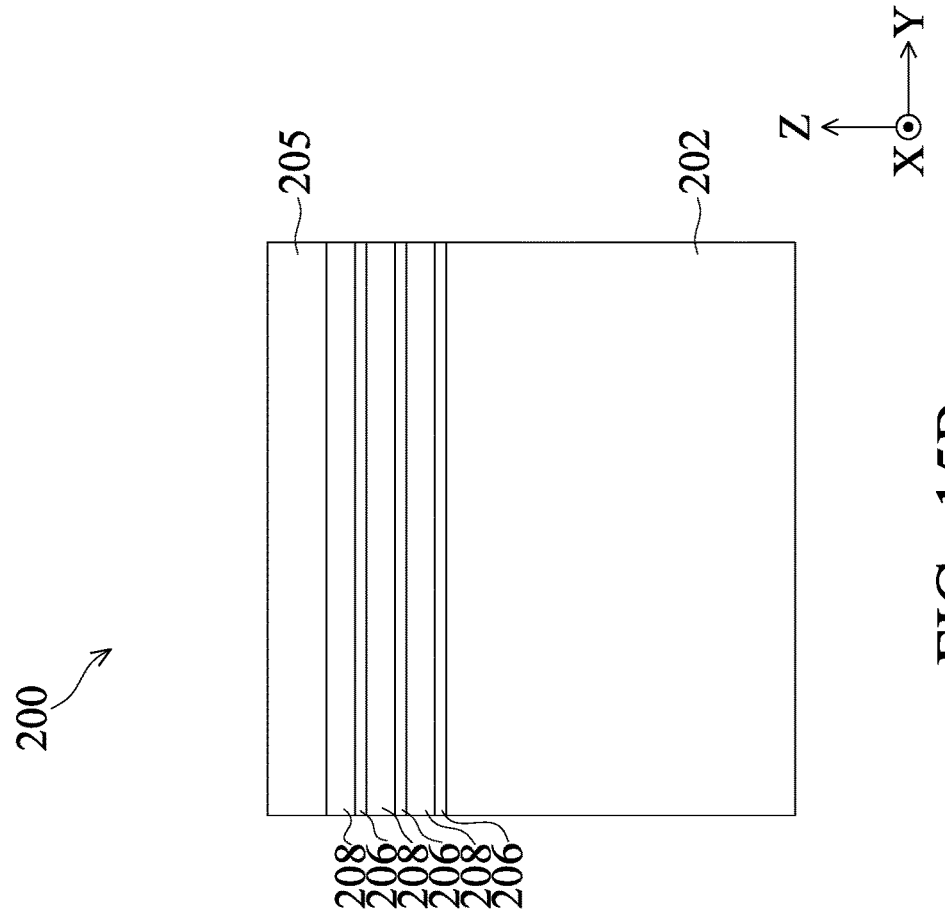

Referring to FIGS. 14A-14C, a cladding layer 216 is formed on the additional sacrificial layer 205, such as directly interfacing with the additional sacrificial layer 205. In some embodiments, the cladding layer 216 may be formed of silicon germanium (SiGe). In some embodiments, the cladding layer 216 may have a material that is different from the additional sacrificial layer 205. For example, the cladding layer 216 may include amorphous SiGe, while the additional sacrificial layer 205 may include crystalized SiGe. In some embodiments, the cladding layer 216 may be conformally and epitaxially grown using vapor phase epitaxy (VPE) or molecular bean epitaxy (MBE). In some alternative embodiments, the cladding layer 216 may be deposited using chemical vapor deposition (CVD), atomic layer deposition (ALD), or other suitable deposition method. The cladding layer 216 may be disposed on sidewalls of the fin-shaped structures 212, the top surface of the isolation feature 214 and the additional sacrificial layer 205.

As described above, the cladding layer 216 includes a material composition different from that of the additional sacrificial layer 205. Accordingly, there may be an etching selectivity between the cladding layer 216 and the additional sacrificial layer 205. Therefore, referring to FIGS. 15A-15C, a dry etching operation may be configured to remove the cladding layer 216 on top of the additional sacrificial layer 205 without substantially affecting the additional sacrificial layer 205. As a result, the top surface of the additional sacrificial layer 205 is exposed. Additionally, the cladding layer 216 on the top surfaces of the isolation feature 214 may also be etched such that the top surface of the isolation feature 214 is also exposed.

Figure 16A:
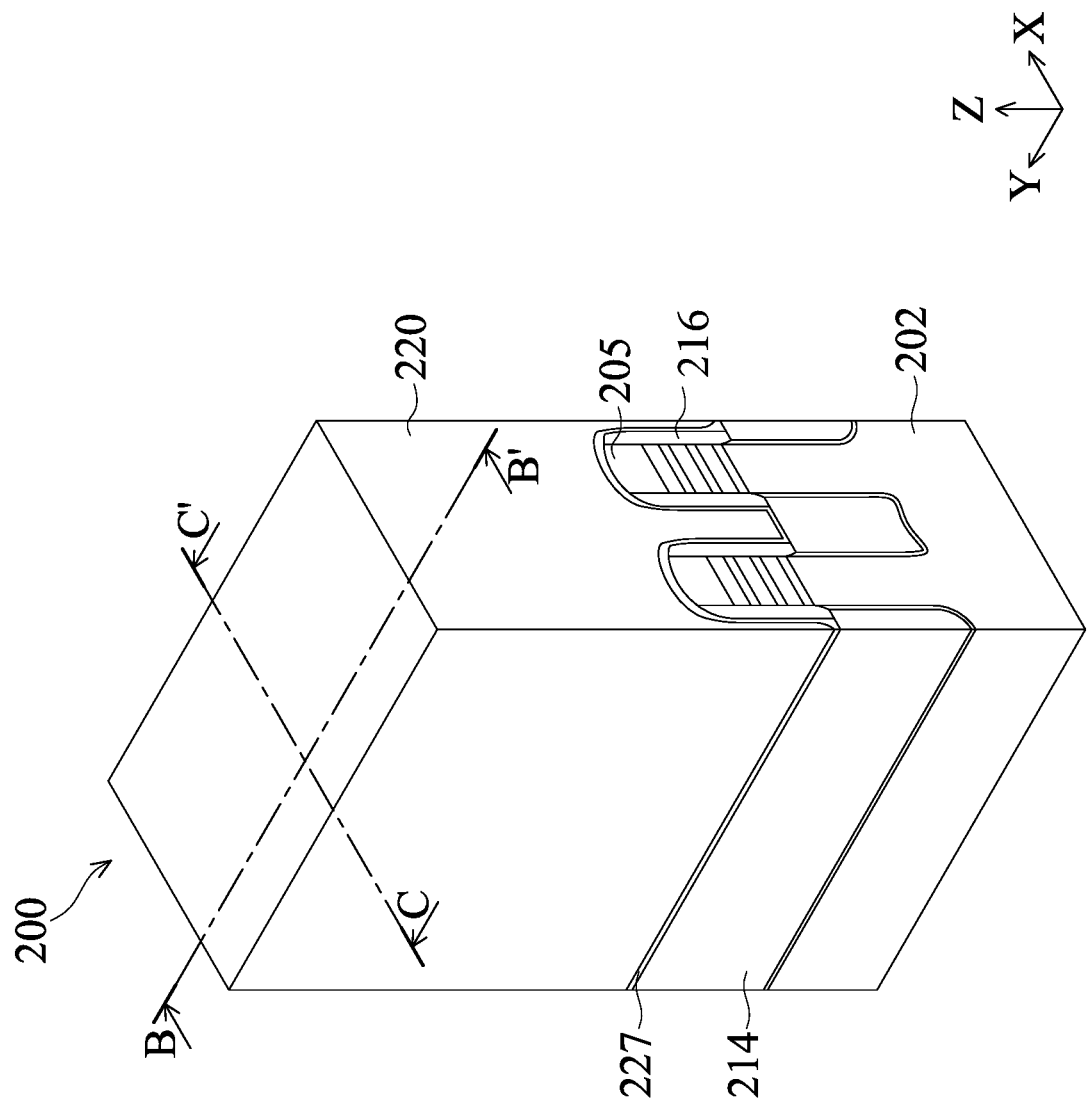
Figure 16C:
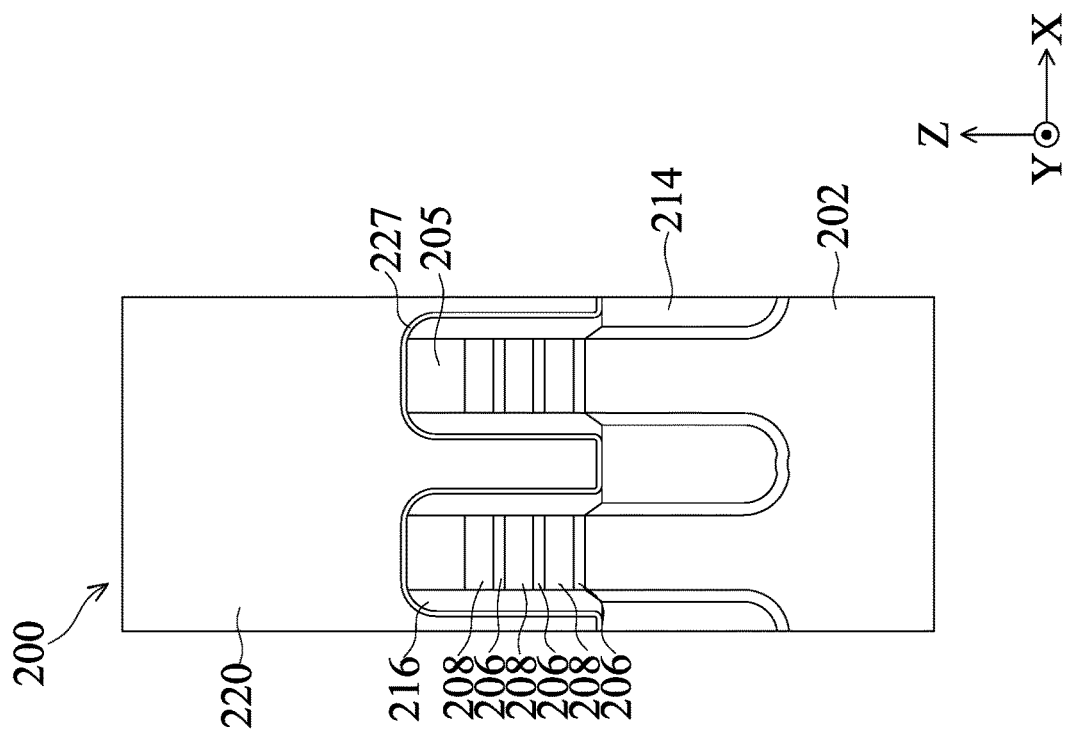
Figure 16B:
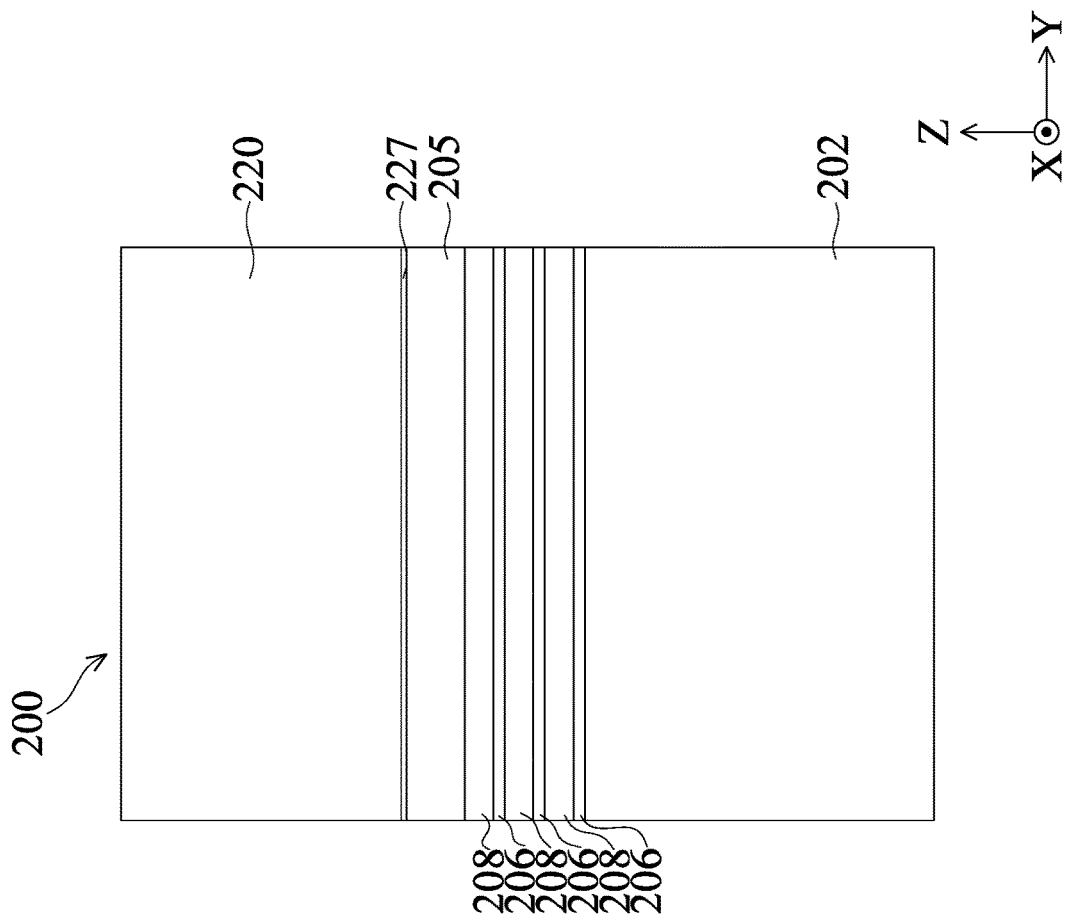

Referring to FIGS. 16A-16C and block 110B in FIG. 1B, a layer 227 is formed over the cladding layer 216, the top surface of the additional sacrificial layer 205, and the top surface of the isolation feature 214. In some embodiments, the layer 227 is formed on silicon carbonitride or similar materials. In some embodiments, the layer 227 functions as the etch-stop layer during a subsequent etching process. Referring to FIGS. 1B and 16A-16C, method 100B further includes a block 112B where a filler layer 220 is deposited over the workpiece 200. The filler layer 220 may be similar to the filler layer 220 described above with respect to the FIGS. 5A-5C. For example, the filler layer 220 may be deposited using an FCVD process to a thickness about 2,000 nm to about 4,500 nm, as measured from the top surface of the additional sacrificial layer 205.

Figure 17A:
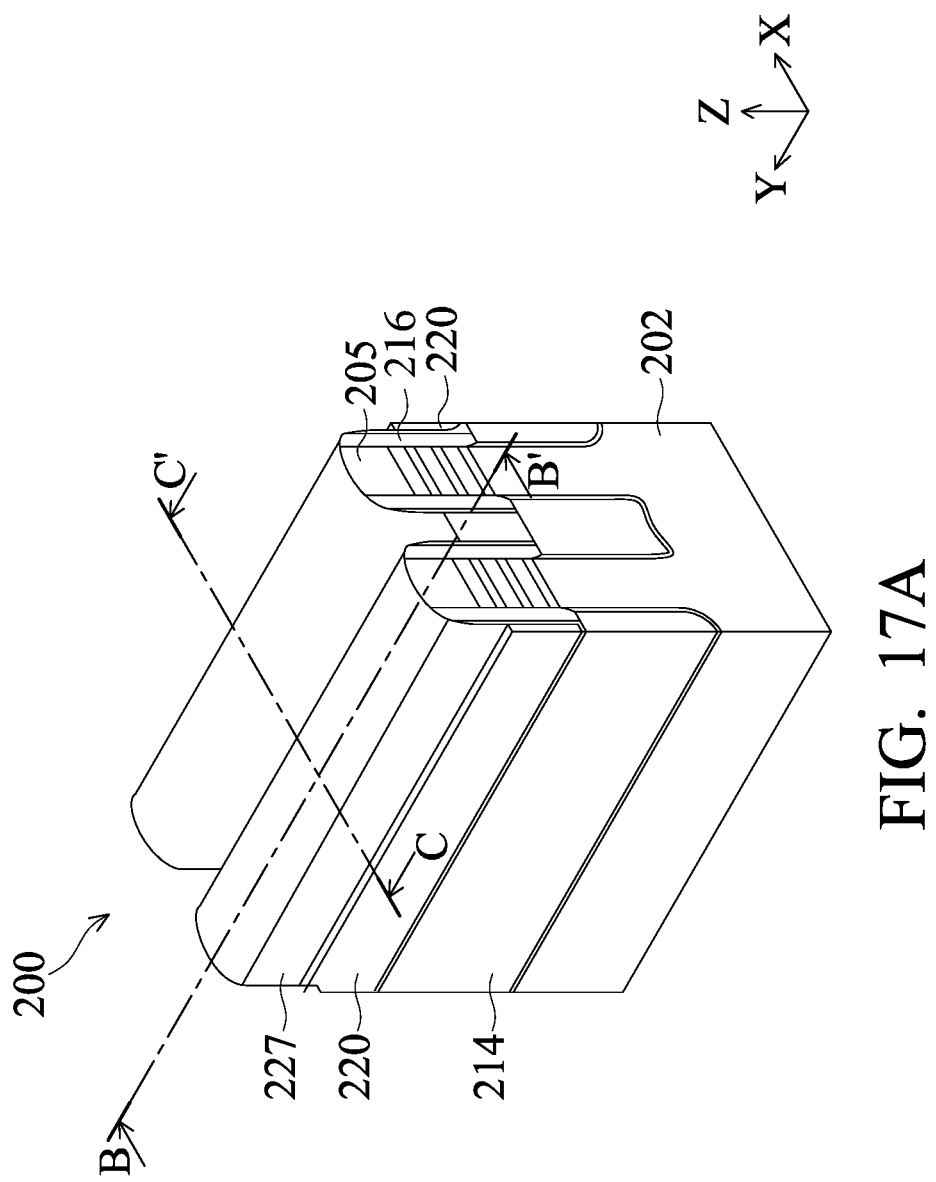
Figure 17C:
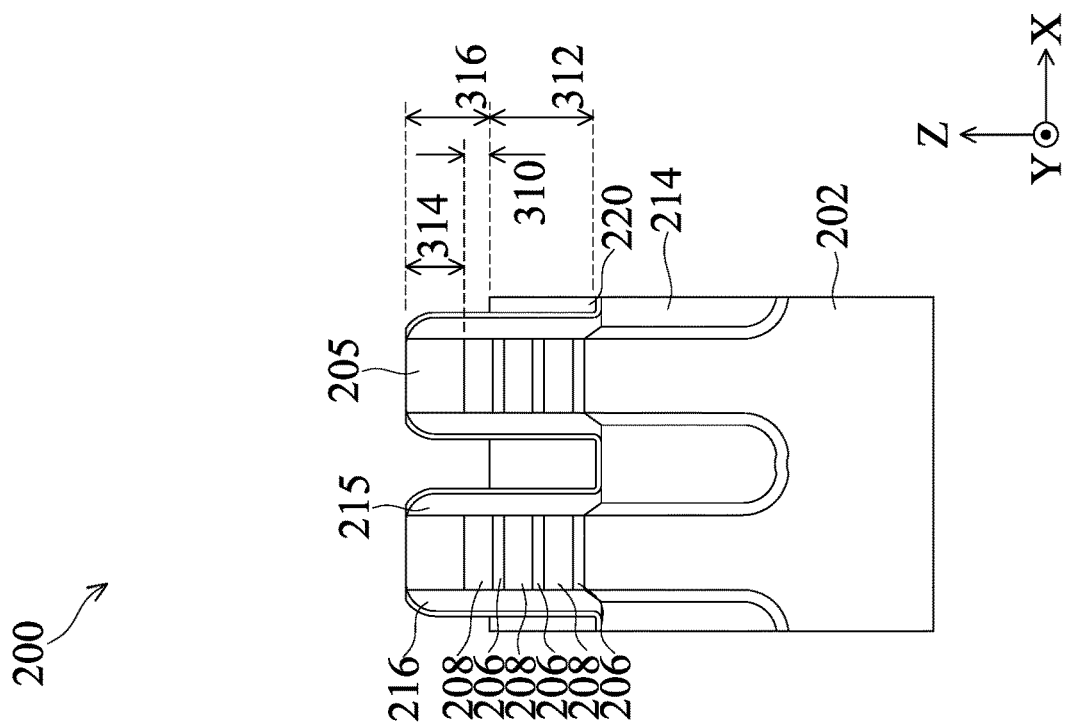
Figure 17B:
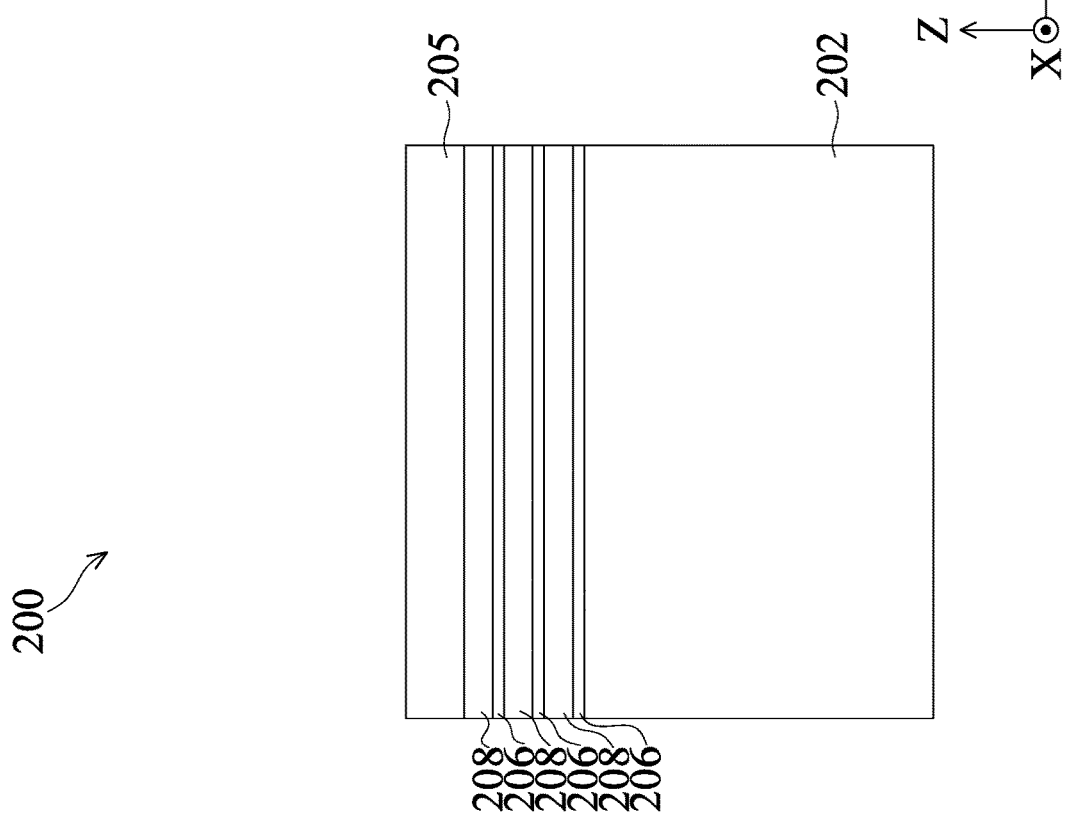
Figure 18A:
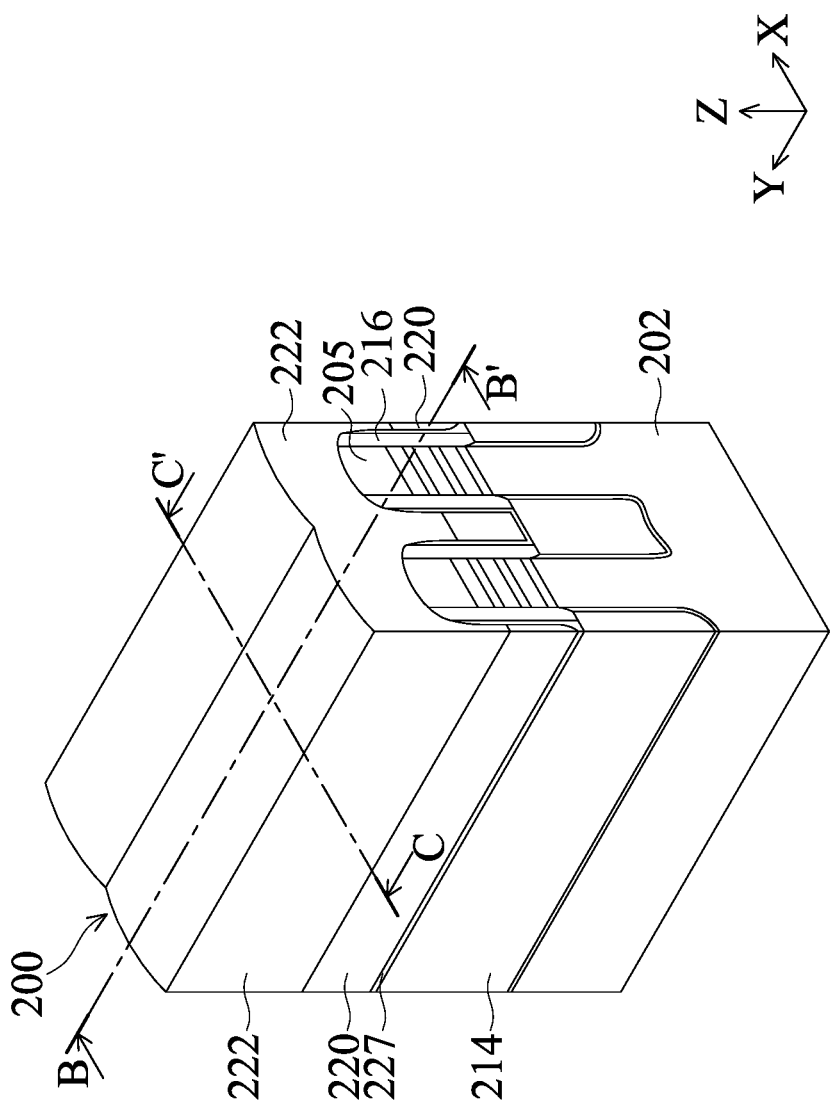
Figure 18C:
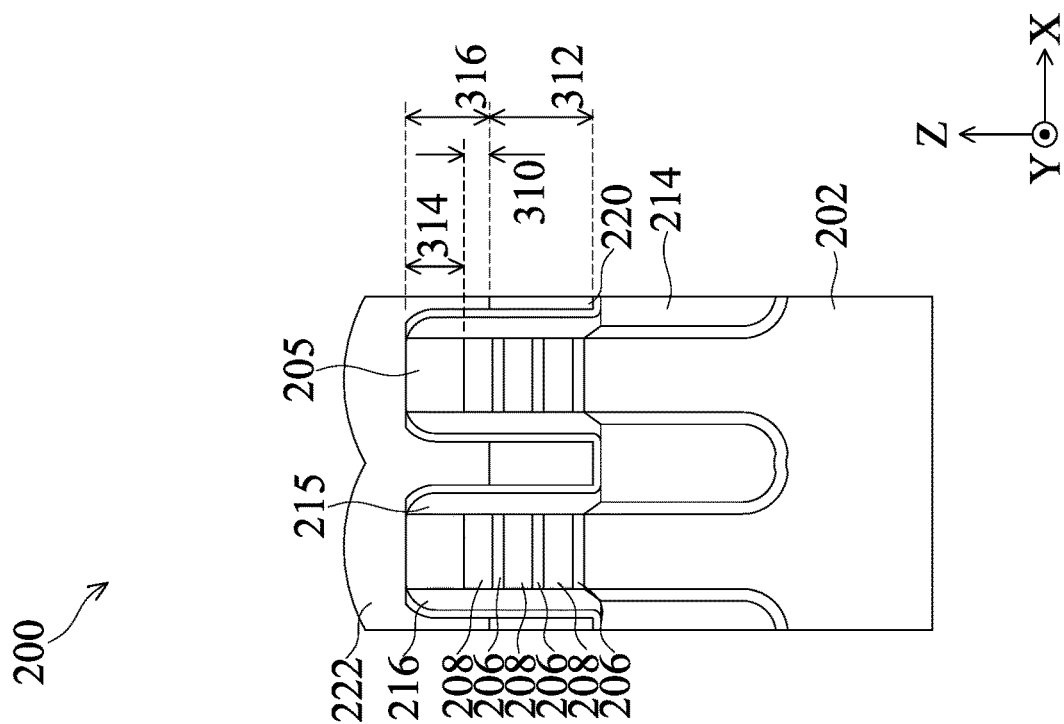
Figure 18B:
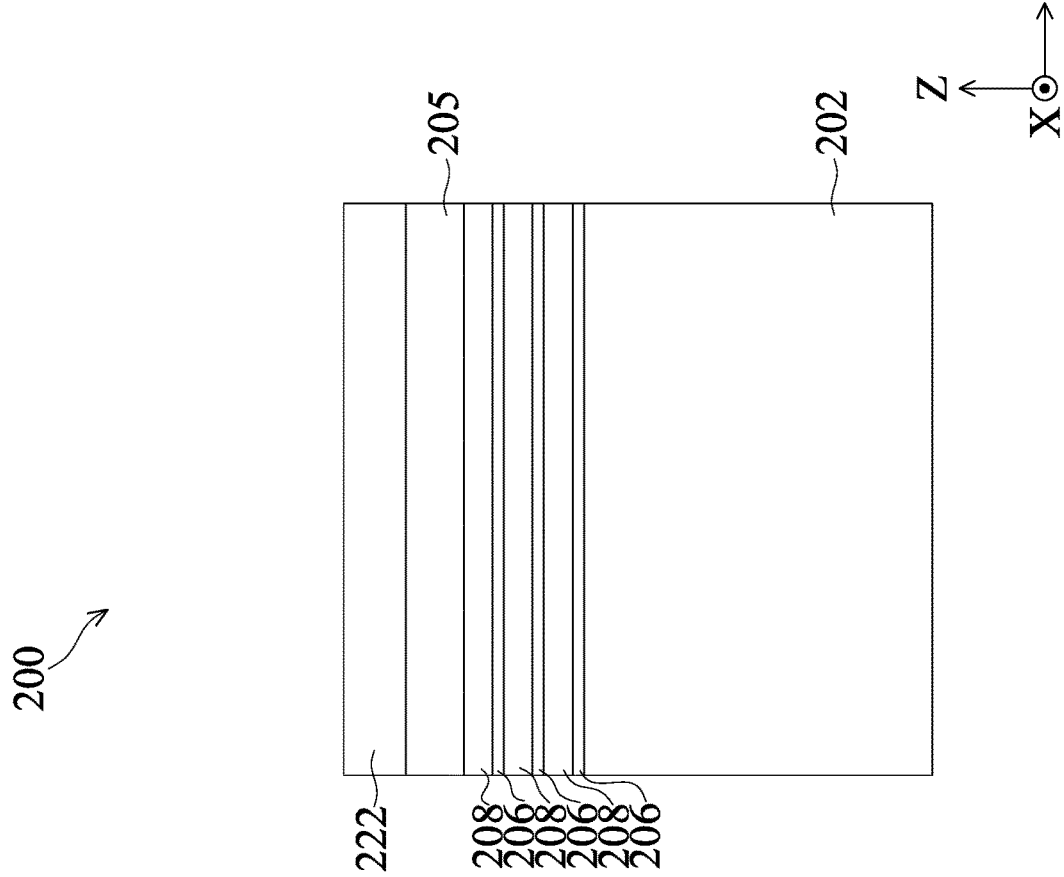
Figure 19A:
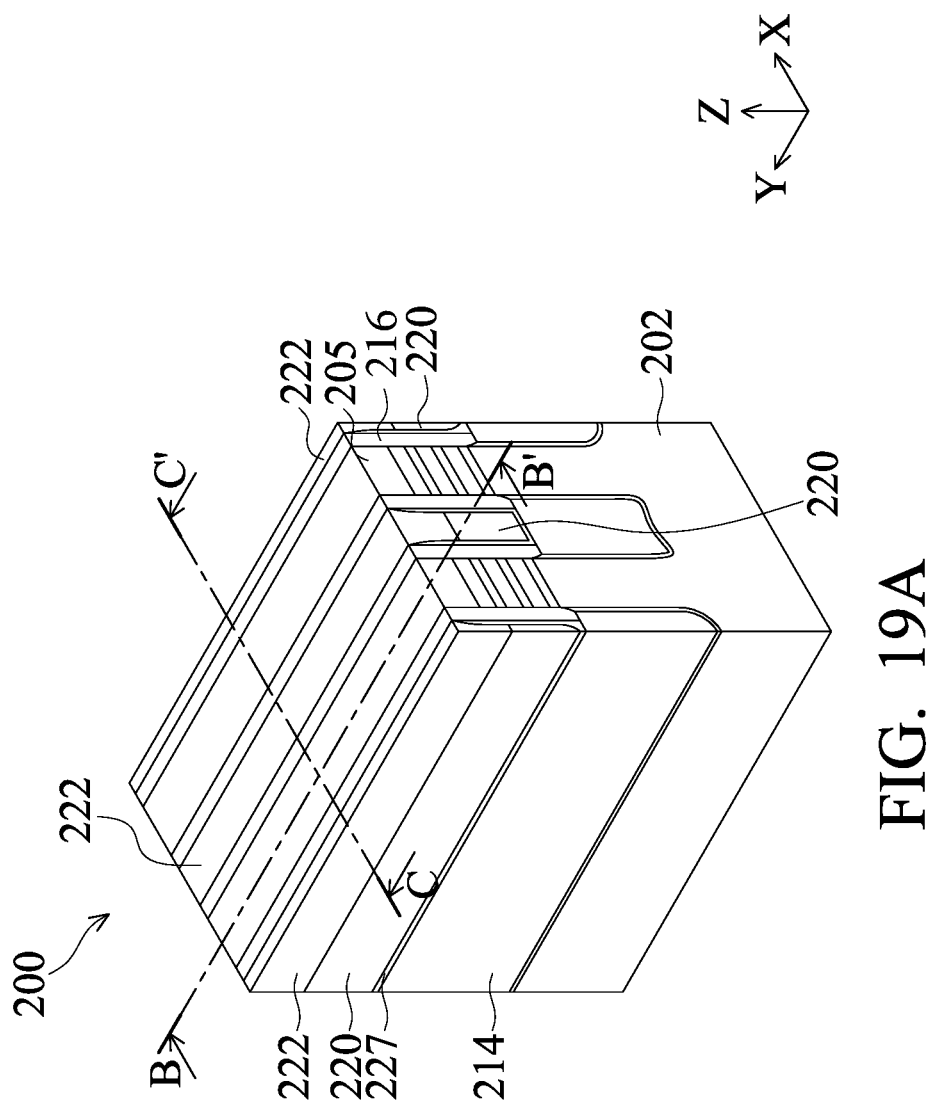
Figure 19C:
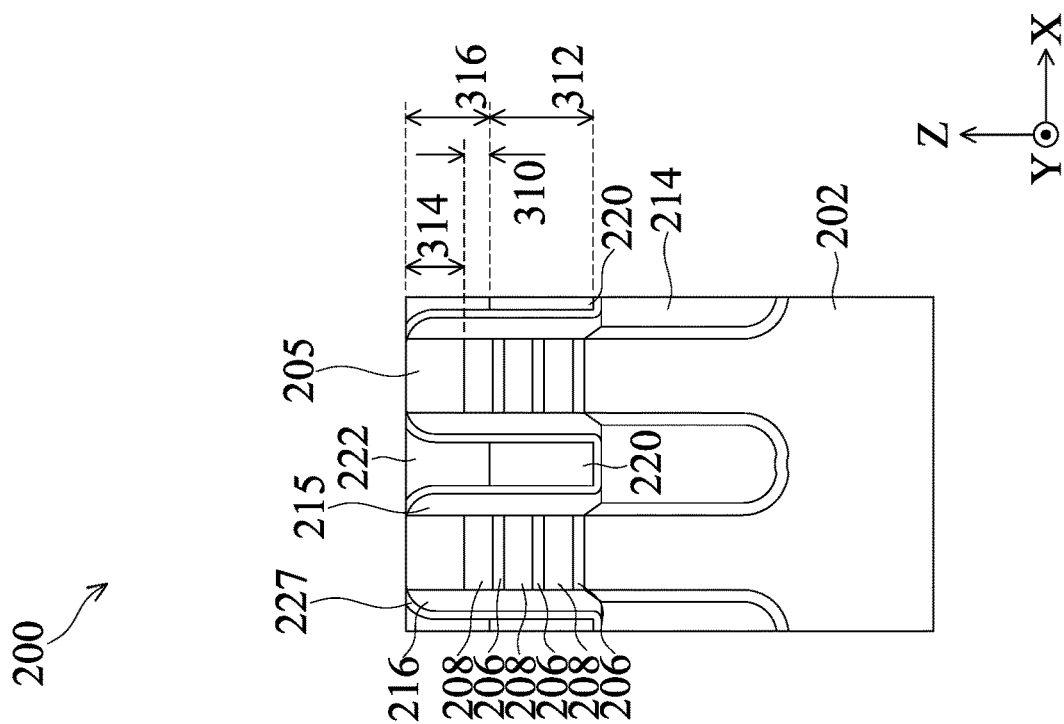
Figure 19B:
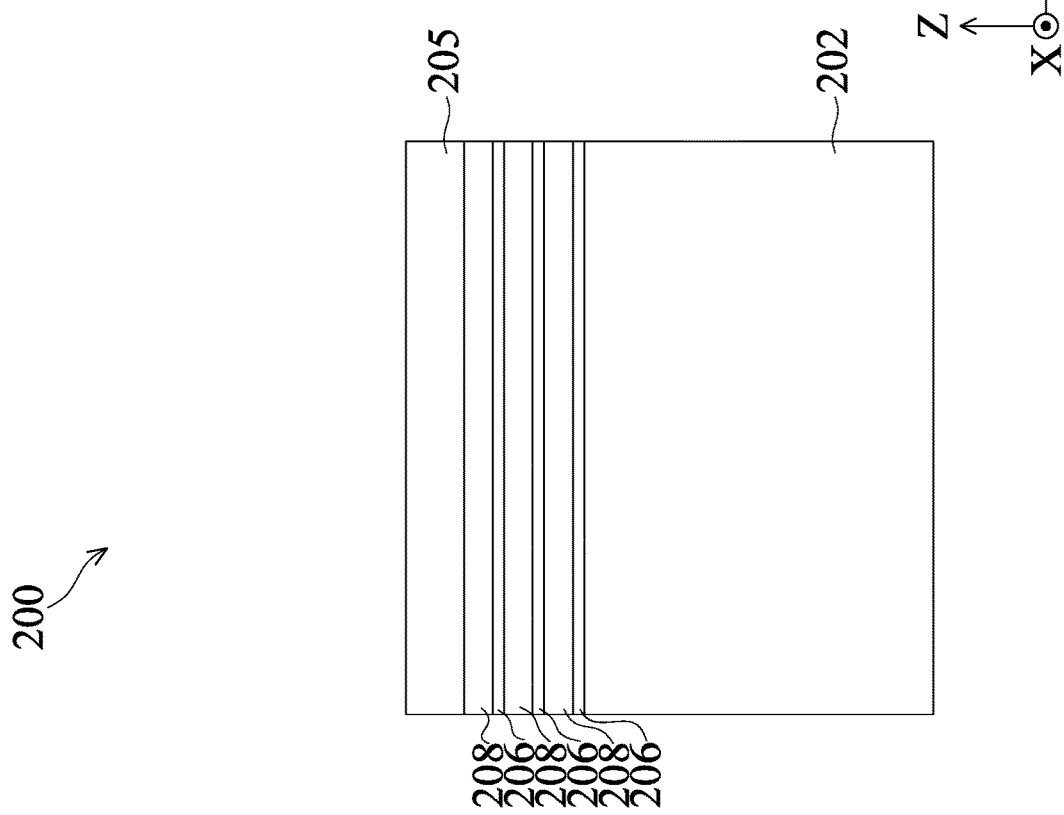

Referring to FIGS. 17A-17C and block 114B in FIG. 1B, the filler layer 220 is recessed to form a trench between the adjacent fin-shaped structures 212. In some embodiments, the layer 227 on the top surface of the additional sacrificial layer 205 is also recessed. Similar to that described above with FIGS. 7A-7C, the top surface of the filler layer 220 in the trench is below the top surface of the topmost channel layer 208 by a distance 310. In some embodiments, the distance 310 is about 4 nm to about 45 nm. In some embodiments, the distance 310 is about 10 nm to about 20 nm. Moreover, the recessed filler layer 220 has a height 312. In some embodiments, the height 312 is about 10 nm to about 50 nm. Furthermore, a distance between the top surface of the additional sacrificial layer 205 and the top surface of the recessed filler layer 220 is distance 316. The distance 316 equals the sum of the distance 310 and the distance 314. Referring to FIGS. 18A-18C and block 116B of FIG. 1B, a dielectric layer 222 is formed over the recessed filler layer 220. The dielectric layer 222 may be similar to the dielectric layer 222 described above with respect to FIGS. 8A-8C. For example, the dielectric layer 222 may be formed of a high-k hard mask material.

Referring to FIGS. 17A-17C and block 118B of FIG. 1B, a CMP process removes a top portion of the dielectric layer 222, a top portion of the layer 227, a top portion of the cladding layer 216, and planarizes the top surface of the workpiece 200. As a result, the additional sacrificial layer 205 is exposed on the top surface. The top surface of the additional sacrificial layer 205 is higher than the top surface of the topmost channel layer 208 by a distance that is substantially the same as the thickness 314. As described above, the distance 314 (or thickness 314) is about 20 nm to about 40 nm. The top surface of the additional sacrificial layer 205 extends above the top surface of the recessed filler layer 220 by a distance 316. As described later, the distance 316 corresponds to the height or thickness of the dielectric layer 222. Accordingly, the distance 316 is also interchangeably referred to as the thickness 316 and/or the height 316. In some embodiments, the distance 316 is about 5 nm to about 50 nm.

Figure 20A:
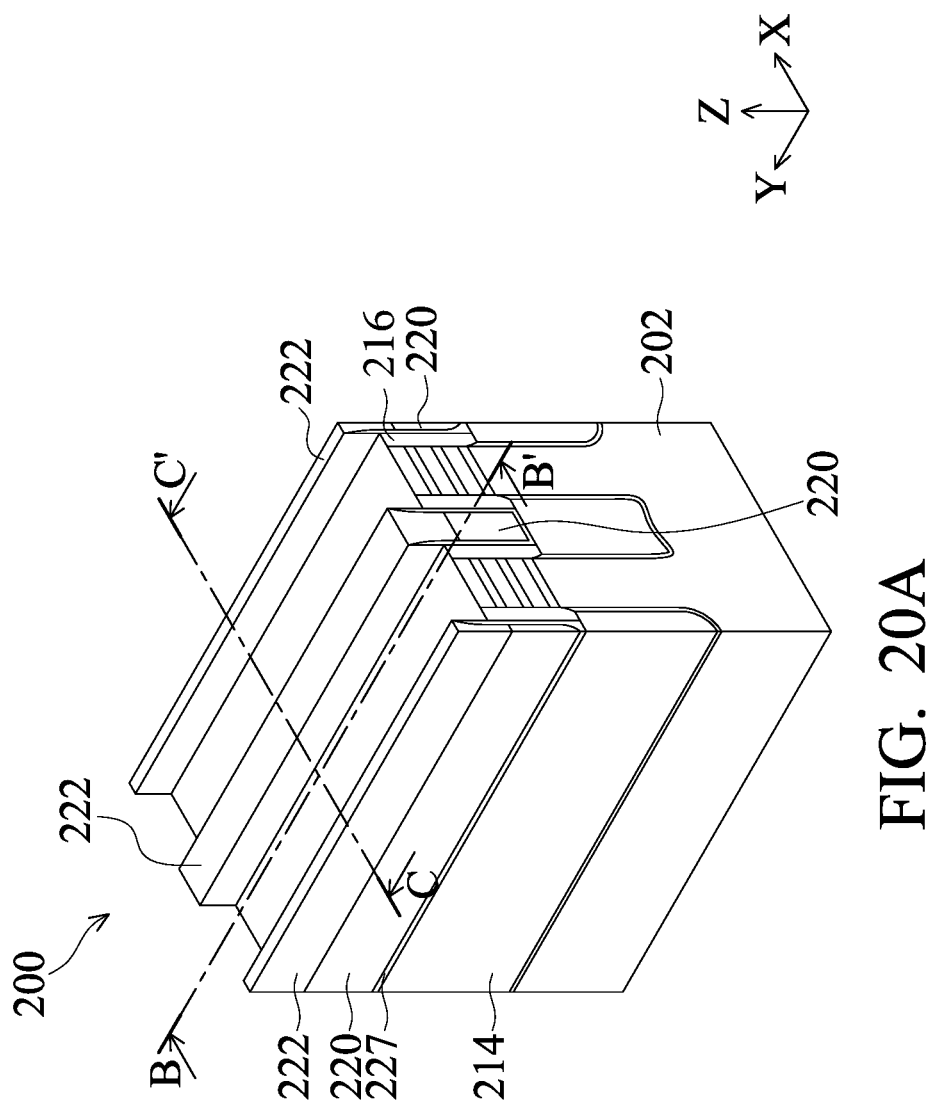
Figure 20C:
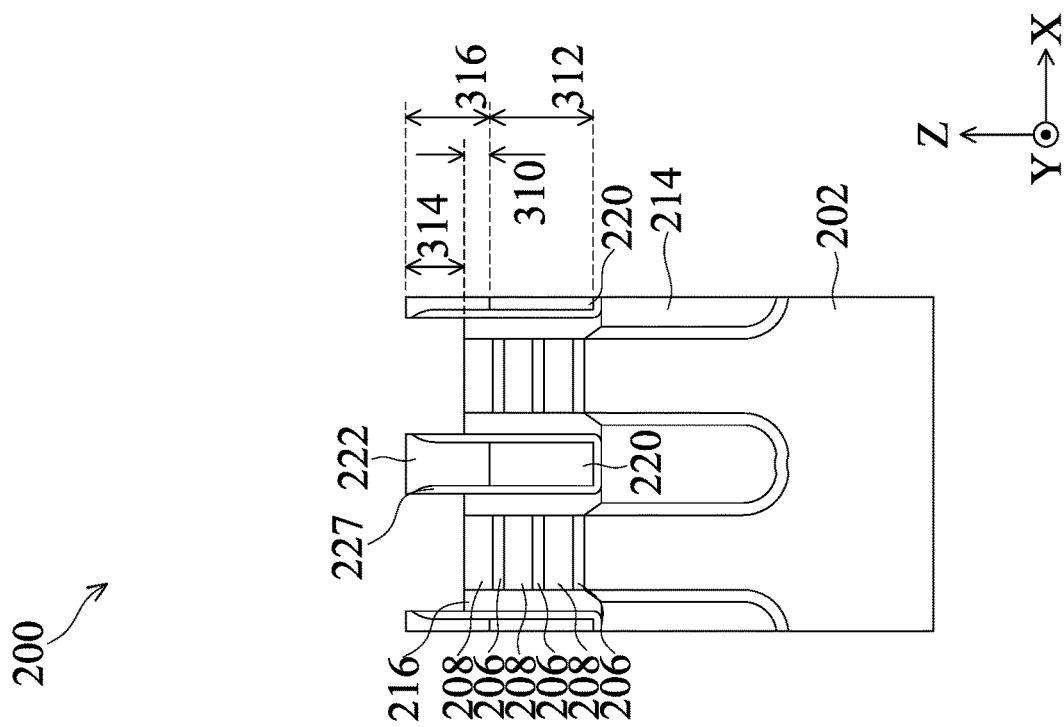
Figure 20B:
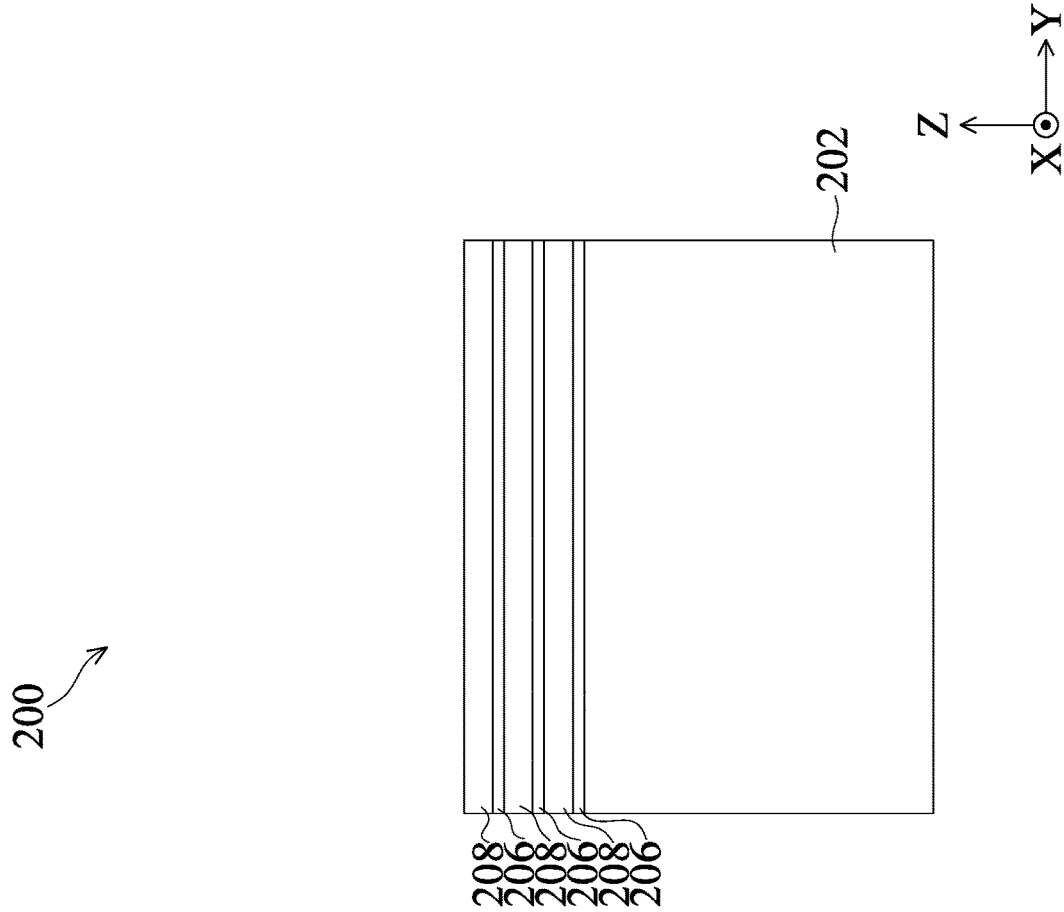
Figure 21A:
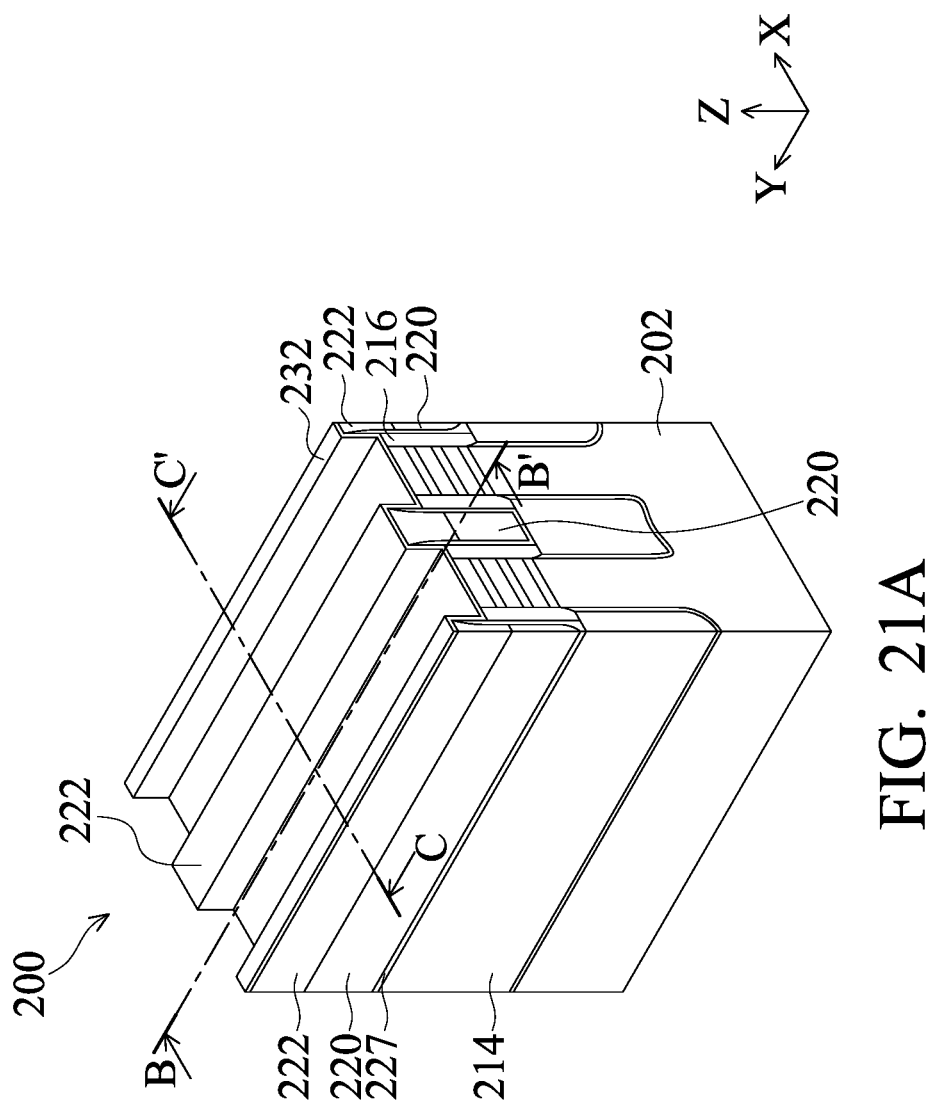
Figure 21C:
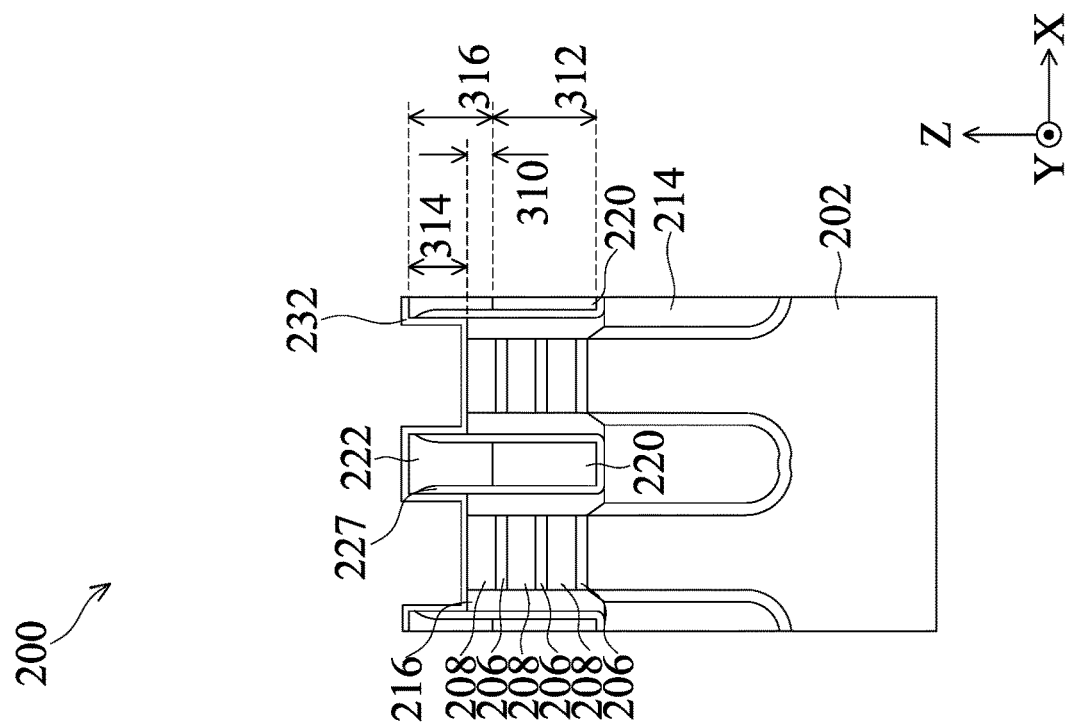
Figure 21B:
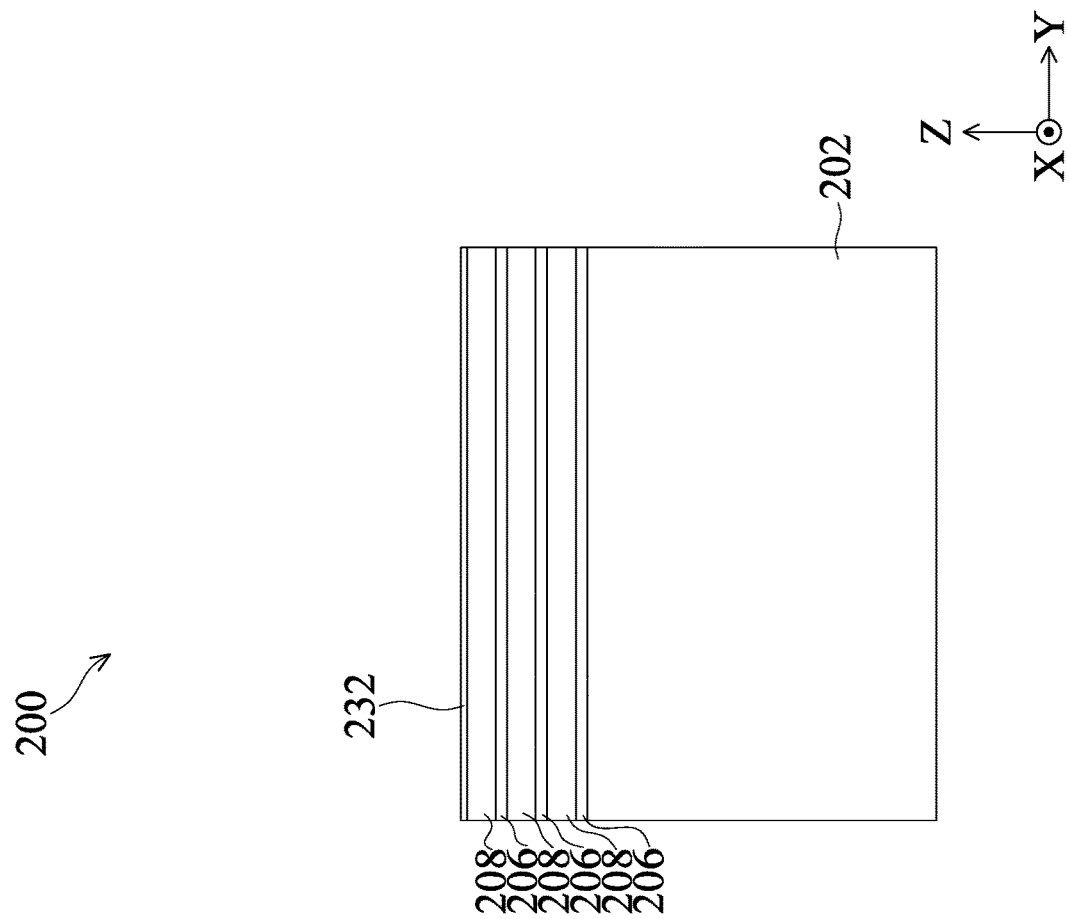

Referring to FIGS. 20A-20C and block 120B of FIG. 1B, the cladding layer 216 and the additional sacrificial layer 205 are removed to form trenches between the adjacent dielectric layers 222 (such as between portions of the layer 227) and above the top surfaces of the topmost channel layer 208. As described above, the additional sacrificial layer 205 includes SiGe, while the topmost channel layer 208 directly beneath the additional sacrificial layer 206 includes silicon. Accordingly, an etching selectivity may be achieved to remove the additional sacrificial layer 205, along with the portions of the cladding layer 216 adjacent to it, without further recessing the channel layer 208. Moreover, in some embodiments, the etching operation is configured to terminate when the top surface of the channel layer is exposed, such that the portion of the cladding layer 216 on sidewall surfaces of the channel layer 208 is also substantially preserved. Therefore, the top surface of the topmost channel layer 208 and the top surface of the cladding layer 216 are substantially coplanar. Furthermore, the top surface of the topmost channel layer 208 is now exposed in the trenches. As illustrated in FIG. 20C, the dielectric layer 222 has a bottom surface that extends below the top surface of the topmost channel layer 208, and has a top surface that extends above the top surface of the topmost channel layer 208. Referring to FIGS. 21A-21C and block 122B of FIG. 1B, a dummy oxide layer 232 is then deposited on top surface of the workpiece 200, such as on top surface of the exposed channel layer 208, the remaining portions of the cladding layer 216, the side surface of the layer 227, and the top surface of the dielectric layer 222. In some embodiments, the dummy oxide layer 232 may be a conformal layer.

At this stage, the structure having a recessed filler layer 220 and a dielectric layer 222 is formed, similar to the structure described above with respect to FIGS. 12A-12C. As described above, the filler layer 220 has a height 312; and the dielectric layer 222 has a height 316. As detailed later, the sum of the height 312 and the height 316 corresponds to the height of the barrier that separates portions of the metal gate that requires electrical isolation from each other (e.g. cut-metal-gate or CMG). Accordingly, the sum of the height 312 and 316 is greater than the height of the metal gate. Meanwhile, the height 312 alone corresponds to the height of the barrier that partially separates portions of the metal gate that does not require electrical isolation. Accordingly, the height 312 alone is less than the height of the metal gate. Moreover, as described above, it may be beneficial to have a height 312 that is less than the height of the stack 204 to reduce restrictions imposed by the barrier on materials flow. In some embodiments, the height 312 may be about 10 nm to about 50 nm; the height 316 may be about 5 nm to about 50 nm. In some embodiments, a ratio of the height 312 to the height 316 may be about 10:1 to about 1:1.

The disclosed embodiments above achieve the distance 310 in the range of about 10 nm to about 20 nm using the helmet recessing process prior to the formation of dummy gate stack 230. Alternatively, in some embodiments, this may be achieved by a later recessing process during the removal process of the dummy gate stack 230. This aspect of the disclosure is described in detail with respect to FIGS. 26A-26C later.

Figure 22A:
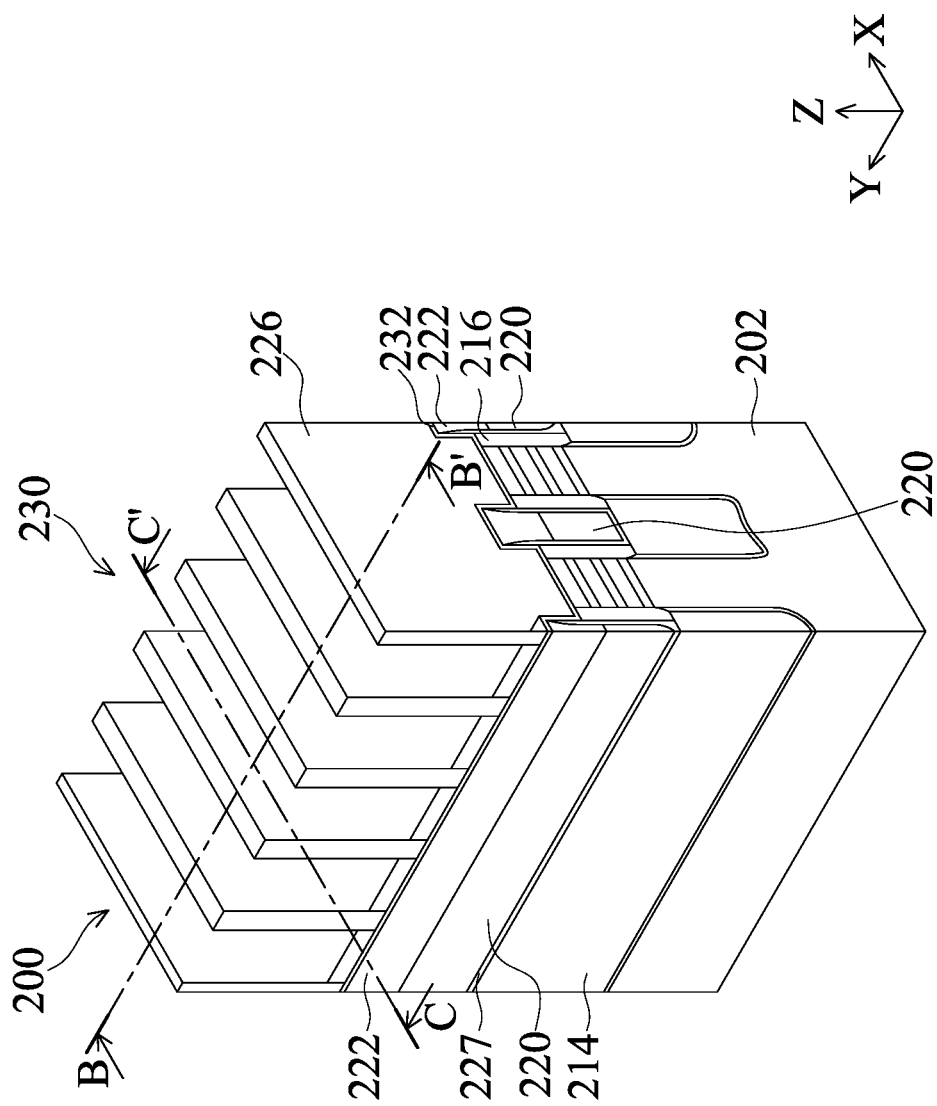
Figure 22C:
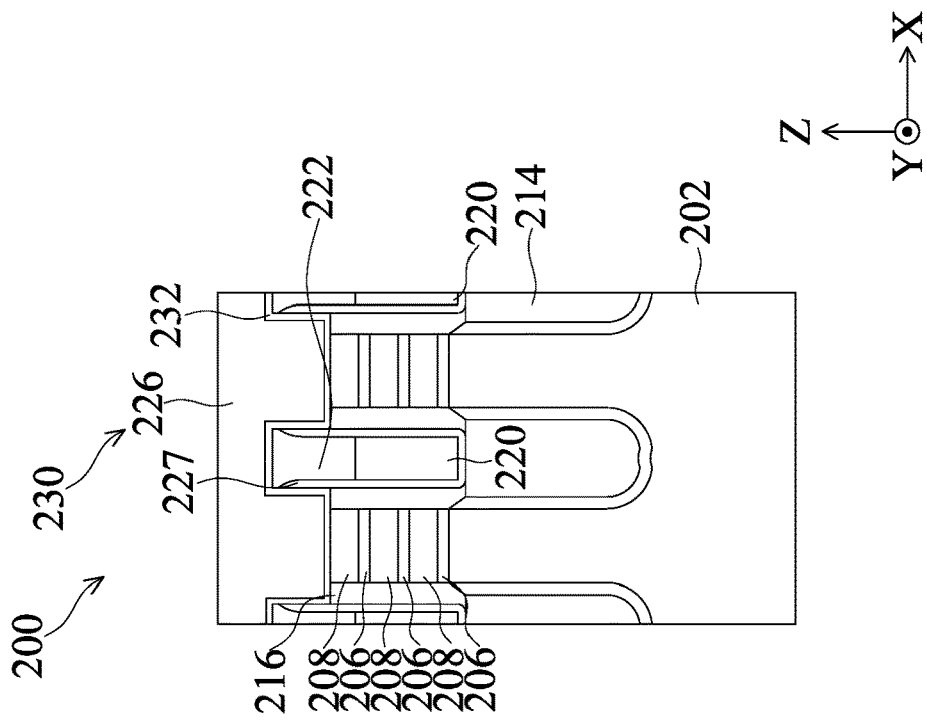
Figure 22B:
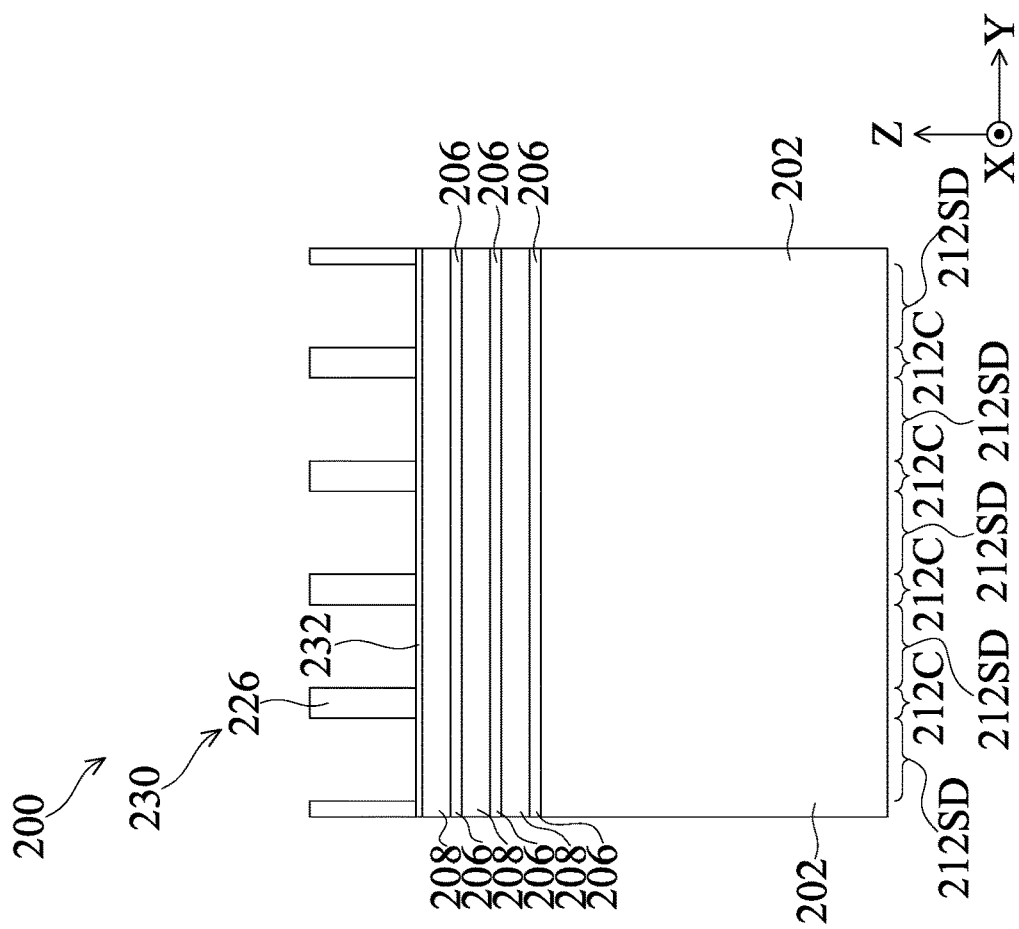

Regardless whether method 100A or 100B is adopted to reach the device structure of FIG. 12A-12C or 21A-21C, the method further proceeds to steps illustrated in FIG. 1C. For example, method 100A proceeds from block 122A of FIG. 1A to block 124 of FIG. 1C; and method 100B proceeds from block 122B of FIG. 1B to block 124 of FIG. 1C. Referring to FIGS. 1C and 22A-22C, the method portion 100-2 (either as part of the method 100A or as part of the method 100B) each further includes a block 124 where dummy gate stacks 230 are formed on the fin-shaped structures 212. In some embodiments, the dummy gate stacks 230 extend orthogonal to the lengthwise direction of the fin-shaped structures 212. For example, in the depicted embodiments, the dummy gate stacks 230 extends along the X-direction. In some embodiments, a gate replacement process (or gate-last process) is later adopted where the dummy gate stacks 230 serve as placeholders for subsequently formed functional gate structures. Other processes and configuration are possible. As shown in FIGS. 22A-22C, each of the dummy gate stacks 230 includes a dummy gate electrode 226. In some embodiments, the dummy gate stacks 230 may further include other layers such as dummy gate dielectric layers, interfacial layers, other suitable layers or combinations thereof. The regions of the fin-shaped structures 212 underlying the dummy gate stacks 230 may be referred to as channel regions 212C. Each of the channel regions 212C in a fin-shaped structure 212 is horizontally sandwiched between two source/drain regions 212SD where source/drain features are subsequently formed. Layers for the dummy gate stacks 230 may be formed by any suitable methods, such as CVD. In some embodiments, a gate top hard mask (not shown) is deposited over the material layer for the gate electrode which assists the patterning of the dummy gate electrode 226. The gate top hard mask may be a multi-layer and include a silicon nitride mask layer and a silicon oxide mask layer over the silicon nitride mask layer. The material layer for the dummy gate electrodes 226 is then patterned using photolithography processes to form the dummy gate electrodes 226. In some embodiments, the dummy gate electrodes 226 may include polycrystalline silicon (polysilicon).

In some embodiments, the dummy gate stacks 230 are formed on top and sidewall surfaces of the dummy oxide layer 232, which in turn is formed on the top and sidewall surfaces of the dielectric layer 222, the top surface of the topmost channel layer 208, and the top surface of the cladding layer 216. In the depicted embodiments, the top surface of the dummy gate stacks 230 extends above the top surfaces of the dielectric layer 222. Therefore, a conductive pathway is maintained throughout the entire length of the dummy gate stacks 230 along the X-direction.

Referring to FIGS. 1C and 23A-23C, the method portion 100-2 includes a block 126 where gate spacer 234 is formed along sidewalls of the dummy gate stacks 230. The gate spacer 234 may include one or more gate spacer layers. For example, in the depicted embodiments, the gate spacer 234 includes two gate spacer layers. The gate spacer 234 may include a dielectric material, such as a dielectric material that allows selective removal of the dummy gate stacks 230 without affecting the gate spacer 234. Suitable dielectric materials may include silicon nitride, silicon oxycarbonitride, silicon carbonitride, silicon oxide, silicon oxycarbide, silicon carbide, silicon oxynitride, and/or combinations thereof. The gate spacer 234 may be conformally deposited over the workpiece 200 using CVD, subatmospheric CVD (SACVD), or ALD.

Figure 23A:
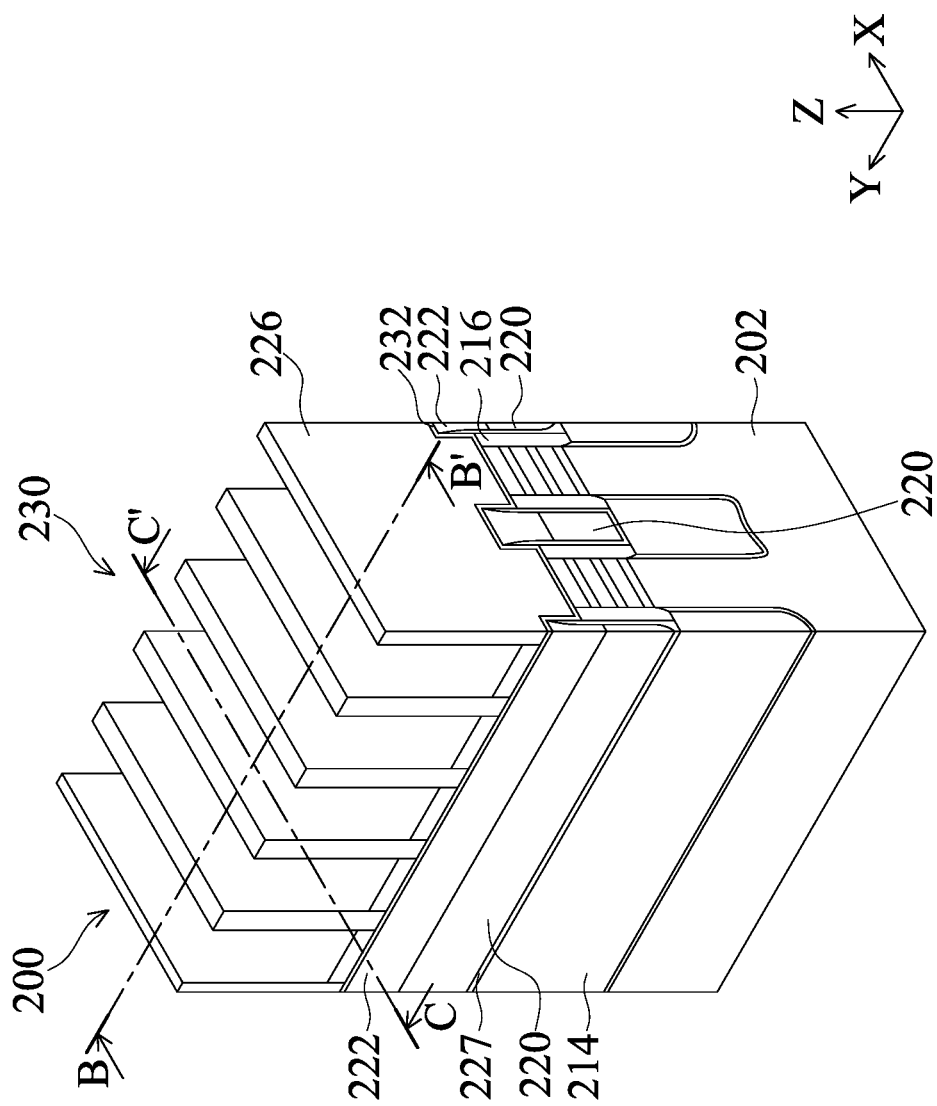
Figure 23C:
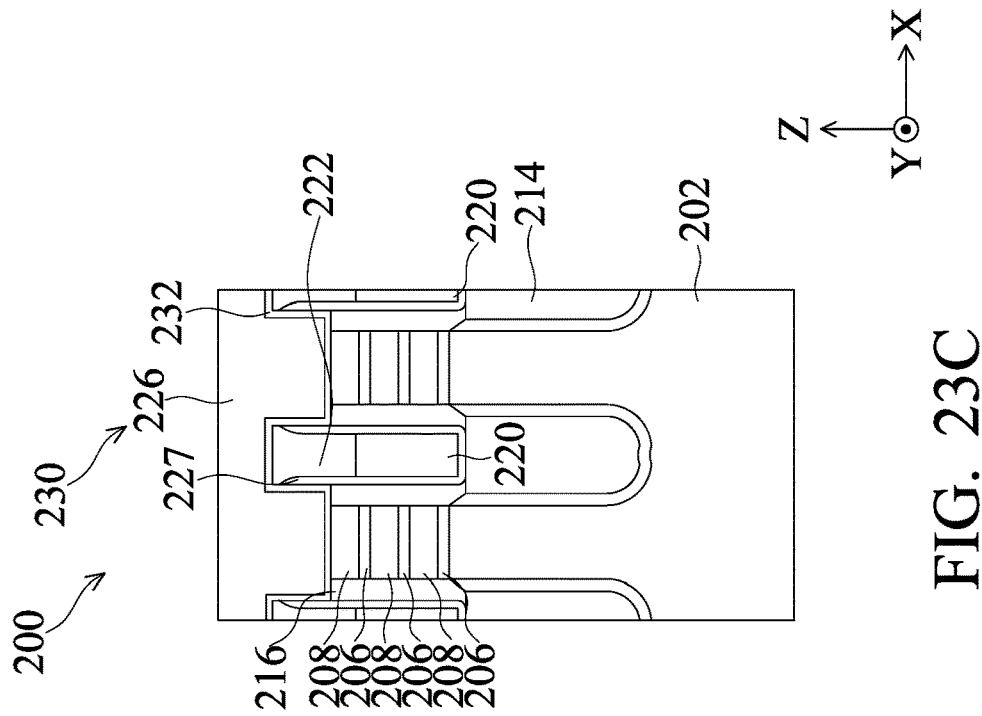
Figure 23B:
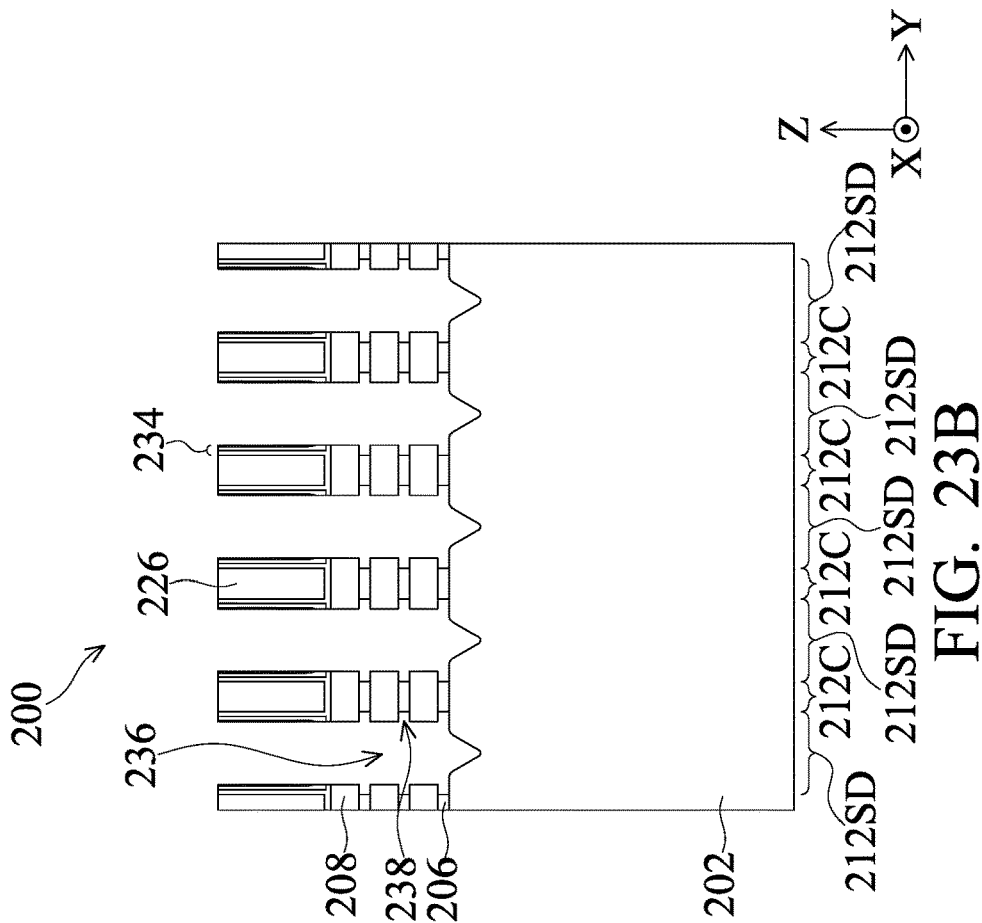

Referring to FIGS. 1C and 23A-23C, method portion 100-2 includes a block 128 where the source/drain regions 212SD are recessed to form source/drain trenches 236. With the dummy gate stacks 230 and the gate spacers 234 serving as an etch mask, the workpiece 200 is anisotropically etched to form the source/drain trenches 236 over the source/drain regions 212SD. In some embodiments as illustrated in FIG. 23B, operations at block 128 may substantially remove the stack portions 212S of fin-shaped structures 212 in the source/drain regions 212SD and the source/drain trenches 236 may extend into the base portions 212B, which is formed from the substrate 202. The anisotropic etch at block 128 may include a dry etch process or a suitable etch process. For example, the dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 24A:
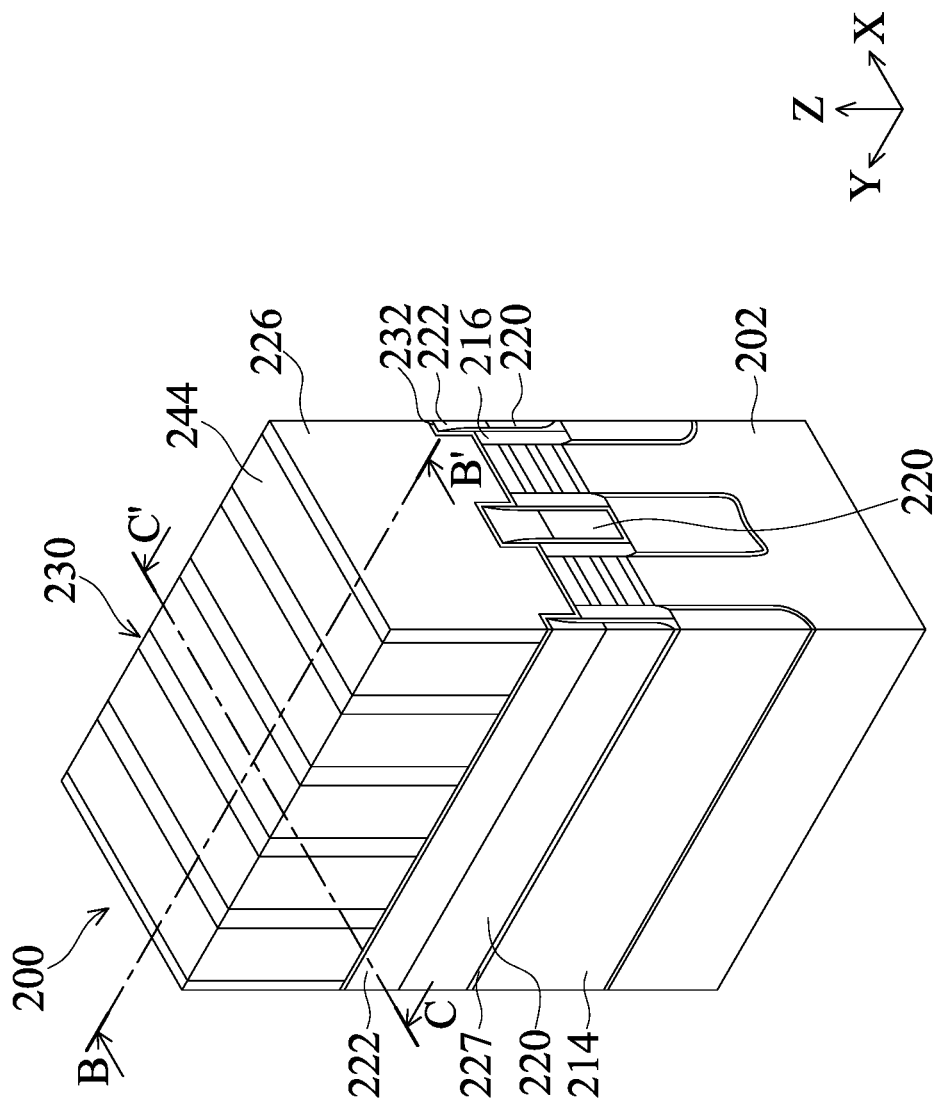
Figure 24C:
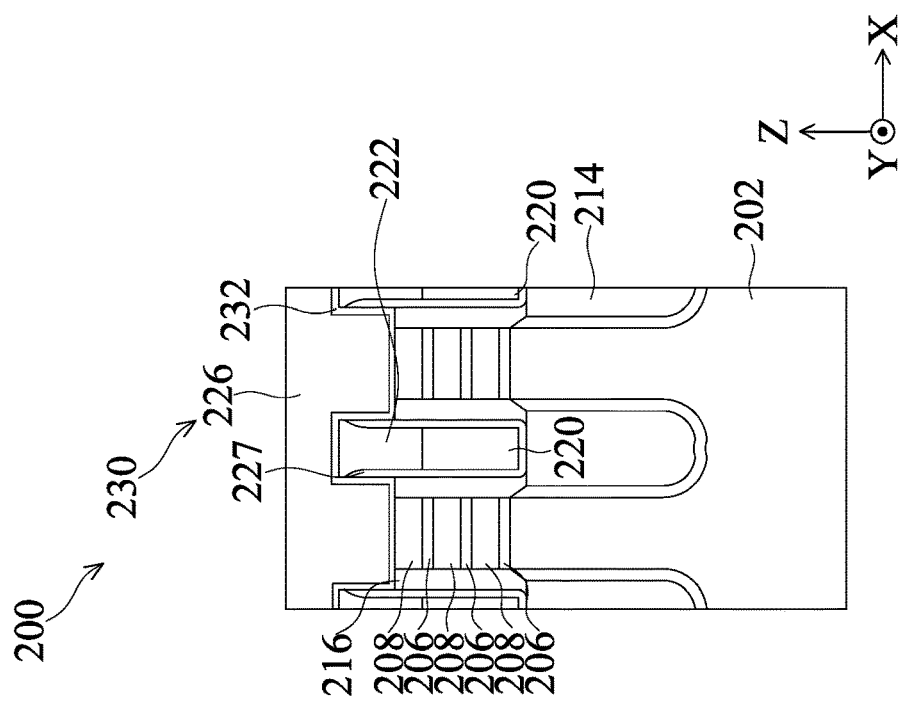
Figure 24B:
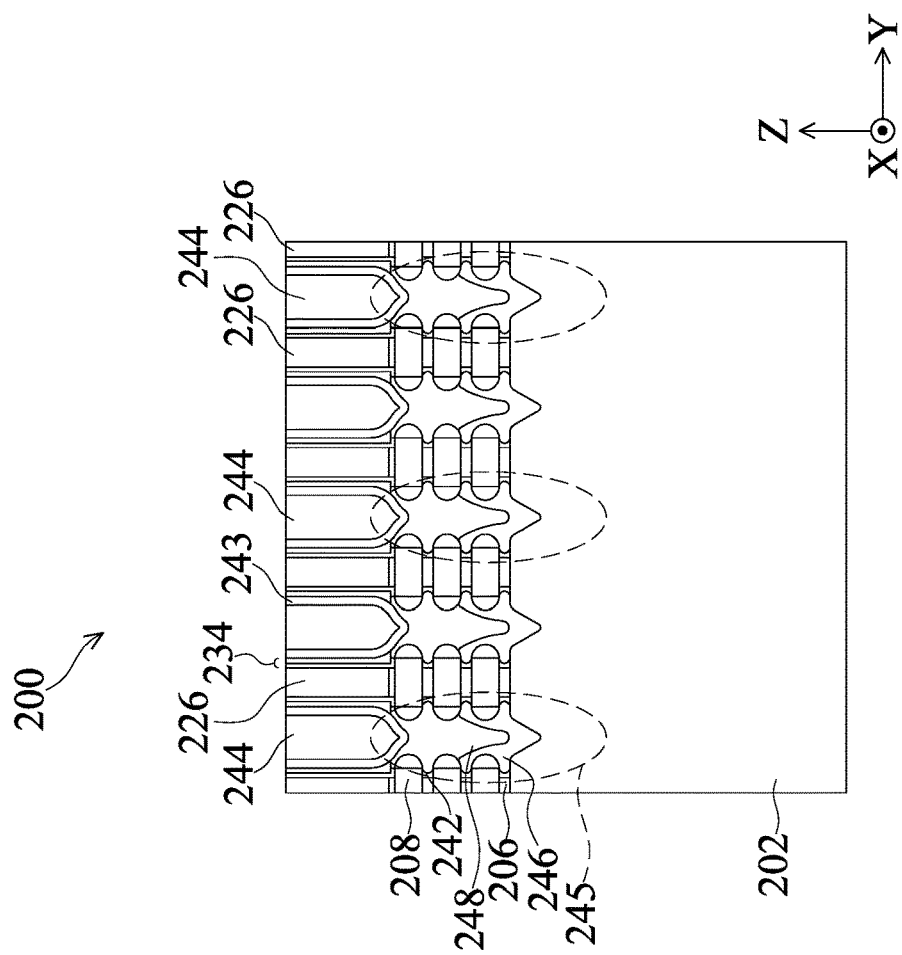
Figure 25A:
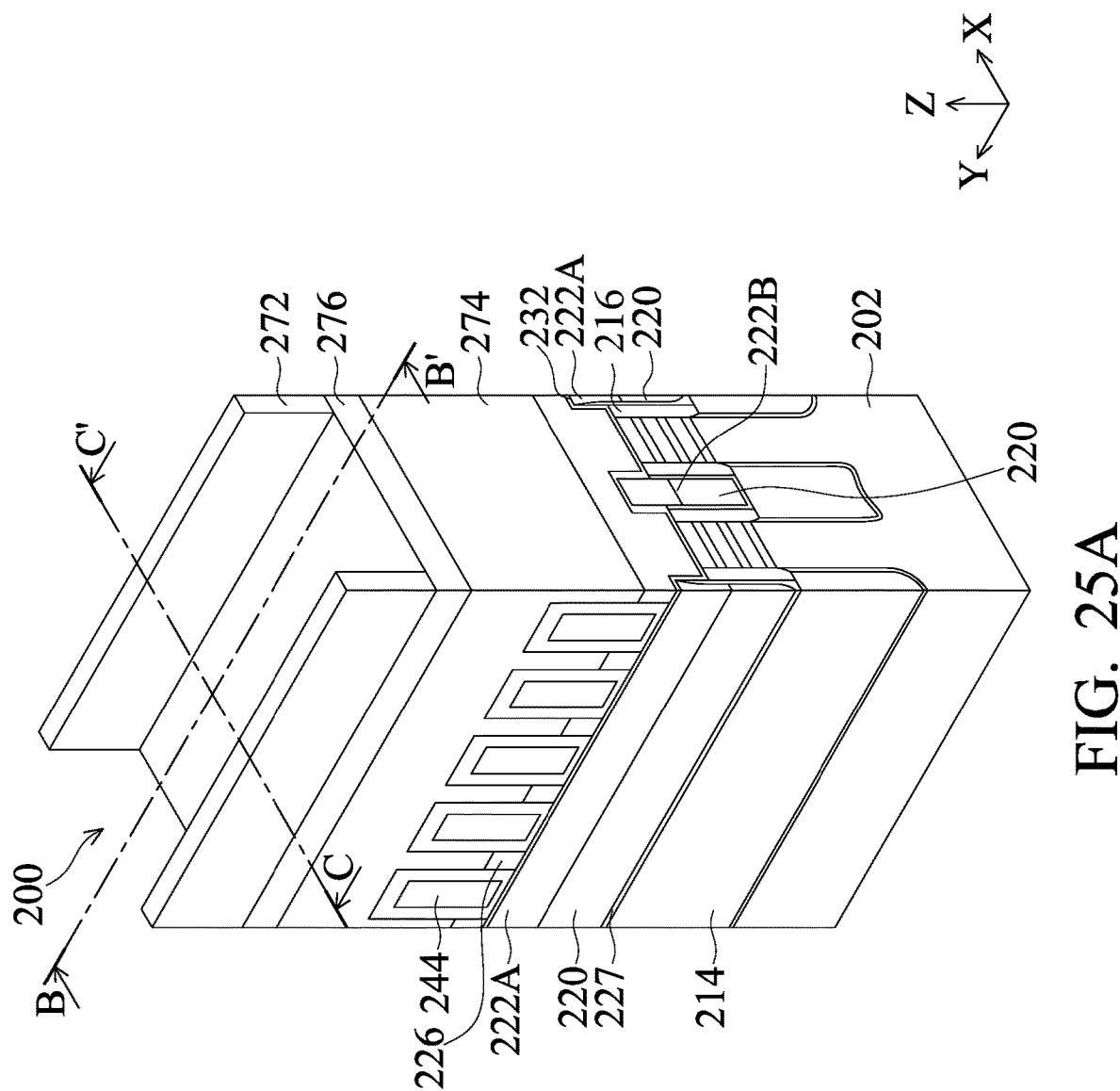
Figure 25C:
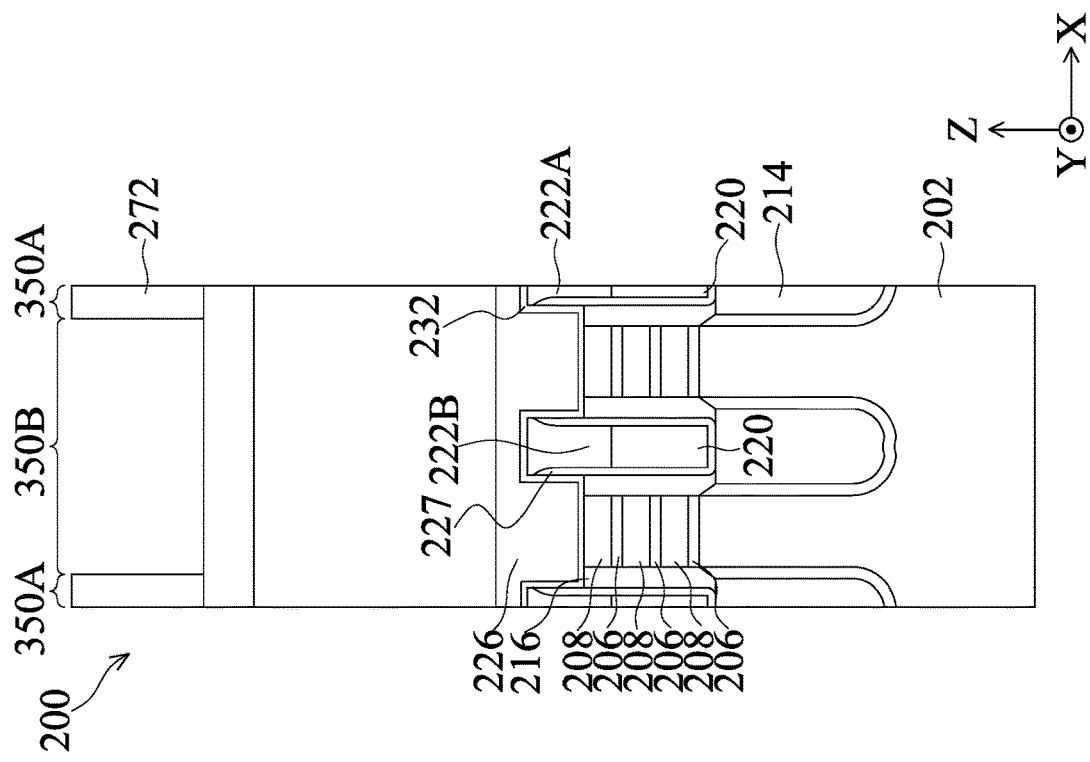
Figure 25B:
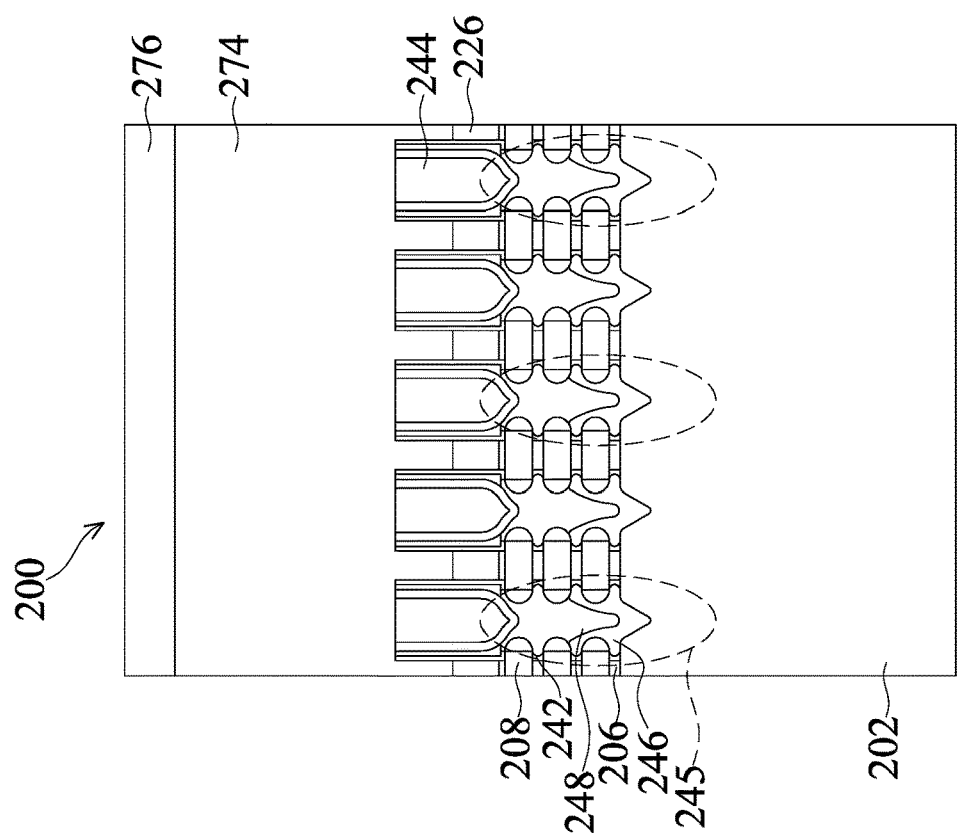
Figure 26A:
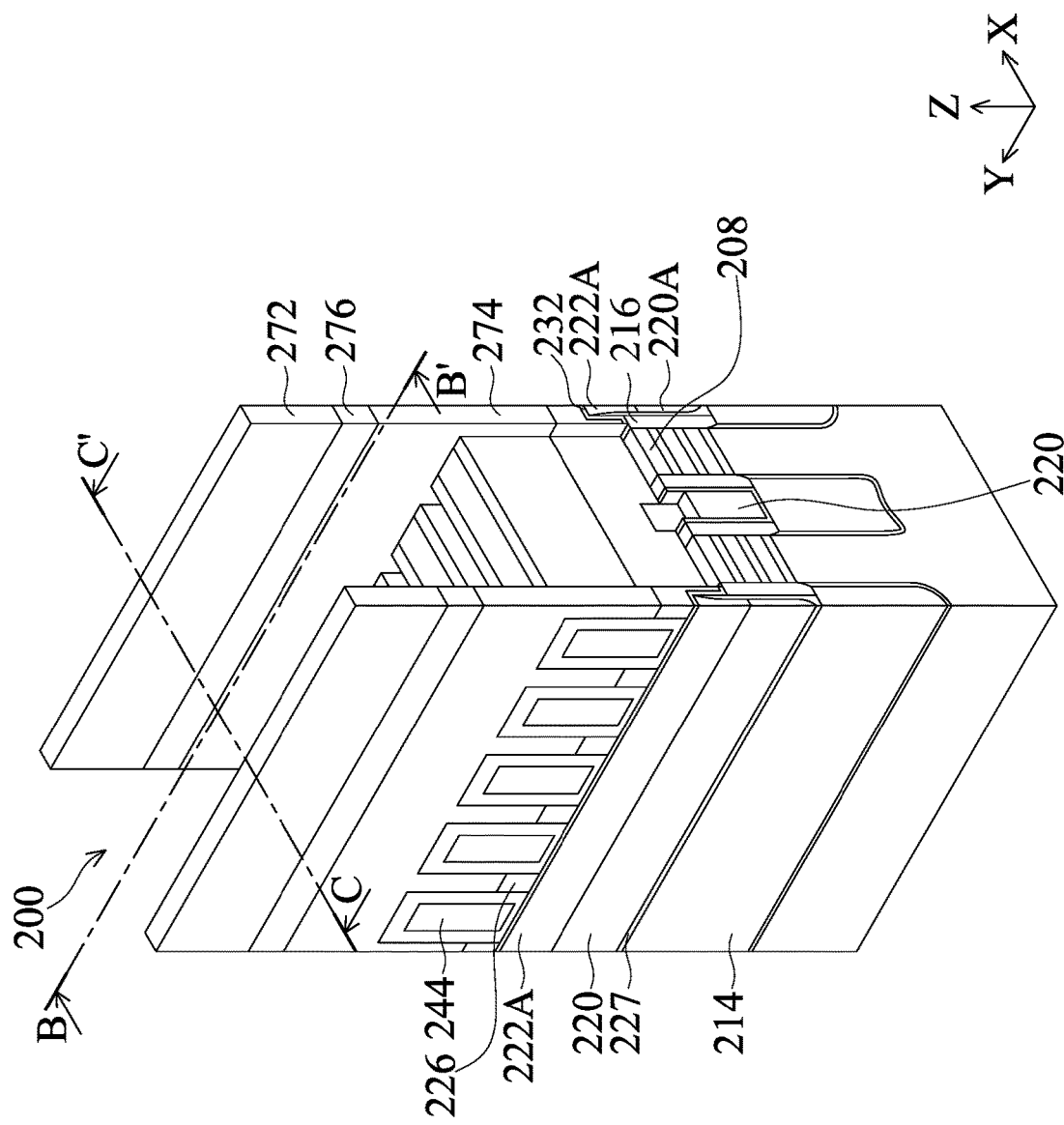
Figure 26C:
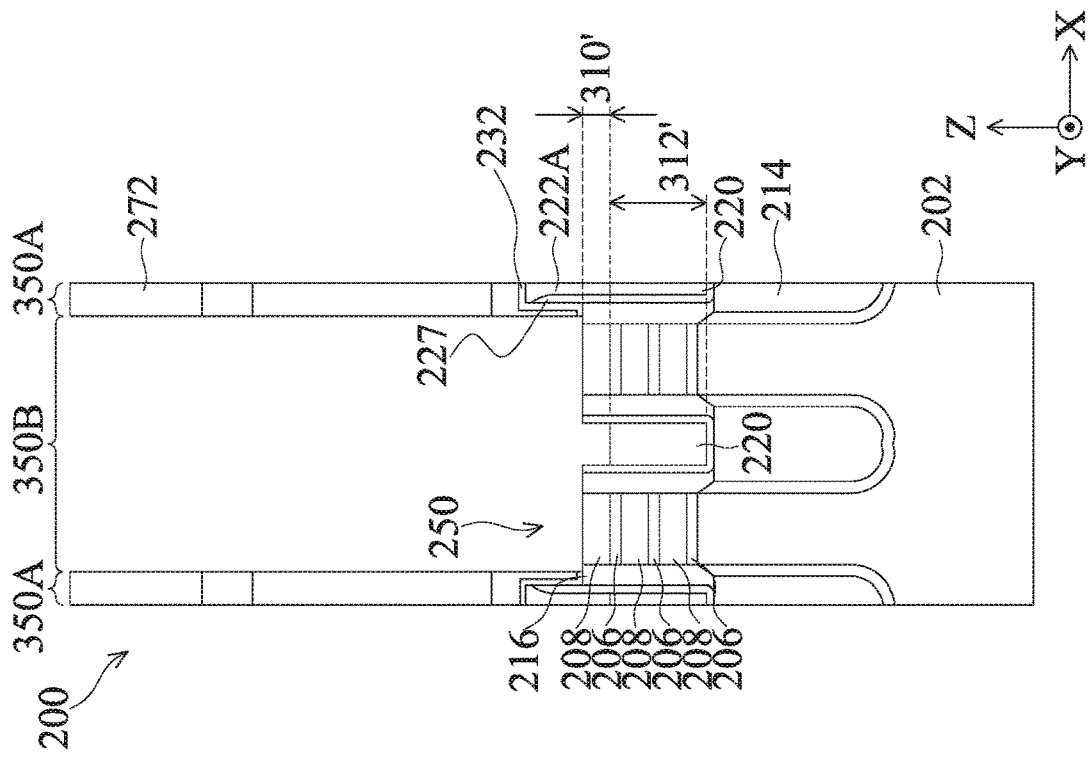
Figure 26B:
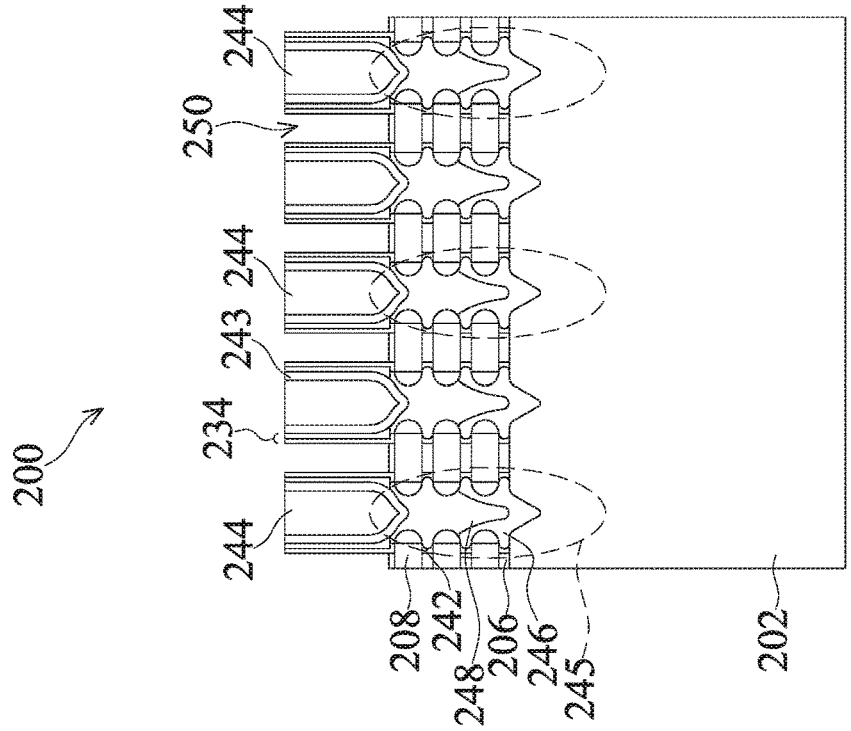
Figure 27A:
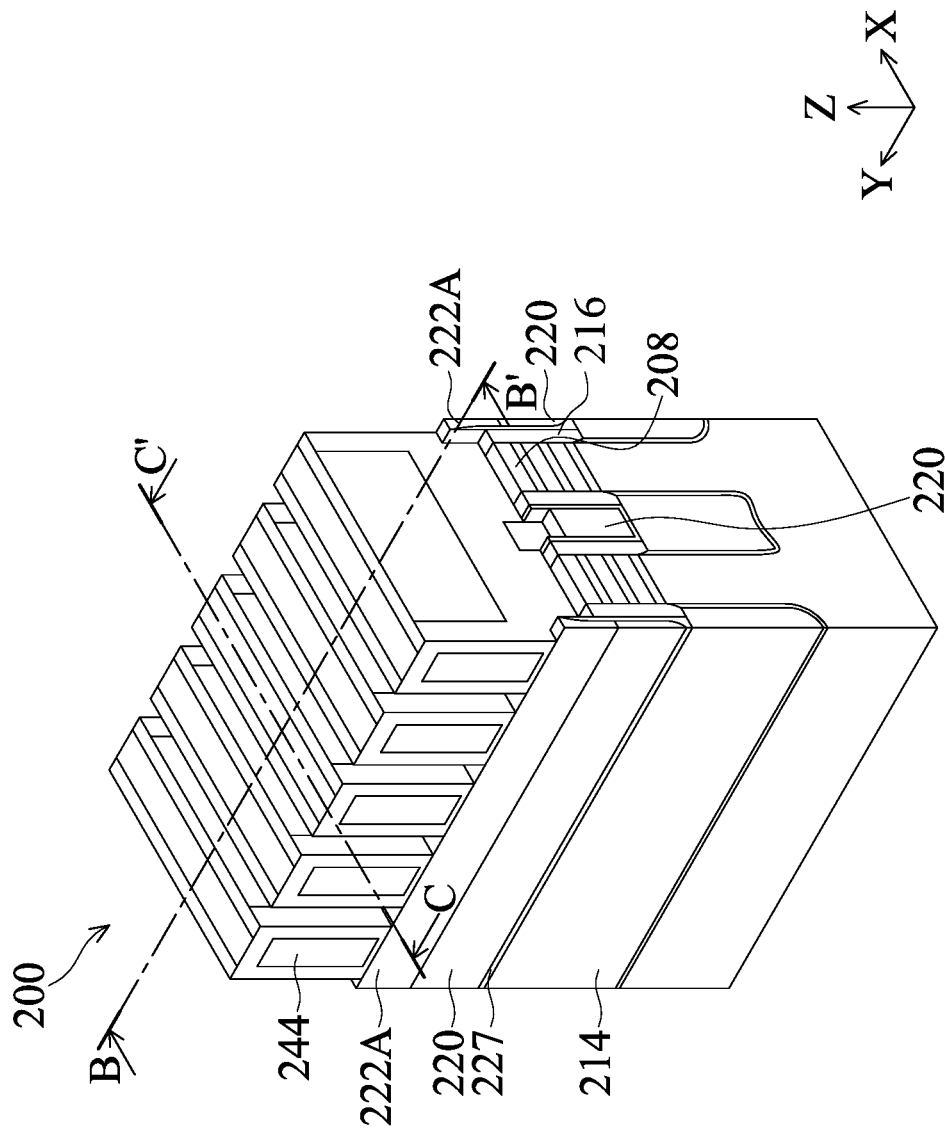
Figure 27C:
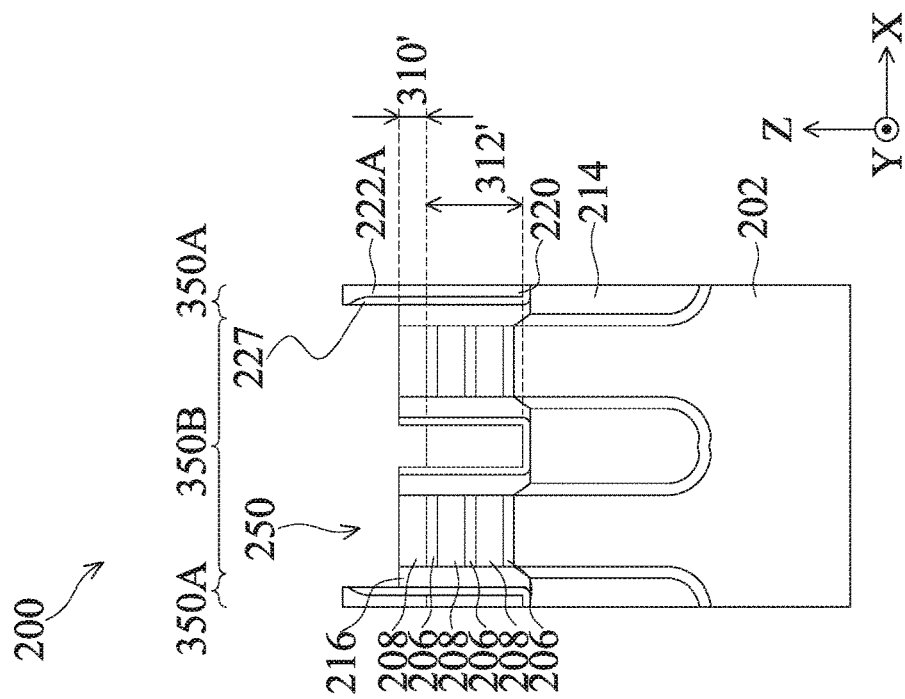
Figure 27B:
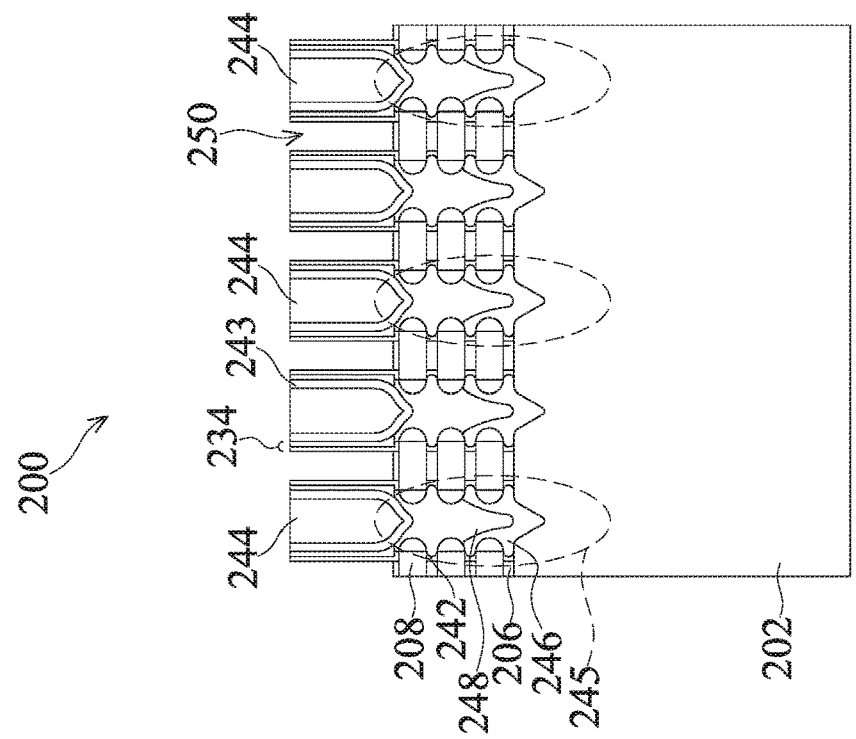
Figure 28A:
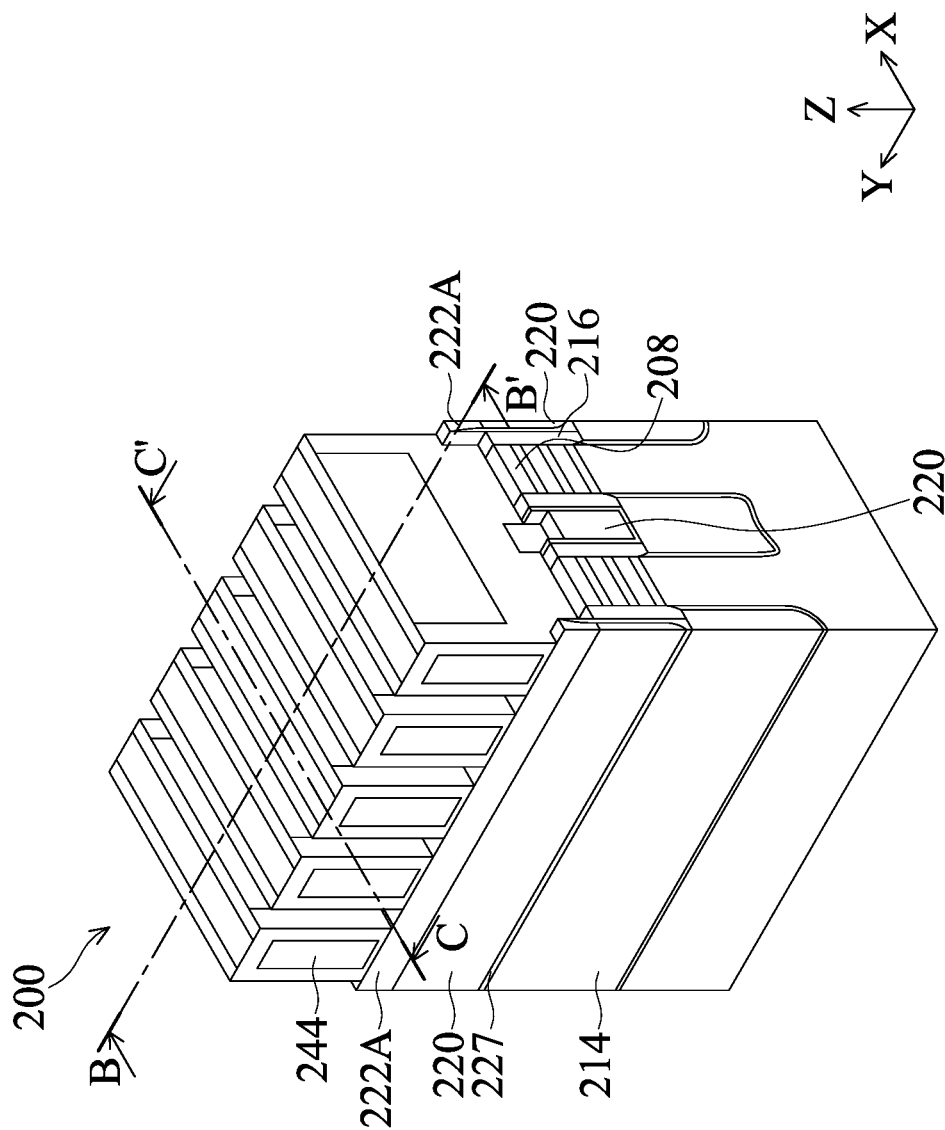
Figure 28C:
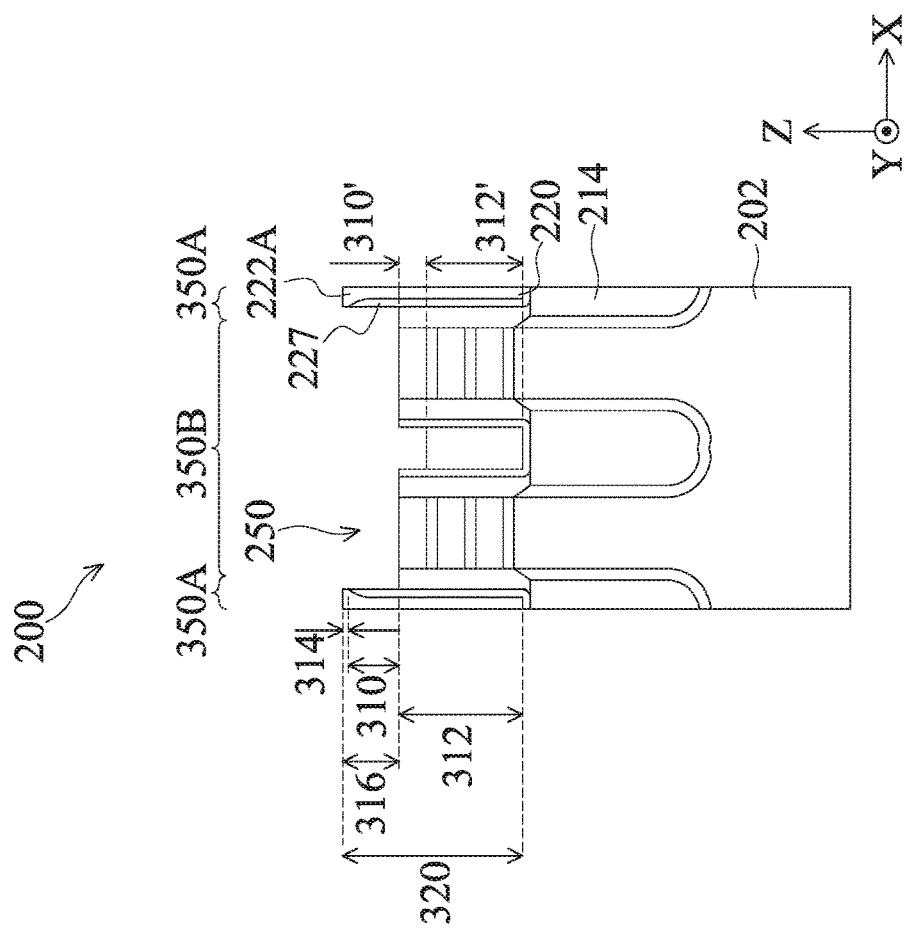
Figure 28B:
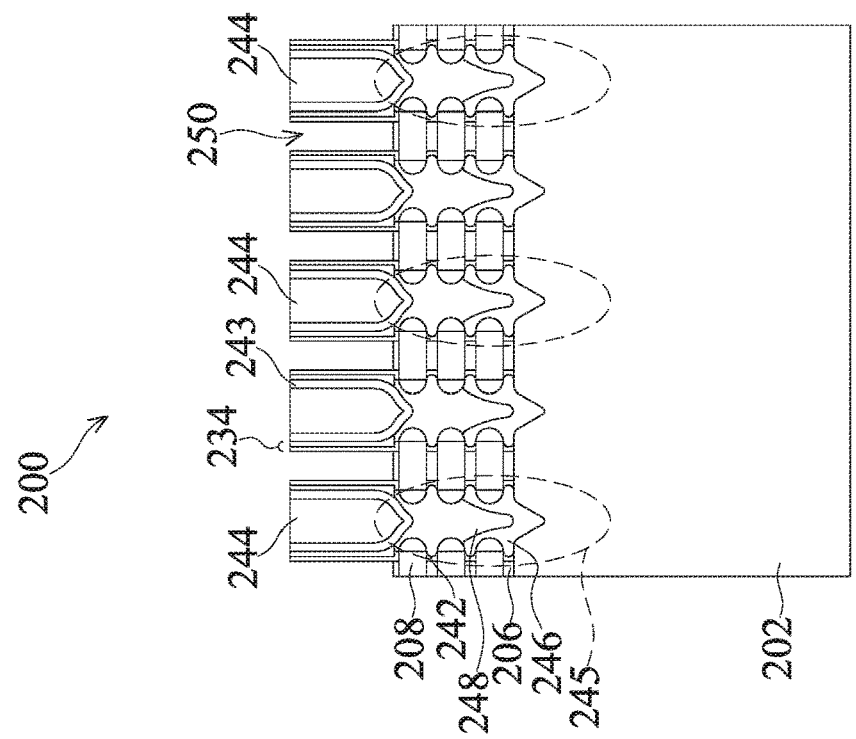

Still referring to FIG. 1C, FIGS. 23A-23C and 24A-24C, the method portion 100-2 includes a block 130 where inner spacer features 242 are formed. Referring to FIGS. 1C, 23A-23C, the sacrificial layers 206 exposed in the source/drain trenches 236 are first selectively and partially recessed to form inner spacer recesses 238, while the exposed channel layers 208 are substantially unetched. In an embodiment where the channel layers 208 consist essentially of silicon (Si) and sacrificial layers 206 consist essentially of silicon germanium (SiGe), the selective and partial recess of the sacrificial layers 206 may include a SiGe oxidation process followed by a SiGe oxide removal. In such embodiments, the SiGe oxidation process may include use of ozone. In some other embodiments, the selective recess may be a selective isotropic etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include a hydro fluoride (HF) or $NH_4OH$ etchant. Referring to FIGS. 24A-24C, an inner spacer material layer is then deposited using CVD or ALD over the workpiece 200, including over and into the inner spacer recesses 238. The inner spacer material may include silicon nitride, silicon oxycarbonitride, silicon carbonitride, silicon oxide, silicon oxycarbide, silicon carbide, or silico oxynitride. After the deposition of the inner spacer material layer, the inner spacer material layer is etched back to form inner spacer features 242, as illustrated in FIG. 24B.

Referring to FIGS. 1C and 24A-24C, method portion 100-2 includes a block 132 where source/drain features 245 are formed in the source/drain trenches 236 as well as the remaining portions of the inner spacer recesses 238. In some embodiments, each of the source/drain features 245 may include an outer layer 246 and an inner layer 248. To form the source/drain features 245, the outer layer 246 is first selectively and epitaxially deposited on the exposed semiconductor surfaces of the channel layers 208 and the substrate 202 and then, the inner layer 248 is selectively and epitaxially deposited on the outer layer 246. The source/drain features 245, including the outer layer 246 and the inner layer 248, may be deposited using an epitaxial process, such as vapor-phase epitaxy (VPE), ultra-high vacuum CVD (UHV-CVD), molecular beam epitaxy (MBE), and/or other suitable processes. The source/drain features 245 may be either n-type or p-type. When the source/drain features 245 are n-type, each of the outer layer 246 and the inner layer 248 may include silicon (Si) and may be doped with an n-type dopant, such as phosphorus (P) or arsenic (As). When the source/drain features 245 are p-type, each of the outer layer 246 and the inner layer 248 may include silicon germanium (SiGe) or germanium (Ge) and may be doped with a p-type dopant, such as boron (B) or gallium (Ga). Regardless of the conductivity type of the source/drain features 245, a doping concentration in the inner layer 248 may be greater than the outer layer 246 to reduce contact resistance. In some implementations, the inner layer 248 and the outer layer 246 may be doped with the same dopant species. In some alternative implementations, the inner layer 248 and the outer layer 246 may be doped with different dopant species. Doping of the outer layer 246 and the inner layer 248 may be performed either in situ with their deposition or ex-situ using an implantation process, such as a junction implant process. Still referring to FIG. 24B, although the epitaxial deposition of the inner layer 248 is selectively to semiconductor surfaces, overgrowth of the inner layer 248 may merge over the inner spacer features 242.

Referring to FIGS. 1C and 24B, method portions 100-2 includes a block 134 where a contact etch stop layer (CESL) 243 and an interlayer dielectric (ILD) layer 244 are deposited. In an example process, the CESL 243 is first conformally deposited over the workpiece 200 and then the ILD layer 244 is blanketly deposited over the CESL 243. The CESL 243 may include silicon nitride, silicon oxide, silicon oxynitride, and/or other materials known in the art. The CESL 243 may be deposited using ALD, plasma-enhanced chemical vapor deposition (PECVD) process and/or other suitable deposition or oxidation processes. In some embodiments, the ILD layer 244 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be deposited by spin-on coating, an FCVD process, or other suitable deposition technique. In some embodiments, after formation of the ILD layer 244, the workpiece 200 may be annealed to improve integrity of the ILD layer 244. To remove excess materials and to expose top surfaces of the dummy gate electrodes 226 of the dummy gate stacks 230, a planarization process (such a chemical mechanical polishing (CMP) process) may be performed to the workpiece 200 to provide a planar top surface, as illustrated in FIG. 24B. Top surfaces of the dummy gate electrodes 226 are exposed on the planar top surface.

The method portion 100-2 proceeds to the gate replacement process where the dummy gate stacks 230 are replaced with functional gate structures. Unlike the dummy gate stacks 230 that may have a continuous conductive pathway across all fin-shaped structures it extends across, functional gate structures may have shorter gate lengths along the X-direction. In some embodiments, the gate lengths are defined using the dielectric features between the fin-shaped structures 212, such as the recessed filler layer 220 and the dielectric layer 222. For example, the functional gate structure may be configured to have a top surface between the top surface of the dielectric layer 222 and the top surface of the recessed filler layer 220. Where the functional gate structure is designed to continuously extend across (denoted as the non-cut-metal-gate area 350B), the respective dielectric layer 222 is removed such that the functional gate structure extends across the top surface of the recessed filler layer 220 and maintains the electrical conductivity; while where the functional gate structure is designed to terminate and be electrically separated from adjacent portions (denoted as the cut-metal-gate area 350A), the respective dielectric layer 222 is preserved, such that the dielectric layer 222 dissects the conductive pathway (and the functional gate structure) into two discontinuous portions and define the respective gate structure lengths.

Referring to FIGS. 1C and 25A-25C, method portion 100-2 includes a block 136 where a photoresist layer 274 and a photoresist layer 276 are formed over the device. In the depicted embodiments, the dummy gate stack 230 is recessed prior to the formation of photoresist layers 274 and 276. Accordingly, the top surface of the dummy gate stack 230 (and the bottom surfaces of the photoresist layer 274) extends below the top surface of the ILD layer 244. In other embodiments, the recessing of the dummy gate stack 230 is omitted. Mandrels 272 are formed on the photoresist layer 276 to cover the cut-metal-gate area 350A while leaving the non-cut-metal-gate area 350B exposed.

Referring to FIGS. 1C and 26A-26C, method portion 100-2 includes a block 138 where the photoresist layer 274 and the photoresist layer 276 are etched to form a mask element. Portions of the dummy gate electrodes 226 not covered by the mask element are removed from the workpiece 200, while portions of the dummy gate electrodes 226 under the mask element (such as under the mandrels 272) are substantially preserved. The removal of the portion of the dummy gate electrodes 226 results in gate trenches 250 over the channel regions 212C in the non-cut-metal-gate area 350B, but not in the cut-metal-gate area 350A. The removal of the portion of the dummy gate stacks 230 may implement one or more etching processes that are selective to the material in the dummy gate stacks 230. For example, the removal of the dummy gate stacks 230 may be performed using as a selective wet etch, a selective dry etch, or a combination thereof. Meanwhile, the channel layers 208, the cladding layer 216, the layer 227 are preserved. Moreover, the portions of the photoresist layers 274 and 276 and the portions of the dummy gate stack 230 under the mandrels 272 are also preserved.

The removal of the portions of the dummy gate stack 230 further exposes the dielectric layer 222B in the non-cut-metal-gate area 350B (but not the dielectric layer 222A in the cut-metal-gate area 350A). Referring to block 140 of FIG. 1C and still referring to FIGS. 26A-26C, the method portion 100-2 proceeds to remove the dielectric layer 222B, thereby exposing a top surface of the recessed filler layer 220 in the non-cut-metal-gate area 350B. Any suitable methods, such as wet etching, dry etching, or combinations thereof may be used. Meanwhile, the ILD layer 244 on top of the source/drain features 245, the channel layers 208 and/or sacrificial layers 206 are not substantially affected due to etching selectivity. As described above, the removal of the dielectric layer 222B allows subsequent formation of continuous functional gate electrode that extends across multiple fin-shaped structures 212 and through the area otherwise occupied by the dielectric layer 222B. In some embodiments, the exposed top surface of the dielectric layer 220B extends lower than the top surface of the topmost channel layer 208 by a distance 310'.

In some embodiments, the etching of the dielectric layer 222B may terminate at the interface between the dielectric layer 222 and the recessed filler layer 220, for example, due to an etching selectivity between the recessed filler layer 220 and that of the dummy gate stack 230. In such embodiments, the distance 310' equals the distance 310 described above with respect to FIG. 7C or FIG. 17C. Moreover, the height 312' of the recessed filler layer 220 may be the same as the height 312 described above with respect to FIG. 7C or FIG. 17C. Furthermore, the exposed top surface of the dielectric layer 220B in the non-cut-metal-gate area 350B extends along the same height as the interface between the dielectric layer 222A and the recessed filler layer 220 in the cut-metal-gate area 350A. In some embodiments, the etching operation (or another etching operation) may be used to further fine tune the height of the recessed filler layer 220 based on design needs. In some embodiments, this process may be used to fine-tune the shape (profile) of the exposed top surface of the recessed filler layer 220. For example, a top surface of a convex profile provides canted sidewall surfaces. Such canted sidewall surfaces adjacent to the fin-shaped structures 212 offer less restriction to material flows targeting the fin-shaped structures 212, and therefore improves the etching and/or deposition processes. In such examples, the distance 310' and the height 312' each represent the average distance and average height, respectively. Moreover, in such examples, the profile of the top surface of the filler layer 220 may be different in the cut-metal-gate area 350A and in the non-cut-metal-gate area 350B. For example, the profile may be substantially flat in the cut-metal-gate area 350A, but may be convex in the non-cut-metal-gate area 350B.

As described above, the above process results in the dielectric layer 222B being removed in the non-cut-metal-gate area 350B while the dielectric layer 222A being preserved in the cut-metal-gate area 350A. Accordingly, subsequently formed functional gate structure having a top surface below the top surface of the dielectric layer 222 are cut through in the cut-metal-gate area 350A but not cut through in the non-cut-metal-gate area 350B. In other words, the length dimension of the functional metal gate along the X-direction is defined between the dielectric layers 222A of two adjacent cut-metal-gate areas 350A; and the functional gate structure extend across the recessed filler layer 220 in the non-cut-metal-gate region 350B. Subsequently, referring to FIGS. 1C and 27A-27C, method portion 100-2 includes a block 142 where the mandrels 272, the remaining portions of the photoresist layers 274 and 276, as well as the remaining portions of the dummy gate stack 230 are removed using suitable methods. However, the etching process is configured to only remove the remaining portions of the dummy gate stack 230 and not further recessing the dielectric layer 222A.

The disclosure above provides methods 100A and 100B where the filler layer 220 is recessed at the processing stage associated with FIG. 10A-10C or 17A-17C by the distance 310 of, for example, about 10 nm to about 20 nm. Alternatively, the etching operation at that processing stage may cause the distance 310 to be less than about 10 nm. Rather, further recessing may be conducted at the processing stage associated with FIGS. 26A-26C to achieve similar results. For example, method 100A may be configured, at the processing stage associated with FIGS. 7A-7C, to have the distance being less than 10 nm, such as being less than 4 nm. At the processing stage associated with FIGS. 26A-26C, additional recessing operation is conducted to further reduce the height of the recessed filler layer 220 resulting in the distance 310' being about 10 nm to about 20 nm. In such embodiments, referring to FIGS. 28A-28C, the recessed filler layer 220 may have different height in the cut-metal-gate area 350A and in the non-cut-metal-gate area 350B. For example, the recessed filler layer 220 may have the height 312 in the cut-metal-gate area 350A and the height 312' in the non-cut-metal-gate area 350B. The height 312' is less than the height 312. For example, the height 312 may be about 20 nm to about 60 nm; while the height 312' may be about 10 nm to about 50 nm. In other words, the top surface of the recessed filler layer 220 may be lower in the non-cut-metal-gate area 350B than in the adjacent cut-metal-gate area 350A. In some embodiments, a sum of the distance 310 and the distance 316 defines the height 320 of the dielectric feature that dissects the subsequently formed functional metal gate. In some embodiments, a ratio of the height 320 (which equals the sum of the height 316 and the height 312) to the height 312' is about 2:1 to about 1.1:1. In the ratio is too small, such as less than 1.1:1, the recessed filler layer 220 may still be too high such that restrictions are imposed to the material flows; if the ratio is too large, such as greater than 2:1, the recessed filler layer 220 may be too low such that the dielectric layer 222 may reach too deep into the trenches between the adjacent fin-shaped structures and leave residues when removed. At this stage, the sidewalls of channel layers 208 and sacrificial layers 206 in the channel regions 212C are exposed in the gate trenches 250.

Referring to FIGS. 1C and 29A-29C, method portion 100-2 includes a block 144 where the remaining portions of the sacrificial layers 206 between the channel layers 208 in the channel regions 212C are selectively removed from the exposed sidewalls in the gate trenches 250. This process releases the channel layers 208 to form channel members 2080. The channel members 2080 are vertically stacked along the Z direction. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as $NH_4OH$.

Figure 29A:
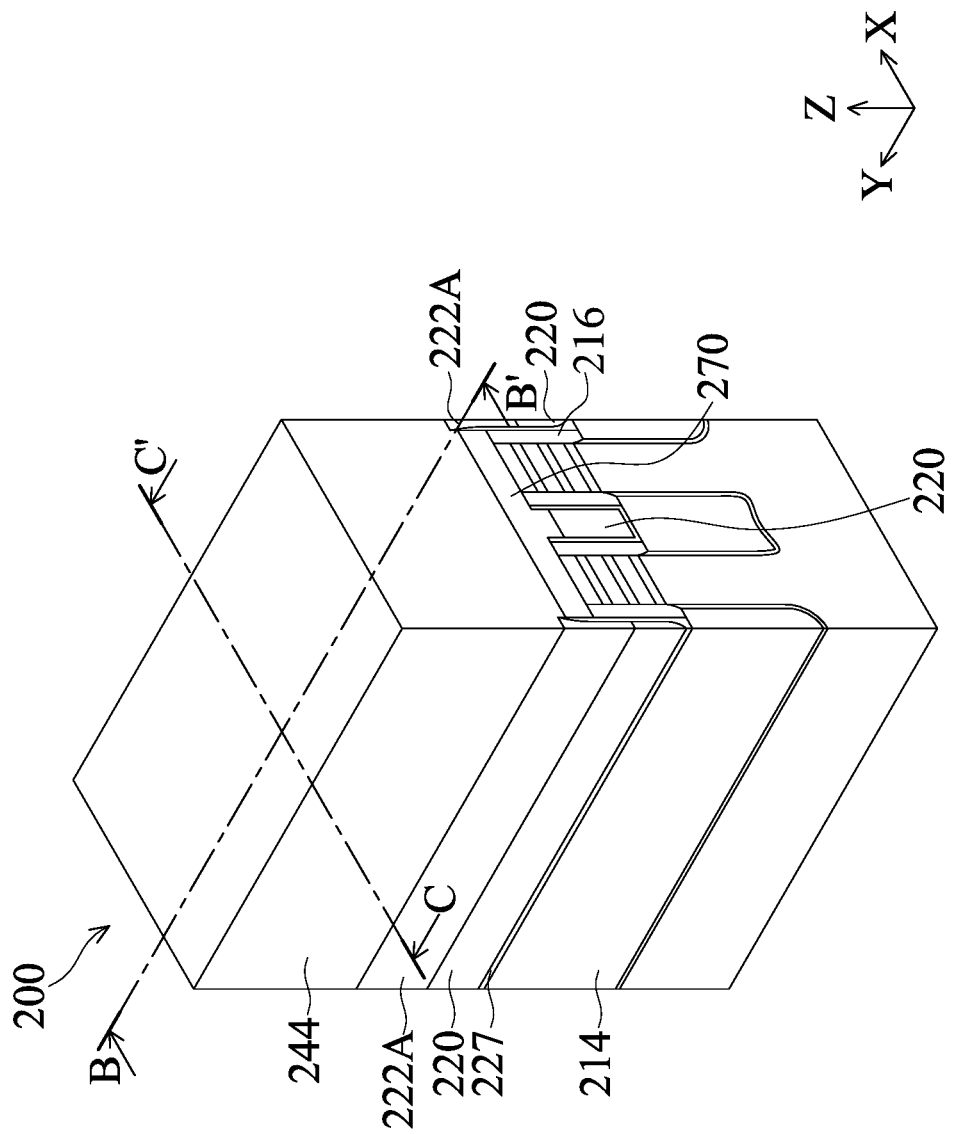
Figures 29B, 29C:
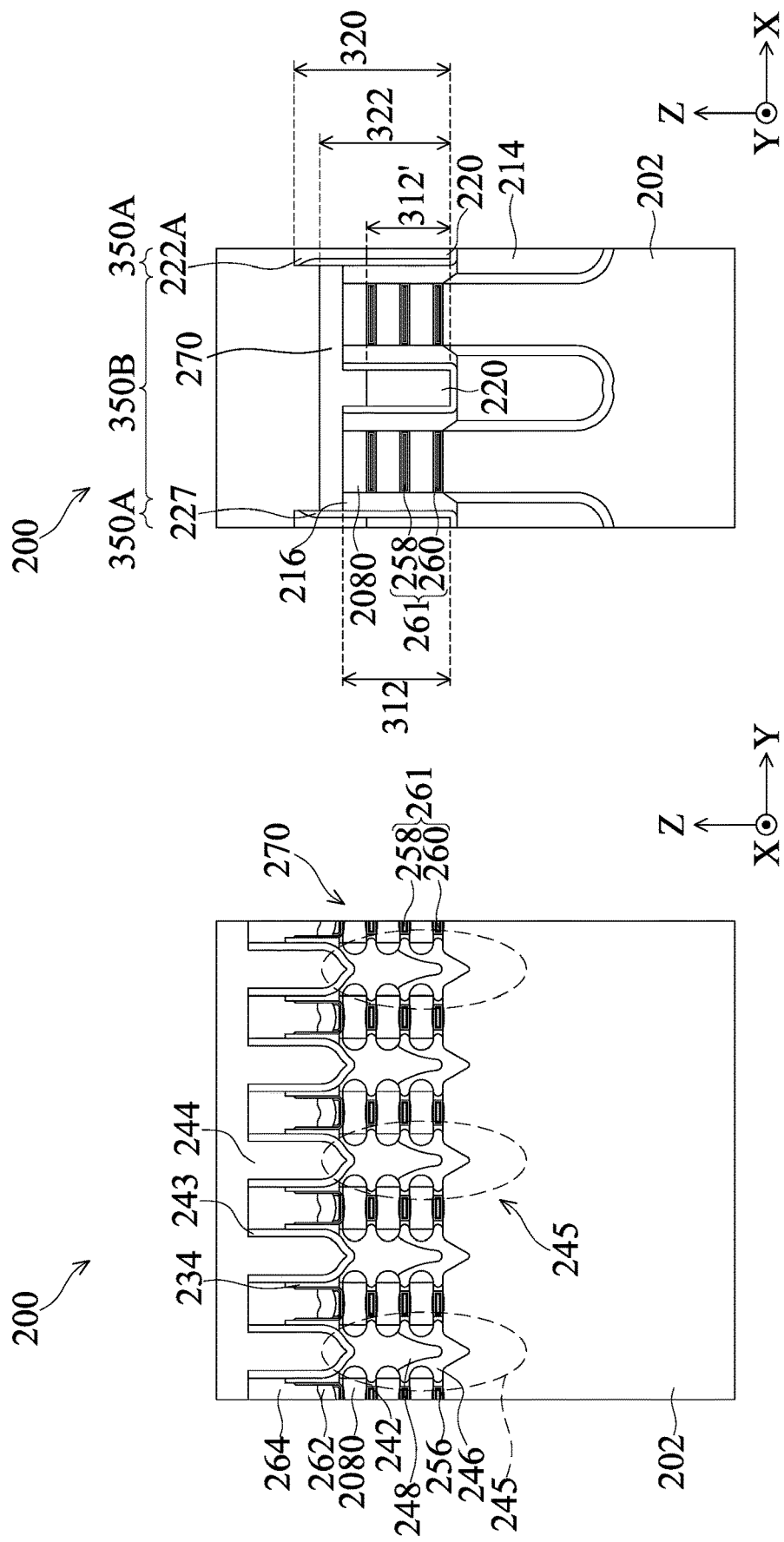

Referring to FIGS. 1C and 29A-29C, method portion 100-2 includes a block 146 where an interfacial layer 254 and a gate dielectric layer 256 are deposited in the gate trenches 250. As shown in FIGS. 29A-29C, the interfacial layer 254 and the gate dielectric layer 256 are then sequentially deposited to wrap around each of the channel members 2080. In some embodiments, the interfacial layer 254 includes silicon oxide and may be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel members 2080 to form the interfacial layer 254. The gate dielectric layer 256 is then deposited over the interfacial layer 254 using ALD, CVD, and/or other suitable methods. The gate dielectric layer 256 may be formed of high-K dielectric materials. As used herein, high-k dielectric materials include dielectric materials having a high dielectric constant, for example, greater than that of thermal silicon oxide (~3.9). The gate dielectric layer 256 may include hafnium oxide. Alternatively, the gate dielectric layer 256 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide ($ZrO_2$), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material.

Referring to FIGS. 1C and 29A-29C, method portion 100-2 includes a block 148 where a gate electrode layer 261 is deposited in the gate trenches 250. The gate electrode layer 261 may be a multi-layer structure that includes at least one work function layer 258 and a metal fill layer 260. By way of example, the at least one work function layer 258 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer 260 may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer 261 may be formed by ALD, PVD, CVD, e-beam evaporation, or other suitable process.

Operations at blocks 146 and 148 form gate structures 270 to wrap around channel members 2080 in channel regions 212C. In some embodiments illustrated in FIGS. 29A-29C, each of the gate structures 270 includes the interfacial layer 254, the gate dielectric layer 256, the at least one work function layer 258, and the metal fill layer 260. Each of the gate structures 270 wraps around the channel members 2080. Because the at least one work function layer 258 is deposited before the deposition of the metal fill layer 260, the at least one work function layer 258 is in contact with the outer layer 246 of the source/drain feature 245, the inner spacer features 242, and the layer 227, the at least one gate spacer 234, and the filler layer 220, while the metal fill layer 260 is spaced apart from them. In the depicted embodiments of FIG. 29C, the gate structure 270 has a height 322 measuring from a plane coplanar with the bottom surface of the dielectric feature 220 to the top surface of the gate structure 270. For example, a vertical difference (along the Z-direction) between the top surface of the metal fill layer 260 and the bottom surface of the dielectric feature 220 corresponds to the height 322. In the depicted embodiments, the height 322 is less than the height 320 but greater than the height 312. Accordingly, the gate structure 270 extends over the filler layer 220 and is terminated by the combination of the filler layer 220 and the dielectric layer 222A thereon. In other words, the gate structure 270 has a length along the X-direction that is defined by the distance between the adjacent dielectric layers 222A. Although the figures depict the gate structure 270 as having a length that extends over two fin structures, the present disclosure contemplates the gate structure 270 spanning over any suitable number of fin structures, and have any suitable lengths.

The method portion 100-2 may proceed to complete the fabrication of the device. For example, in various embodiments, a planarization process, such as a CMP process, may be performed to remove excessive materials to provide a substantially planar top surface of the gate structures; gate capping layers, gate self-aligned-contact (SAC) dielectric layers, silicide layers, and/or source/drain contacts may be formed on the workpiece 200. Moreover, via features, contact features, metal line features, among others may further be formed.

The methods described above result in several features in the devices fabricated. For example, the device includes a plurality of fin structures. The adjacent fin structures are separated by dielectric features 220 along the X-direction. Each fin structure includes a stack of suspended channel layers. The stack of channel layers extends has a height 312 measuring from a plane coplanar with the bottom surface of the dielectric feature 220 to a top surface of the topmost channel layer. The dielectric features 220 in a non-cut-metal-gate region each have a height 312'. The height 312' is less than the height 312. Accordingly, the dielectric features 220 (or the "dielectric wall" described above) assert less restriction towards material flow around end portions of the suspended channel layers. The device further includes a gate electrode extending over and across the top surfaces of the fin structures. Moreover, the gate electrode extends over the dielectric features 220 in the non-cut-metal-gate region. The gate structure has a height 322 with the gate electrode extending to the top surface of the gate structure. Accordingly, the gate structure has a height that is greater than the height 312' and the height 320. Furthermore, where the gate structure is designed to terminate (or a "cut-metal-gate region"), another dielectric feature (or a set of dielectric features) is formed. For example, a dielectric feature 222A is formed over another dielectric feature 220 (for example, another dielectric feature 220 in the cut-metal-gate region). The combination of the dielectric feature 222A and the dielectric feature 220 in the cut-metal-gate region collectively forms a cut-metal-gate dielectric feature. The cut-metal-gate dielectric feature collectively has a height 320. The height 320 is greater than the height 322, the height 312, and the height 312'. As a result, the gate structure 270 is "cut" across its height dimension in the cut-metal-gate region, thereby separating the gate electrode into two electrically disconnected gate electrode portions. For example, a sidewall surface of the dielectric feature 222A defines an end of the gate electrode portion; and a sidewall surface of another dielectric feature 222A defines another end of the gate electrode portion. In other words, the gate structure 270 that includes one of the gate electrode portions has a length that is defined by the distance between two adjacent cut-metal-gate dielectric features, which also corresponds to the distance between the two dielectric features 222A. The dielectric features 222A each extends from a top surface of a dielectric feature 220 in the cut-metal-gate region. In some embodiments, the dielectric feature 220 in the cut-metal-gate region has the height 312, while the dielectric feature 220 in the non-cut-metal-gate region has the height 312'. The height 312' may be less than the height 312. In some embodiments, integrated circuit devices that implements the structure described herein includes fewer defects in the final structure. For example, because the dielectric wall between fin structures is lower than the stack of suspended channel layer, the dielectric wall asserts less restriction towards material flows targeted at the suspended channel layers, or the sacrificial layers between the suspended channel layers. As a result, etching operations and/or deposition operations proceed more efficiently without leaving residuals or voids. The threshold voltages of the devices formed this way is more consistent and predictable than those without implementing the structures or methods herein provided.

In one exemplary aspect, the present disclosure is directed to a device. The device includes a semiconductor substrate, a first stack of suspended channel layers and a second stack of suspended channel layers on the semiconductor substrate. The first and the second stacks of suspended channel layers each extend horizontally along a first direction and extend vertically along a second direction from a first height to a second height. The device also includes a first dielectric feature and a second dielectric feature. The first dielectric feature is on a first side of the first stack of suspended channel layers and between the first stack of suspended channel layers and the second stack of suspended channel layers. The first dielectric feature extends vertically from a third height to a fourth height. The second dielectric feature is on a second side of the first stack of suspended channel layers that is opposite to the first side. The second dielectric feature extends vertically from the third height to a fifth height. The device further includes a gate electrode. The gate electrode is on and extends continuously across a top surface of the first stack of suspended channel layers and a top surface of the second stack of suspended channel layers. Moreover, the gate structure extends along a third direction perpendicular to the first direction and the second direction. The gate electrode extends to a sixth height. The fifth height is above the sixth height, the sixth height is above the second height, the second height is above the fourth height, the fourth height is above the first height, and the first height is above the third height.

In some embodiments, the second height is above the fourth height by about 10 nm to about 20 nm. In some embodiments, the fifth height is above the fourth height by a first difference, the fourth height is above the third height by a second difference, and a ratio of the first difference to the second difference is about 1.1:1 to about 2:1. In some embodiments, the gate electrode has a first sidewall surface defined by a sidewall surface of the second dielectric feature. Moreover, the gate electrode has a second sidewall surface defined by a sidewall surface of the first dielectric feature. The gate electrode extends continuously along the third direction from the first sidewall surface to the second sidewall surface and further beyond the second sidewall surface. In some embodiments, the first dielectric feature includes a first dielectric material. The second dielectric feature includes the first dielectric material and a second dielectric material overlaying the first dielectric material. In some embodiments, the second dielectric feature includes the first dielectric material extending from the third height to the fourth height, and the second dielectric material from the fourth height to the fifth height. In some embodiments, the first dielectric feature has a top surface of a convex profile protruding away from the substrate. In some embodiments, the first dielectric feature includes silicon oxide, and the second dielectric feature includes silicon nitride and silicon oxide.

In one exemplary aspect, the present disclosure is directed to a method. The method includes receiving a workpiece having a substrate and fin-shaped structures formed thereon. The fin-shaped structures each include a sacrificial layer over the substrate, a channel layer on the sacrificial layer and a top layer on the channel layer. The method also includes forming a cladding layer on both sides of the fin-shaped structures and forming a first dielectric layer between adjacent fin-shaped structures. The dielectric layer has a top surface below a bottom surface of the sacrificial layer. The method further includes forming a second dielectric layer on the first dielectric layer. Additionally, the method includes removing the top layer to expose a top surface of the channel layer. Furthermore, the method includes forming a dummy gate electrode on the top surface of the channel layer and on a top surface of the second dielectric feature. Still further, the method includes forming a mask element to cover a first gate area while leaving a second gate area uncovered. The first gate area includes a first portion of the second dielectric layer formed therein, and the second gate area includes a second portion of the second dielectric layer formed therein. Still further, the method also includes removing a portion of the dummy gate electrode in the second gate area to expose the second portion of the second dielectric layer. The method additionally includes removing the exposed second portion of the second dielectric layer to expose a top surface of the first dielectric layer in the second gate area, as well as forming a gate structure on a sidewall surface of the first portion of the second dielectric layer in the first gate area and on the top surface of the first dielectric layer in the second gate area.

In some embodiments, the forming of the first dielectric feature includes forming a first dielectric material layer covering the fin-shaped structures, and recessing the first dielectric material layer to remove a top portion of the first dielectric material layer. In some embodiments, the top layer is a silicon nitride layer. In some embodiments, the top layer is a crystalline silicon germanium layer. In some embodiments, the forming of the cladding layer includes forming the cladding layer from amorphous silicon germanium. In some embodiments, after the removing of the exposed portion of the second dielectric layer, the method further includes removing a portion of the exposed first dielectric layer in the second gate area.

In one exemplary aspect, the present disclosure is directed to a method. The method includes receiving a semiconductor workpiece. The semiconductor workpiece has a plurality of stacks of suspended channel layer and sacrificial layers alternating with each other within the stack. The plurality of stacks each extend along a first direction. The method also includes forming a cladding layer on sidewall surfaces of the stacks, and forming a dielectric layer between bottom portions of adjacent stacks. The dielectric layer has a top surface below a bottom surface of a suspended channel layer. The method further includes forming a hard mask layer on the dielectric layer and on the stacks, forming a dummy gate electrode that extends across the plurality of stacks and on portions of the hard mask layer, forming source/drain recesses on both sides of the dummy gate electrode, forming inner spacers between end portions of vertically adjacent suspended channel layers, forming source/drain features in the source/drain recesses, and forming mandrels to define cut-metal-gate region and non-cut-metal-gate region. Moreover, the method includes etching to remove portions of the dummy gate electrode and portions of the hard mask layer in the non-cut-metal-gate region. Furthermore, the method includes removing portions of the dummy gate electrode in the cut-metal-gate region while preserving the portions of the hard mask layer in the cut-metal-gate region. Additionally, the method includes forming a gate structure on sidewall surfaces of the hard mask layer in the cut-metal-gate region, on top surfaces of the stacks and on top surfaces of the dielectric layer in the non-cut-metal-gate region.

In some embodiments, the cladding layer includes silicon germanium. In some embodiments, a top surface of a stack is above a top surface of the first dielectric layer by a distance of about 10 nm to about 20 nm. In some embodiments, the received semiconductor workpiece includes a silicon germanium layer on a top surface of the stacks. Moreover, the method further includes removing the silicon germanium after the forming of the hard mask layer. In some embodiments, the etching to remove the portions of the hard mask layer in the non-cut-metal-gate region exposes a top surface of a portion of the dielectric feature. Moreover, the method further includes recessing the portion of the dielectric feature. In some embodiments, the recessing of the portion of the dielectric feature includes tuning a profile of the top surface of the portion of the dielectric feature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a semiconductor substrate;
   a first stack of suspended channel layers and a second stack of suspended channel layers on the semiconductor substrate, each extending horizontally along a first direction and extending vertically along a second direction from a first height to a second height;
   a first dielectric feature on a first side of the first stack of suspended channel layers and between the first stack of suspended channel layers and the second stack of suspended channel layers, the first dielectric feature extending vertically from a third height to a fourth height;
   a second dielectric feature on a second side of the first stack of suspended channel layers opposite to the first side, the second dielectric feature extending vertically from the third height to a fifth height; and
   a gate electrode on and extending continuously across a top surface of the first stack of suspended channel layers and a top surface of the second stack of suspended channel layers, the gate electrode extending along a third direction perpendicular to the first direction and the second direction, the gate electrode extending to a sixth height,
   wherein the fifth height is above the sixth height, the sixth height is above the second height, the second height is above the fourth height, the fourth height is above the first height, and the first height is above the third height.

2. The device of claim 1, wherein the second height is above the fourth height by about 10 nm to about 20 nm.

3. The device of claim 1, wherein the fifth height is above the fourth height by a first difference, the fourth height is above the third height by a second difference, and wherein a ratio of the first difference to the second difference is about 1.1:1 to about 2:1.

4. The device of claim 1, wherein the gate electrode has a first sidewall surface defined by a sidewall surface of the second dielectric feature, a second sidewall surface defined by a sidewall surface of the first dielectric feature, and
   wherein the gate electrode extends continuously along the third direction from the first sidewall surface to the second sidewall surface and further beyond the second sidewall surface.

5. The device of claim 1, wherein the first dielectric feature includes a first dielectric material, and
   wherein the second dielectric feature includes the first dielectric material and a second dielectric material overlaying the first dielectric material.

6. The device of claim 5, wherein the second dielectric feature includes the first dielectric material extending from the third height to the fourth height, and the second dielectric material from the fourth height to the fifth height.

7. The device of claim 1, wherein the first dielectric feature has a top surface of a convex profile protruding away from the substrate.

8. The device of claim 1, wherein the first dielectric feature includes silicon oxide, and the second dielectric feature includes silicon nitride and silicon oxide.

9. A method, comprising:
   receiving a workpiece having a substrate and fin-shaped structures formed thereon, wherein the fin-shaped structures each including a sacrificial layer over the substrate, a channel layer on the sacrificial layer and a top layer on the channel layer;
   forming a cladding layer on both sides of the fin-shaped structures;
   forming a first dielectric layer between adjacent fin-shaped structures, the first dielectric layer having a top surface below a bottom surface of the sacrificial layer;
   forming a second dielectric layer on the first dielectric layer;
   removing the top layer to expose a top surface of the channel layer;
   forming a dummy gate electrode on the top surface of the channel layer and on a top surface of the second dielectric layer;
   forming a mask element to cover a first gate area while leaving a second gate area uncovered, the first gate area including a first portion of the second dielectric layer formed therein, and the second gate area including a second portion of the second dielectric layer formed therein;
   removing a portion of the dummy gate electrode in the second gate area to expose the second portion of the second dielectric layer;
   removing the exposed second portion of the second dielectric layer to expose a top surface of the first dielectric layer in the second gate area; and
   forming a gate structure on a sidewall surface of the first portion of the second dielectric layer in the first gate area and on the top surface of the first dielectric layer in the second gate area.

10. The method of claim 9, wherein the forming of the first dielectric layer includes forming a first dielectric material layer covering the fin-shaped structures, and recessing the first dielectric material layer to remove a top portion of the first dielectric material layer.

11. The method of claim 9, wherein the top layer is a silicon nitride layer.

12. The method of claim 9, wherein the top layer is a crystalline silicon germanium layer.

13. The method of claim 9, wherein the forming of the cladding layer includes forming the cladding layer from amorphous silicon germanium.

14. The method of claim 9, further comprising, after the removing of the exposed portion of the second dielectric layer, removing a portion of the exposed first dielectric layer in the second gate area.

15. A method, comprising:
receiving a semiconductor workpiece having a plurality of stacks of suspended channel layer within the stack, the plurality of stacks of the suspended channel layers each extending along a first direction;
forming a cladding layer on sidewall surfaces of the stacks;
forming a dielectric layer between bottom portions of adjacent stacks of the suspended channel layers, the dielectric layer having a top surface below a bottom surface of a suspended channel layer;
forming a hard mask layer on the dielectric layer and on the plurality of stacks of the suspended channel layers;
forming a dummy gate electrode extending across the plurality of stacks of the suspended channel layers and on portions of the hard mask layer;
forming source/drain recesses on both sides of the dummy gate electrode;
forming inner spacers between end portions of vertically adjacent suspended channel layers;
forming source/drain features in the source/drain recesses;
forming mandrels to define cut-metal-gate region and non-cut-metal-gate region;
etching to remove portions of the dummy gate electrode and portions of the hard mask layer in the non-cut-metal-gate region;
removing portions of the dummy gate electrode in the cut-metal-gate region while preserving the portions of the hard mask layer in the cut-metal-gate region; and
forming a gate structure on sidewall surfaces of the hard mask layer in the cut-metal-gate region, on top surfaces of the plurality of stacks of the suspended channel layers and on top surfaces of the dielectric layer in the non-cut-metal-gate region.

16. The method of claim 15, wherein the cladding layer includes silicon germanium.

17. The method of claim 15, wherein a top surface of a stack of the plurality of stacks of the suspended channel layers is above a top surface of the dielectric layer by a distance of about 10 nm to about 20 nm.

18. The method of claim 15, wherein the received semiconductor workpiece includes a silicon germanium layer on a top surface of the plurality of stacks of the suspended channel layers, the method further comprising removing the silicon germanium after the forming of the hard mask layer.

19. The method of claim 15, wherein the etching to remove the portions of the hard mask layer in the non-cut-metal-gate region exposes a top surface of a portion of the dielectric layer, the method further comprises recessing the portion of the dielectric layer.

20. The method of claim 19, wherein the recessing of the portion of the dielectric layer includes tuning a profile of the top surface of the portion of the dielectric layer.

* * * * *